US011052700B2

(12) United States Patent
Mason et al.

(10) Patent No.: US 11,052,700 B2
(45) Date of Patent: Jul. 6, 2021

(54) MULTI-SCALE PRE-ASSEMBLED PHASES OF MATTER

(71) Applicant: The Regents of the University of California, Oakland, CA (US)

(72) Inventors: Thomas G. Mason, Los Angeles, CA (US); Po-Yuan Wang, Oakland, CA (US)

(73) Assignee: The Regents of the University of California, Oakland, CA (US)

( * ) Notice: Subject to any disclaimer, the term of this patent is extended or adjusted under 35 U.S.C. 154(b) by 55 days.

(21) Appl. No.: 16/206,928

(22) Filed: Nov. 30, 2018

(65) Prior Publication Data
US 2019/0160858 A1 May 30, 2019

Related U.S. Application Data

(60) Provisional application No. 62/593,091, filed on Nov. 30, 2017, provisional application No. 62/720,844, filed on Aug. 21, 2018.

(51) Int. Cl.
*G03F 7/00* (2006.01)
*B44C 1/175* (2006.01)
(Continued)

(52) U.S. Cl.
CPC .......... *B44C 1/1752* (2013.01); *B44C 1/1754* (2013.01); *B44F 9/08* (2013.01);
(Continued)

(58) Field of Classification Search
CPC .......... G03F 7/40; G03F 8/325; G03F 7/0037; G03F 7/11; B44C 1/1752; B44C 1/1754; B44F 9/08
(Continued)

(56) References Cited

U.S. PATENT DOCUMENTS 6,284,345 B1 * 9/2001 Ruoff .................... B81C 99/008
264/297.8
6,994,950 B2 * 2/2006 Tai .................... B01L 3/502707
430/320
(Continued)

OTHER PUBLICATIONS

Bae et al., "Scalable multiscale patterned structures inspired by nature: the role of hierarchy", Adv. Mater. 26, 675-700, (2014).
(Continued)

*Primary Examiner* — John A McPherson
(74) *Attorney, Agent, or Firm* — Venable LLP; Henry J. Daley

(57) ABSTRACT

A method of producing preconfigured arrangements of mobile shape-designed particles. The method includes providing a composite structure comprising a substrate and a layer of particle material over a surface of the substrate; lithographically producing a plurality of shaped-designed particles from the layer of particle material such that the plurality of shaped-designed particles remain substantially in a layer proximate the substrate; and at least one of subsequent to or in conjunction with the lithographically producing, immersing the plurality of shaped-designed particles the substrate in a fluid material, at a preselected temperature. The fluid material comprises a depletion agent having particles having sizes and a volume fraction to provide depletion attraction between at least a portion of the shaped-designed particles and the substrate such that the shaped-designed particles remain substantially in the layer proximate the substrate.

13 Claims, 28 Drawing Sheets

(51) Int. Cl.
| | |
|---|---|
| *B44F 9/08* | (2006.01) |
| *G03F 7/32* | (2006.01) |
| *G03F 7/11* | (2006.01) |
| *G03F 7/038* | (2006.01) |
| *G03F 7/40* | (2006.01) |

(52) U.S. Cl.
CPC .......... *G03F 7/0002* (2013.01); *G03F 7/0037* (2013.01); *G03F 7/038* (2013.01); *G03F 7/11* (2013.01); *G03F 7/325* (2013.01); *G03F 7/40* (2013.01)

(58) Field of Classification Search
USPC ......................................................... 430/320
See application file for complete search history.

(56) References Cited

U.S. PATENT DOCUMENTS

| | | | |
|---|---|---|---|
| 2010/0035061 A1* | 2/2010 | Mason ....................... | G03F 7/40 428/403 |
| 2010/0233436 A1* | 9/2010 | Mason ....................... | B01J 2/00 428/156 |
| 2017/0184576 A1* | 6/2017 | Esteve Tinto .......... | B82Y 30/00 |

OTHER PUBLICATIONS

Boles et al., "Self-assembly of colloidal nanocrystals: from intricate structures to functional materials", Chem. Rev. 116, 11220-11289, (2016).
Bursill et al., "Penrose tiling observed in a quasi-crystal", Nature 316, 50, (1985).
Campbell et al., "Fabrication of photonic crystals for the visible spectrum by holographic lithography", Nature 404, 53-56, (2000).
Caspar et al., "Five-fold symmetry in crystalline quasicrystal? lattices", Proc. Natl. Acad. Sci. U.S.A. 93, 14271-14278 (1996).
Cavallaro et al., "Curvature-driven capillary migration and assembly of rod-like particles", Proc. Natl. Acad. Sci. U.S.A. 108, 20923-20928 (2011).
Chen et al., "Low-frequency vibrations of soft colloidal glasses", Phys. Rev. Lett. 105, 025501, (2010).
Chou et al., "Imprint lithography with 25-nanometer resolution", Science 272, 85-87 (1996).
Chou et al., "Scaling of 6n-fold bond-orientational order parameters in a hexatic liquid-crystal thin film", Phys. Rev. Lett. 76, 4556-4559 (1996).
Dontabhaktuni et al., "Quasicrystalline tilings with nematic colloidal platelets", Proc. Natl. Acad. Sci. U.S.A. 111, 2464-2469 (2014).
Dotera et al., "Mosaic two-lengthscale quasicrystals", Nature 506, 208-211 (2014).
Fischer et al., "Colloidal quasicrystals with 12-fold and 18-fold diffraction symmetry", Proc. Natl. Acad. Sci. U.S.A. 108, 1810-1814, (2011).
Gardner, "Penrose Tiles to Trapadoor Ciphers", (W.H. Freeman, New York, 1989).
Grier, "A revolution in optical manipulation", Nature 424, 810-816, (2003).
Grzelczak et al., "Directed self-assembly of nanoparticles", ACS Nano 4, 3591-3605, (2010).
Gummelt, "Penrose tilings as coverings of congruent decagons", Geom. Dedicata 62, 1-17 (1996).
Hayashida et al., "Polymeric quasicrystal: mesoscopic quasicrystalline tiling in ABC star polymers", Phys. Rev. Lett. 98, 195502, (2007).
Hernandez et al., "Colloidal alphabet soup:? monodisperse dispersions of shape-designed lithoparticles", J. Phys. Chem. C 111, 4477-4480, (2007).

Hoover et al., "A method for producing non-spherical monodisperse particles using integrated circuit fabrication techniques", J. Aerosol Sci. 21, 569-575, (1990).
Kawata et al., "Finer features for functional microdevices", Nature 412, 697, (2001).
Kosterlitz et al., "Ordering, metastability and phase transitions in two-dimensional systems", J. Phys. C 6, 1181-1203 (1973).
Lewandowski et al., "Oriented assembly of anisotropic particles by capillary interactions", Soft Matter 5, 886-890 (2009).
Li et al., "Phason-strain identification for quasicrystals by high-resolution electron microscopy", Ultramicroscopy 45, 299-305 (1992).
Mikhael et al., "Archimedean-like tiling on decagonal quasicrystalline surfaces", Nature 454, 501, (2008).
Nelson et al., "Order in two-dimensional binary random arrays", Philos. Mag. A 46, 105-126, (1982).
Niederberger, "Multiscale nanoparticle assembly: From particulate precise manufacturing to colloidal processing", Adv. Funct. Mater., 1703647, (2017).
Penrose, "Pentaplexity a class of non-periodic tilings of the plane", Math. Intell. 2, 32-37, (1979).
Penrose, "The role of aesthetics in pure and applied mathematical research", Bull. Inst. Math. Appl. 10, 266-271, (1974).
Roichman et al., "Holographic assembly of quasicrystalline photonic heterostructures", Opt. Express 13, 5434-5439, (2005).
Saitoh et al., "Structural study of an Al72Ni20Co8 decagonal quasicrystal using the high-angle annular dark-field method", Jpn. J. Appl. Phys. 36, L1400-L1402 (1997).
Socolar, "J. Phason strain in quasicrystals", J. Physique Colloques 47, C3/217-C3/226 (1986).
Steinhardt et al., "A simpler approach to Penrose tiling with implications for quasicrystal formation", Nature 382, 431-433 (1996).
Talapin et al., "Quasicrystalline order in self-assembled binary nanoparticle superlattices", Nature 461, 964, (2009).
Ullal et al., "Photonic crystals through holographic lithography: simple cubic, diamond-like, and gyroid-like structures", Appl. Phys. Lett. 84, 5434-5436, (2004).
Wang et al., "Colloidal lock-and-key dimerization reactions of hard annular sector particles controlled by osmotic pressure", J. Am. Chem. Soc. 137, 15308-15314 (2015).
Wang et al., "Dimer crystallization of chiral proteoids", Phys. Chem. Chem. Phys. 19, 7167-7175 (2017).
Weeks et al., "Three-dimensional direct imaging of structural relaxation near the colloidal glass transition", Science 287, 627, (2000).
Yang et al., "Synthesis and assembly of structured colloidal particles", J. Mater. Chem. 18, 2177-2190, (2008).
Zeng et al., "Emergence of hierarchical structural complexities in nanoparticles and their assembly", Science 354, 1580, (2016).
Zeng et al., "Supramolecular dendritic liquid quasicrystals", Nature 428, 157, (2004).
Zhao et al., "Directing colloidal self-assembly through roughness-controlled depletion attractions", Phys. Rev. Lett. 99, 268301, (2007).
Zhao et al., "Entropic crystal-crystal transitions of Brownian squares", Proc. Natl. Acad. Sci. U.S.A. 108, 2684-2687 (2011).
Zhao et al., "Frustrated rotator crystals and glasses of Brownian pentagons", Phys. Rev. Lett. 103, 208302, (2009).
Zhao et al., "Local chiral symmetry breaking in triatic liquid crystals", Nat. Commun. 3, 801, (2012).
Zhao et al., "Shape-designed frustration by local polymorphism in a near-equilibrium colloidal glass", Proc. Natl. Acad. Sci. U.S.A. 112, 12063-12068 (2015).
Zhao et al., "Twinning of rhombic colloidal crystals", J. Am. Chem. Soc. 134, 18125-18131 (2012).
Zou et al., "Superior room-temperature ductility of typically brittle quasicrystals at small sizes", Nat. Commun. 7, 12261 (2016).

* cited by examiner

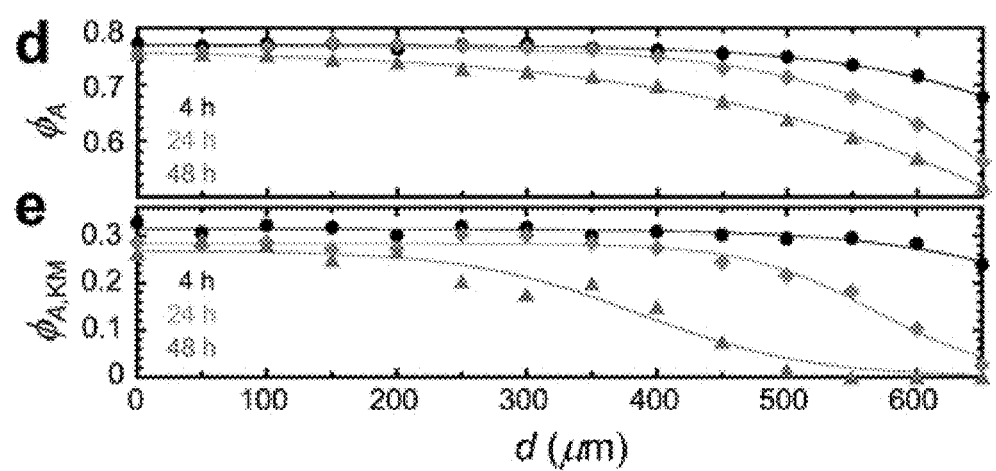

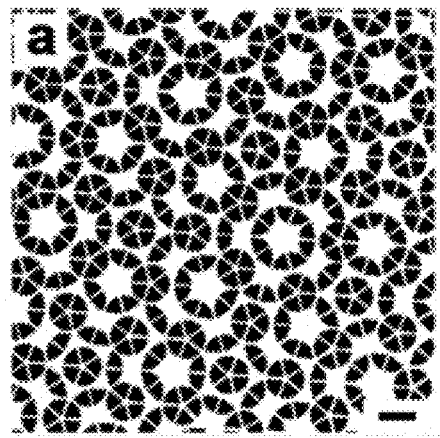 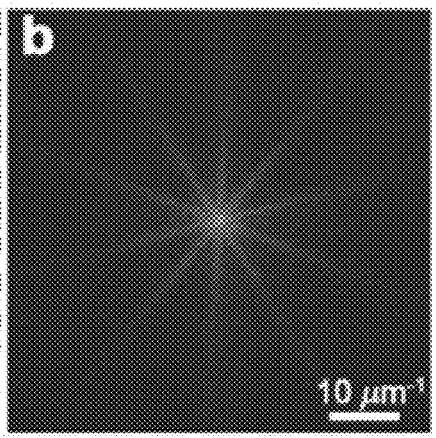
FIG. 6A　　　　　FIG. 6B
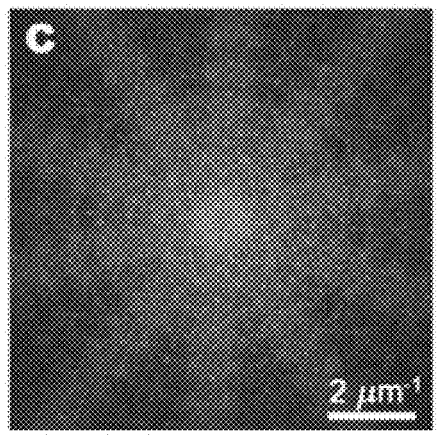 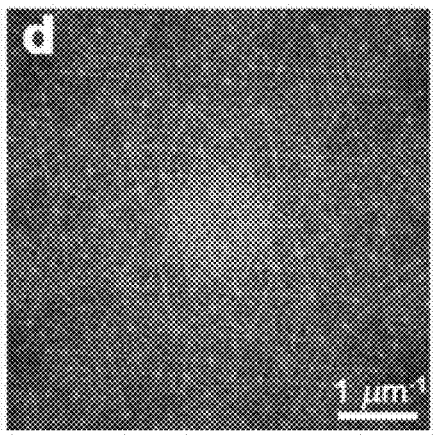
FIG. 6C　　　　　FIG. 6D

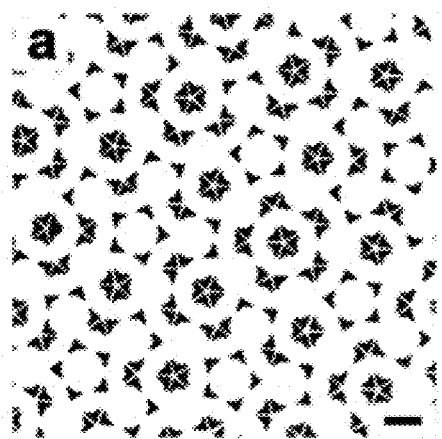 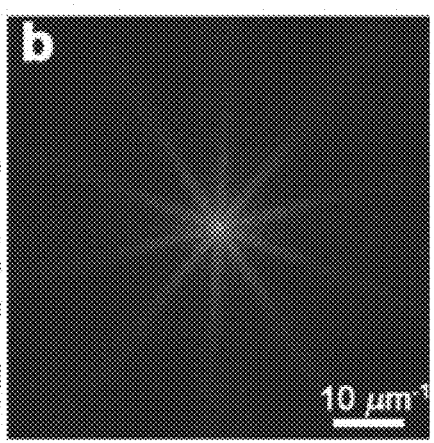
FIG. 7A  FIG. 7B
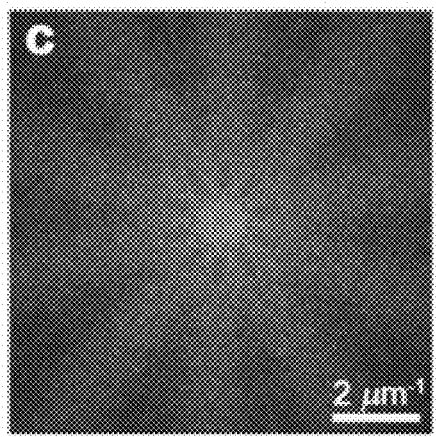 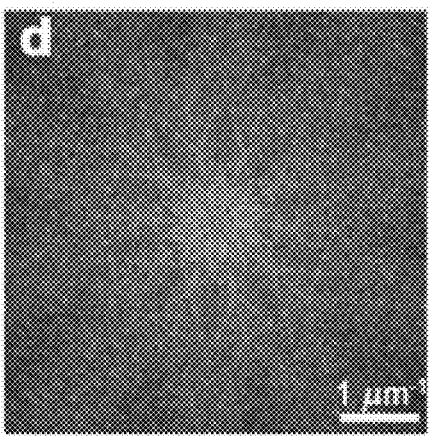
FIG. 7C  FIG. 7D

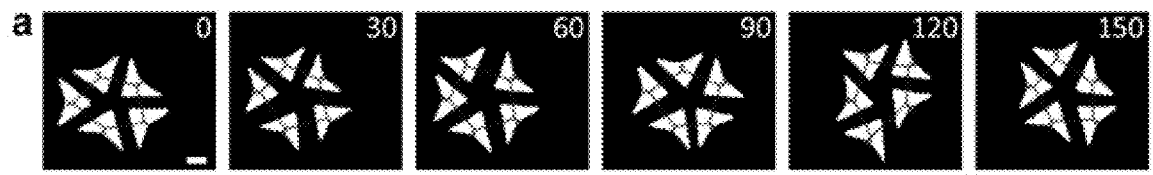
FIG. 9A
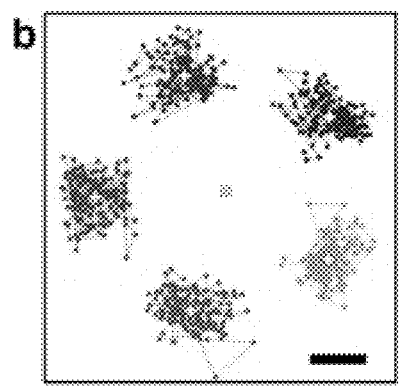
FIG. 9B
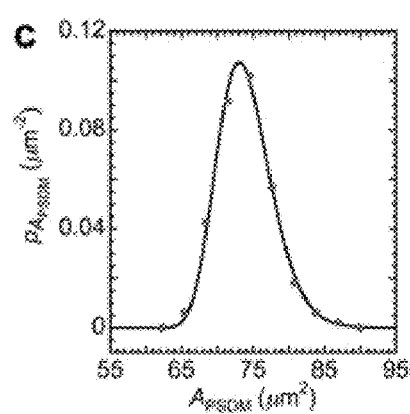 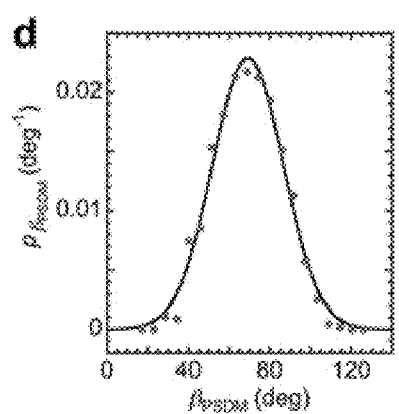
FIG. 9C  FIG. 9D

Two particle shapes

Single particle shape

Square Mesh Lattice

MULTI-SCALE PRE-ASSEMBLED PHASES OF MATTER

RELATED APPLICATIONS

This patent application claims priority benefit to U.S. Provisional Patent Application No. 62/593,091 filed on Nov. 30, 2017 and to U.S. Provisional Patent Application No. 62/720,844 filed on Aug. 21, 2018, both of which are incorporated herein by reference in their entirety. All references cited anywhere in this specification, including the Background and Detailed Description sections, are incorporated by reference as if each had been individually incorporated.

BACKGROUND

1. Technical Field

Some embodiments of the present invention relate to an organized multi-scale structure of particles and more particularly to a method of producing preconfigured arrangements of mobile shape-designed particles and a lithographic pre-assembled structure of mobile shape-designed particles.

2. Discussion of Related Art

A beautiful example of a hierarchically organized multi-scale structure is Penrose's pentagonal P2 quasi-crystal (QC). Kites and darts can be organized locally into motifs, such as pentagonal stars. These motifs in turn can be organized into a variety of superstructural patterns that become increasingly complex at larger length scales. Reported soft matter QCs of dendrimers, triblock copolymers, nanoparticles, and polymeric micelles have been limited to 12-fold or 18-fold symmetries. Because routes for self-assembling complex colloidal building blocks into low-defect dynamic superstructures remain limited, alternative methods are needed. Although holographic laser tweezers and optical standing waves can hold microspheres in local QC arrangements, no Brownian Penrose system has yet been fabricated over large areas, revealing particle-scale and collective dynamics in real-space.

SUMMARY

An aspect of the present invention is to provide a method of producing preconfigured arrangements of mobile shape-designed particles. The method includes providing a composite structure comprising a substrate and a layer of particle material over a surface of the substrate; lithographically producing a plurality of shaped-designed particles from the layer of particle material such that the plurality of shaped-designed particles remain substantially in a layer proximate the substrate; and at least one of subsequent to or in conjunction with the lithographically producing, immersing the plurality of shaped-designed particles and the substrate in a fluid material at a preselected temperature. The fluid material comprises a depletion agent comprising particles having sizes and a volume fraction such that the depletion agent provides depletion attraction between at least a portion of the shaped-designed particles and the substrate such that the shaped-designed particles remain substantially in the layer proximate the substrate.

In an embodiment, the composite structure further comprises a sacrificial layer between the substrate and the layer of particle material. In an embodiment, the lithographically producing a plurality of shaped-designed particles comprises lithographically producing the plurality of shaped-designed particles using at least one of photolithography and particle lithography, and wherein the fluid material causes the sacrificial layer to at least one of dissolve and de-solidify. In an embodiment, the fluid material comprises a release agent to remove the sacrificial layer so as to release the plurality of shaped-designed particles from the substrate. In an embodiment the fluid material comprises a stabilizing agent that inhibits aggregation of the plurality of shaped-designed particles. In an embodiment, the preselected temperature at which the shaped-designed particles remain substantially in the layer proximate the substrate is between about 273 K and about 373 K. In an embodiment, the surface of the substrate is smooth compared to a surface roughness of the plurality of shaped-designed particles. In an embodiment, each of the plurality of shaped-designed particles has a facial surface closest to the surface of the substrate that is smoother than an edge surface that is approximately perpendicular to the surface of the substrate. In an embodiment, the fluid material enables an attraction between each of the plurality of shaped-designed particles and the substrate while providing a lubricating layer of liquid between each of the plurality of shaped-designed particles and the substrate. In an embodiment, the depletion agent comprises particles in the fluid material having a preselected average size and a preselected volume fraction such that the depletion agent provides a lubricated attraction between each of the shaped-designed particles and the substrate that is stronger than thermal energy. In an embodiment, the method further comprises exciting the shaped-designed particles by Brownian forces so as to cause dynamic reconfiguration by changing position or orientation, or both of at least a portion of the plurality of shaped-designed particles. In an embodiment, the plurality of shaped-designed particles comprise a plurality of particles of a first shape and a plurality of particles of a second shape. In an embodiment, the plurality of particles of the first shape are Penrose-type "kite particles", and wherein the plurality of particles of the second shape are Penrose-type "dart particles".

An aspect of the present disclosure is to provide a preconfigured arrangement of mobile shape-designed particles produced according to the above method. Another aspect of the present disclosure is to provide a preconfigured arrangement of mobile shape-designed particles produced according to the above method.

Another aspect of the present disclosure is to provide a fluctuating Brownian quasi-crystal composition of mobile microscale Penrose kite and dart particles in a confined two-dimensional monolayer comprising a plurality of shaped-designed particles, the shaped-designed particles comprising a plurality of Penrose-type kite particles and a plurality of Penrose-type dart particles. The plurality of Penrose-type kite particles and the plurality of Penrose-type dart particles are restricted to translate and rotate in a two-dimensional monolayer as a consequence of a lubricated attraction. In an embodiment, the plurality of Penrose-type kite particles and the plurality of Penrose-type dart particles have a total particle area fraction in excess of about 0.5.

Another aspect of the present disclosure is to provide a fluctuating Brownian mesh composition comprising a plurality of fluctuating discrete particles. The plurality of fluctuating discrete particles comprise steric colloidal linkages made using lithographic pre-assembly.

Another aspect of the present disclosure is to provide a lithographically pre-assembled structure comprising a plurality of discrete colloidal particles having lock-and-key structural features so as to be lithographically pre-assembled in at least one of a linear or quasilinear configuration, each the discrete colloidal particle comprising at least a convex region or a concave region to provide lock-and-key pre-assembly such that the convex region is sufficiently surrounded by, but not touching, the concave region to allow motion without disassembly. The plurality of discrete colloidal particles are not bound statically to a substrate and are movable relative to the substrate. In an embodiment, the linear or quasilinear configuration is at least one of a head-to-tail ring configuration, a chiral star configuration comprising at least three head-to-tail colloidal chains, a dendrimer configuration comprising a plurality of branches from a head-to-tail colloidal chain to a plurality of colloidal chains, a linear chiral colloidal chain, a ring copolymer configuration comprising at least three colloidal chains, a honeycomb quasi-one-dimensional strip, or a honeycomb mesh. In an embodiment, the plurality of discrete colloidal particles have a plurality of structural types lock-and-key shapes. In an embodiment, a particle of the plurality of discrete colloidal particles comprises a plurality of convex regions. In an embodiment, a particle of the plurality of discrete colloidal particles comprises a plurality of concave regions.

BRIEF DESCRIPTION OF THE DRAWINGS

The present disclosure, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

FIG. 4D shows area fraction of Penrose kite-and-dart tiles, $\phi_A$, as a function of a distance, d, starting from the left of the top micrograph images at different times after release: 4 h (black circles), 24 h (orange diamonds), and 48 h (purple triangles), according to an embodiment of the present disclosure;

FIG. 4E shows area fraction of unmelted PSKMs, $\phi_{A,KM}$, as a function of d at different times after release: 4 h (black circles), 24 h (orange diamonds), and 48 h (purple triangles), according to an embodiment of the present disclosure;

FIG. 6A shows Kite tiles are separated by micrograph image post-processing, from FIG. 3A. Scale bar (lower right) is 20 μm, according to an embodiment of the present disclosure;

FIG. 6B shows an effective scattering pattern, given by the Fourier transform (FT) intensity of FIG. 6A, showing 10 rays extending from the center to high scattering wavenumbers q, according to an embodiment of the present disclosure;

FIG. 6C shows the central region of FIG. 6B, zoomed by ≈6×, revealing Bragg peaks at intermediate and low q, corresponding to large distances, according to an embodiment of the present disclosure;

FIG. 6D shows a central region of FIG. 6C, zoomed by an additional ≈2×, revealing Bragg peaks at very low q associated with super-structural ordering of motifs of kite tiles over large length scales, according to an embodiment of the present disclosure;

FIG. 9A shows filled and thresholded optical micrographs of darts in individual video frames (frame number in upper right) are overlayed with blue pentagons having vertices at the centroids of the darts, according to an embodiment of the present disclosure;

FIG. 9B shows trajectories of the centroids of five darts in a PSDM over a duration of 32 h after correcting for a slight long-time drift of the entire motif, according to an embodiment of the present disclosure;

FIG. 9C shows a normalized probability distribution of the calculated area, $A_{PSDM}$, of fluctuating blue pentagons connecting centroids of darts in the PSDM shown in in FIG. 9A, according to an embodiment of the present disclosure;

FIG. 9D shows a normalized probability distribution of the calculated internal angles, $\beta_{PSDM}$, of fluctuating blue pentagons connecting centroids of darts in the PSDM shown in FIG. 9A, according to an embodiment of the present disclosure;

DETAILED DESCRIPTION

Figure 1A:
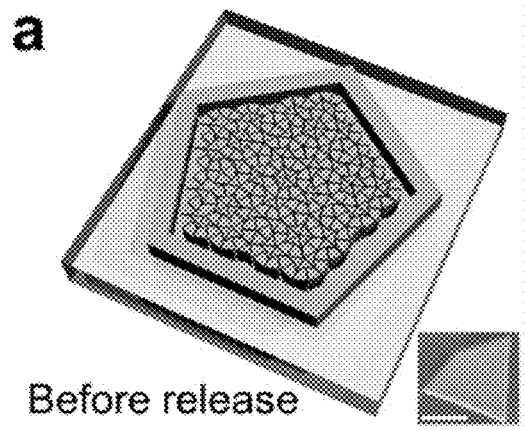
FIG. 1A shows a schematic diagram of pre-configured kite and dart Penrose tiles in a dense, ideal quasi-crystalline (QC) arrangement prior to release; these Penrose tiles are attached to a solid layer of release material that is attached to a transparent glass substrate, surrounded by bounding pentagonal walls, according to an embodiment of the present disclosure.

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the present invention. All references cited anywhere in this specification are incorporated by reference as if each had been individually incorporated.

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention. All references cited anywhere in this specification, including the Background and Detailed Description sections, are incorporated by reference as if each had been individually incorporated.

The term "lithographically produced particles" refers to particles that are large relative to atomic and molecular scales. In the case of polymers and other "large" molecules, it is the monomer or individual repeating units that are meant as being small relative to the "lithographically produced particles". In addition, "lithographically produced particles" can be designed with specific shapes and compositions. Examples of "lithographically produced particles" can include particles produced by photolithography such that they are initially attached to the substrate and subsequently released therefrom.

The term "crystal-like structure" means that the particles are arranged in a spatial order that exhibits a periodic or near periodic pattern of the "lithographically produced particles" analogous to crystalline atomic structures.

The term "quasi-crystal-like structure" means that the particles are arranged in configuration that exhibits a quasi-periodic or nearly quasi-periodic order of the "lithographically produced particles" analogous to quasi-periodic atomic structures.

The term "linear configuration" refers to lithographic pre-assembled structures in which discrete colloidal particles are pre-assembled in a head-to-tail configuration interlocked by the convex structure within the concave structure such that motion is permitted. Such a linear configuration, or a section of such a linear configuration is also referred to as a "colloidal chain."

The term "quasilinear configuration" refers to lithographic pre-assembled structures in which the discrete colloidal particles are pre-assembled in a more complex arrangement than a single head-to-tail configuration as with a linear configuration, such as, but not limited to a strip.

The thermal energy $k_B T$ is defined as the product of Boltzmann's constant, represented by $k_B$, and the temperature T (expressed in units of Kelvin).

A method of creating organized multi-scale Brownian systems of mobile colloidal particles that have desired shapes and symmetries at high densities over large regions is needed. Such systems can be created in 2D through highly parallel lithographic printing and release of particles into a solution-dispersion containing a depletion agent. This combination of multi-particle shape-designed fabrication, pre-assembly, and specialized release yields lithographically pre-assembled monolayers (Litho-PAMs) of mobile tiles having sizes, shapes, and initial positions and orientations that can be programmed to have extremely high levels of multi-scale complexity at high densities, beyond current self- or directed-assembly methods.

To demonstrate Litho-PAMs, a Brownian Penrose P2-quasi-crystal (QC) of mobile kite and dart tiles pattern is produced. Using optical microscopy, its equilibrium fluctuations and melting is studied, revealing pentatic liquid quasi-crystalline ($LQC_5$) signatures. This experimental route for making Litho-PAMs is highly versatile, opening up the study of advanced forms of multi-scale condensed matter that only simulations could previously access. 2D Litho-PAMs can be extended into 3D pre-assembled Brownian systems of designer shapes through holographic lithography or stereolithography.

To make Litho-PAMs (see below Methods), computer-aided design software and lithography are combined to fabricate, position, and orient many shape-designed colloidal particles in a desired complex initial configuration. After lithographic printing using an optical stepper and development, a pre-assembled static set of discrete prismatic polymeric particles (i.e., kite and dart "tiles" ≈2 μm thick in a Penrose P2 QC pattern) is obtained. The pre-assembled static set of discrete prismatic polymeric particles is composed of crosslinked epoxy SU-8 photoresist (epoxy-based photoresist), that are attached to a thin ≈10 nm layer of a release material (Omnicoat) on a smooth glass wafer.

FIGS. 1A-1E depict various steps for creating a fluctuating Brownian quasi-crystal of mobile microscale Penrose kite and dart tiles in a confined 2D monolayer, according to an embodiment of the present disclosure. FIG. 1A shows a mask used for creating a fluctuating Brownian quasi-crystal of mobile microscale Penrose kite and dart tiles in a confined 2D monolayer, according to an embodiment of the present disclosure. As shown in FIG. 1A, after designing and fabricating a mask containing the desired arrangement and area fraction $\phi_A$ of tiles, an optical UV stepper lithography is used to print crosslinked polymeric Penrose tile particles in a 5-10 P2 quasi-crystalline (QC) pattern by cross-linking negative SU-8 photoresist at a high $\phi_A$ inside a pentagonal boundary having an inner edge length of 4.5 mm. Development removes unexposed SU-8 between the tiles, which are rigidly attached to a 10 nm thick release layer of water-soluble Omnicoat on a glass wafer, enabling observation from below using an inverted brightfield transmission optical microscope (OM). The inset in FIG. 1A shows a scanning electron microscope (SEM) image of a fabricated kite particle (scale bar in FIG. 1A is equal to 5 μm). In an embodiment, all tiles are 2 μm thick.

Figure 1B:
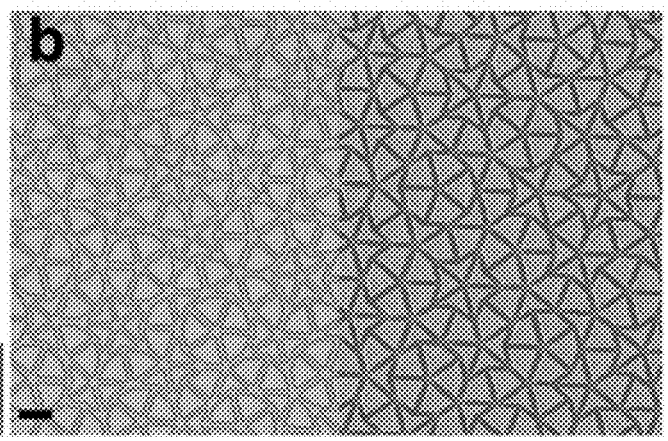
FIG. 1B shows optical (left) and scanning electron (right) micrographs of pre-configured kite and dart Penrose tiles in an ideal quasi-crystalline (QC) pattern at $\phi_A \approx 0.78$ after development and prior to release (scale bar in FIG. 1B is 10 µm), according to an embodiment of the present disclosure.

FIG. 1B shows a micrograph of pre-configured kite and dart Penrose tiles in an ideal quasi-crystalline (QC) pattern at $\phi_A \approx 0.78$ after development (scale bar in FIG. 1B is 10 μm), according to an embodiment of the present disclosure. The left half of image is OM and the right half of image is SEM. Optical and scanning electron micrographs confirm that the printed tiles form an ideal Penrose P2 QC at a tile area fraction of $\phi_A \approx 0.78$. The printed region is enclosed with poly-dimethylsiloxane (PDMS) elastomeric walls, and a customized aqueous release solution-dispersion (RSD) can be added that is specially formulated to maintain an intact monolayer of fluctuating tiles which have effectively hard in-plane interactions. The RSD contains a base, tetramethylammonium hydroxide (TMAH), to dissolve the Omnicoat, sodium dodecyl sulfate (SDS) surfactant to stabilize the released SU-8 tiles against aggregating or sticking to the glass substrate, and a depletion agent (e.g. anionic polystyrene nanospheres) to create anisotropic roughness-controlled depletion attractions that maintain the monolayer (see, for example, the methods in the following paragraphs for more detail).

Figure 1C:
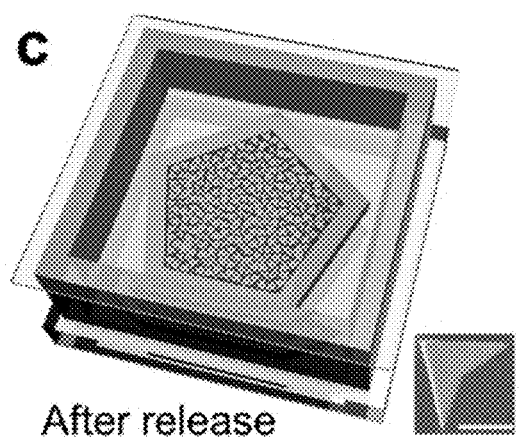
FIG. 1C shows a schematic diagram of pre-configured kite and dart Penrose tiles in a dense monolayer subsequent to release of the tiles; solid poly-dimethylsiloxane (PDMS) walls are fabricated to enclose the printed tiles, the PDMS walls are attached to the glass, and the resulting well containing the tiles is filled with a release solution-dispersion, according to an embodiment of the present disclosure.

FIG. 1C shows solid poly-dimethylsiloxane (PDMS) walls that are fabricated to enclose the printed pattern and are attached to the glass, according to an embodiment of the present disclosure. An aqueous basic surfactant solution-dispersion is loaded into this PDMS well, and a glass cover slip is placed on top to inhibit evaporation. The basic nature of this solution-dispersion dissolves the release layer, the surfactant (anionic dodecyl sulfate) adsorbs onto released tiles and prevents aggregation through screened-charge repulsions, and the nanoparticle dispersion of polystyrene spheres (40 nm diameter, sulfate-stabilized) produces a roughness-controlled depletion attraction between faces of the tiles and the glass substrate that prevents the released particles from leaving the monolayer, yet keeps their in-plane interactions nearly hard. The inset in FIG. 1C corresponds to an SEM image of a fabricated dart particle (scale bar is 5 μm).

Figure 1D:
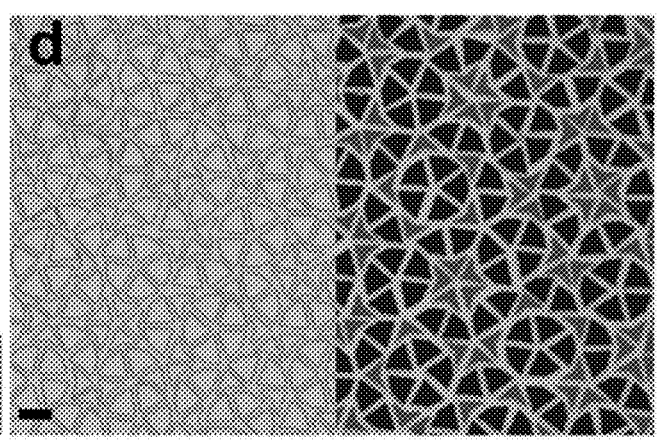
FIG. 1D shows an optical micrograph of the instantaneous configuration of mobile kite and dart Penrose tiles in the monolayer 48 hours after adding the release solution-dispersion, according to an embodiment of the present disclosure.

After adding the RSD (release solution dispersion) to the PDMS well, we image the tiles as they release using an inverted optical microscope. FIG. 1D shows an optical micrograph of the tiles 48 hours after adding the solution-dispersion, according to an embodiment of the present disclosure. The right-half of the image has been color-coded via post-acquisition digital analysis: kite (blue) and dart (red). Scale bar is 10 μm.

Figure 1E:
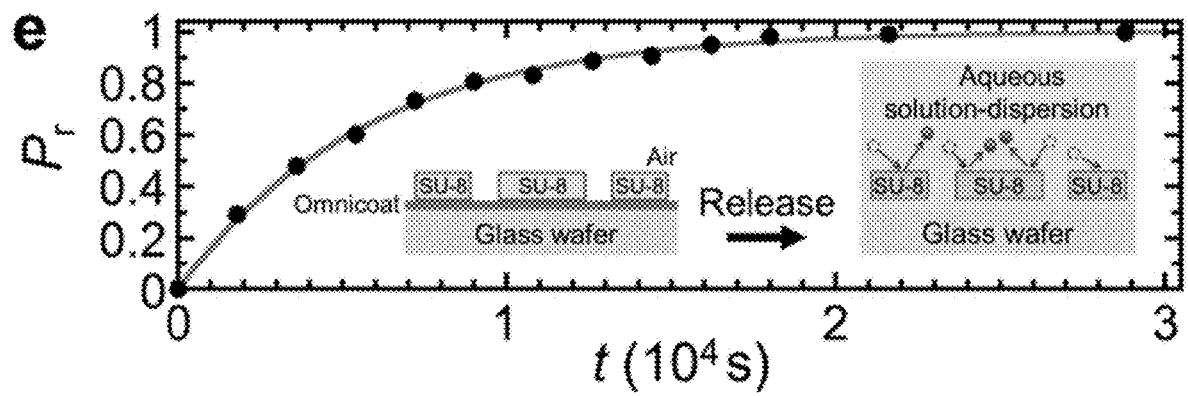
FIG. 1E shows a released fraction of mobile particles, $P_r$, as a function of time t, according to an embodiment of the present disclosure.

FIG. 1E shows a released fraction of mobile particles, $P_r$, as a function of time t, according to an embodiment of the present disclosure. Solid red line: fit to $1-\exp(-t/\tau)$, assuming 1st-order reaction kinetics, yielding release time constant $\tau=5680$ s. The inset in FIG. 1E corresponds to schematic side views before and after release. The release layer (dark gray) is dissolved, and the released tiles exhibit Brownian fluctuations in a fully submerged monolayer just above the glass surface, which is also negatively charged, thereby maintaining a lubricating layer of water between tiles and the glass. Previously static tiles begin to undergo Brownian motion, frequently colliding with neighboring tiles as the system equilibrates at fixed $\phi_A$. Time-lapse digital microphotography yields high resolution movies of the release kinetics. By digitally subtracting the initial image before release from images at later times t after adding the RSD, the fraction of released tiles, $P_r(t)$ can be determined, as shown in FIG. 1E. The observed release profile is consistent with first-order reaction kinetics, $P_r(t)=1-\exp(-t/\tau)$, where $\tau \approx 1.6$ h is the characteristic time scale of release (FIG. 1E). Thus, >99% of tiles are released after ≈8 h, and all tiles are released after ≈20 h. Although the depletion agent preserves the monolayer, very rarely, a strong local Brownian fluctuation can expel a tile vertically, so a few point defects can be seen for t>72 h. Thus, many in-plane inter-particle collisions may have occurred by t≈48 h, yet defects are not significant, so the monolayer has effectively equilibrated. Despite ongoing Brownian excitations, $\phi_A \approx 0.78$ is large enough that different superstructures of kite-dart motifs, while transiently distorted as tiles explore accessible microstates, remain intact long after release over large length scales and the confined P2-QC of mobile P2 tiles does not melt into a disordered liquid-like state.

Figure 5A:
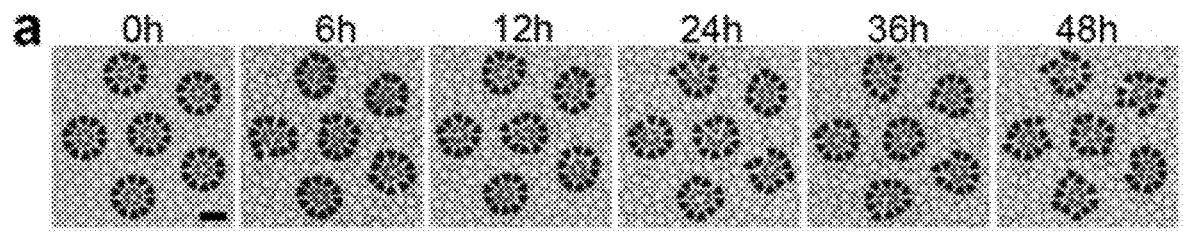
FIG. 5A shows regular center-filled pentagonal super-structural set of six 10 kite-5 dart wheel motifs (kites filled blue, darts filled red) before release (0 h, leftmost), and after release (6, 12, 24, 26, 48 h from left to right), according to an embodiment of the present disclosure.
Figure 5B:
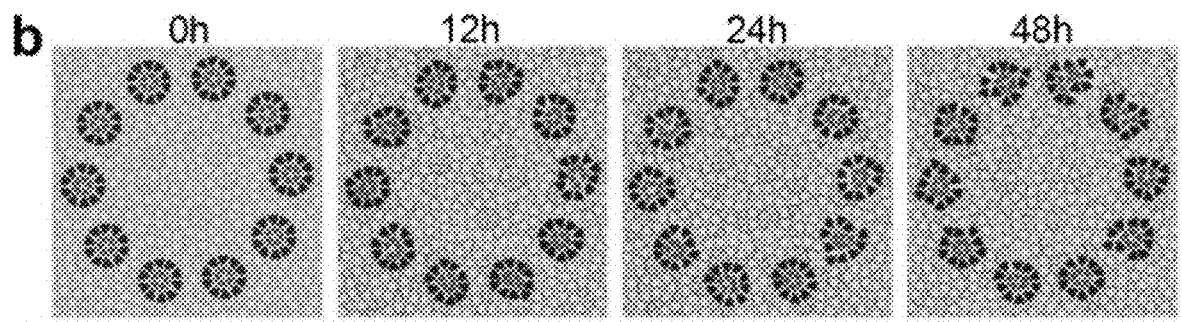
FIG. 5B shows regular decagonal super-structural set often 10 kite-5 dart wheel motifs before release (0 h, leftmost) and after release (12, 24, 48 h from left to right), according to an embodiment of the present disclosure.
Figure 5C:
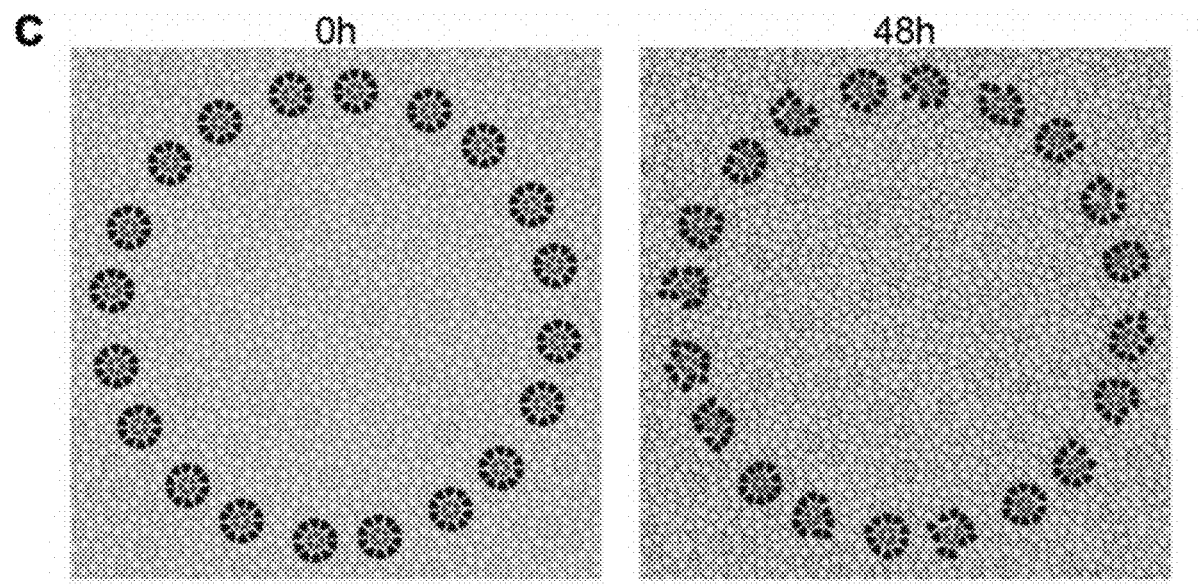
FIG. 5C shows regular icosagonal (i.e. 20-sided polygon) super-structural set of twenty 10 kite-5 dart wheel motifs before release (0 h, left) and after release (48 h, right), according to an embodiment of the present disclosure.

FIGS. 5A-5C show examples of organized superstructural sets of motifs extending over different length scales identified in the P2 quasi-crystal before and after release, according to an embodiment of the present disclosure. FIG. 5A shows regular center-filled pentagonal super-structural set of six 10 kite-5 dart wheel motifs (kites filled blue, darts filled red) before release (0 h, leftmost), and after release (6, 12, 24, 26, 48 h from left to right), according to an embodiment of the present disclosure. FIG. 5B shows regular decagonal super-structural set of ten 10 kite-5 dart wheel motifs before release (0 h, leftmost) and after release (12, 24, 48 h from left to right), according to an embodiment of the present disclosure. FIG. 5C shows regular icosagonal (i.e. 20-sided polygon) super-structural set of twenty 10 kite-5 dart wheel motifs before release (0 h, left) and after release (48 h, right), according to an embodiment of the present disclosure. The scale bar shown in FIG. 5A is the same for all images, in this example 20 μm.

Figure 2A:
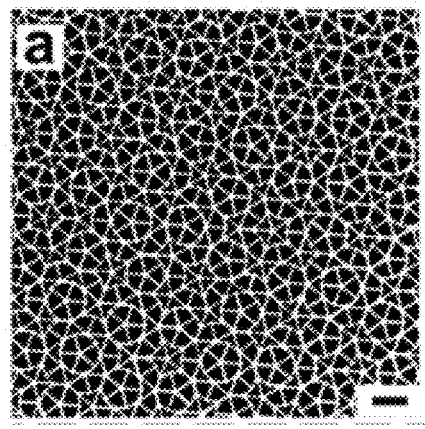
FIG. 2A shows an optical micrograph (OM) of Penrose QC tiles before release (interiors of tiles are filled black to enhance contrast), according to an embodiment of the present disclosure.
Figure 2B:
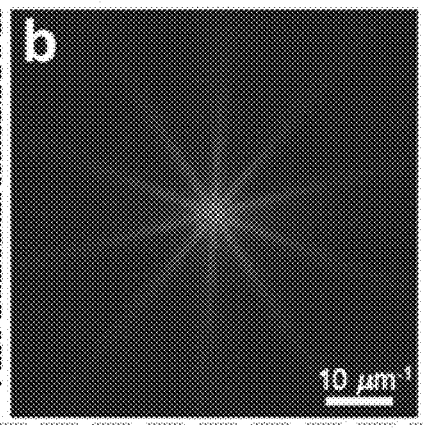
FIG. 2B shows an effective scattering pattern given by the Fourier transform (FT) intensity of the pattern shown in FIG. 2A showing 10 rays extending from the center to high scattering wavenumbers q, according to an embodiment of the present disclosure.

FIGS. 2A-2K show entropic restructuring of ordered Penrose kite and dart tiles into a fluctuating liquid quasi-crystal (LQC) monolayer after release, according to embodiments of the present disclosure. Brownian fluctuations of mobile P2 tiles can alter the degree of QC order compared to static tiles. FIG. 2A shows an optical micrograph (OM) of Penrose QC tiles before release (interiors of tiles are filled black to enhance contrast), according to an embodiment of the present disclosure. The scale bar is 20 μm. Fourier transforms (FTs) of optical micrographs are used to produce the equivalent of light scattering intensity patterns (see Methods in the following paragraphs for more details). The nearly perfect QC order before release shown in FIG. 2A yields Bragg-like peaks at low scattering wavenumbers q, indicative of ordering of larger superstructures of tiles, and also 10 narrow rays extending from the center towards high q, indicative of the high degree of 5-fold molecular orientational order of the edges of all tiles (FIG. 2B). FIG. 2B shows an effective scattering pattern given by the Fourier transform (FT) intensity of the pattern shown in FIG. 2A showing 10 rays extending from the center to high scattering wavenumbers q, according to an embodiment of the present disclosure.

Figure 2C:
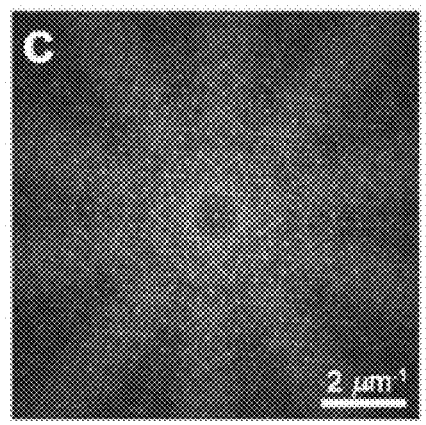
FIG. 2C depicts a central region of the pattern shown in FIG. 2B, zoomed by ≈6×, revealing Bragg peaks at intermediate and low q, according to an embodiment of the present disclosure.
Figure 2D:
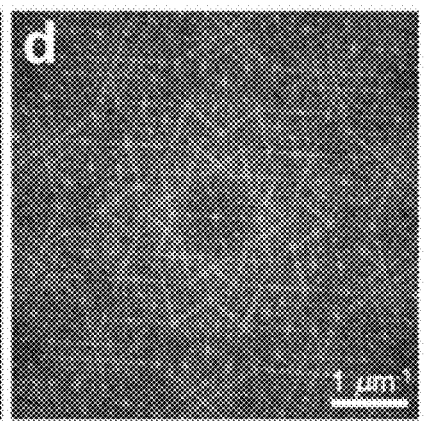
FIG. 2D shows the central region of the image shown in FIG. 2C, zoomed by ≈2×, revealing Bragg peaks at very low q associated with super-structural ordering of motifs of tiles over large length scales, according to an embodiment of the present disclosure.

FIG. 2C depicts a central region of the pattern shown in FIG. 2B, zoomed by ≈6×, revealing Bragg peaks at intermediate and low q, according to an embodiment of the present disclosure. FIG. 2D shows the central region of the image shown in FIG. 2C, zoomed by ≈2×, revealing Bragg peaks at very low q associated with super-structural ordering of motifs of tiles over large length scales, according to an embodiment of the present disclosure. Expanded views at lower q and very low q (FIG. 2C: ≈6× and FIG. 2D: ≈12×) reveal sets of 10 Bragg peaks, demonstrating pentagonal QC ordering of motifs and superstructures of motifs over long-range.

Figure 2E:
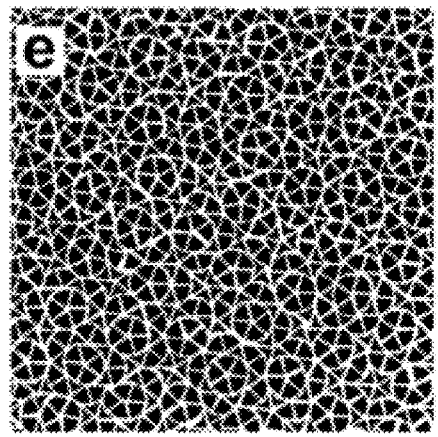
FIG. 2E shows optical micrograph of fluctuating Penrose QC tiles 48 hours after release (tile interiors filled black), according to an embodiment of the present disclosure.

FIG. 2E shows optical micrograph of fluctuating Penrose QC tiles 48 hours after release (tile interiors filled black), according to an embodiment of the present disclosure. Entropic Brownian fluctuations destroy ideal QC order; tiles no longer have perfect positions and orientations on a QC lattice, yet the overall QC morphology is preserved. After release and equilibration, mobile kite and dart tiles at a given instant are no longer in an ideal P2 tiling.

Figure 2F:
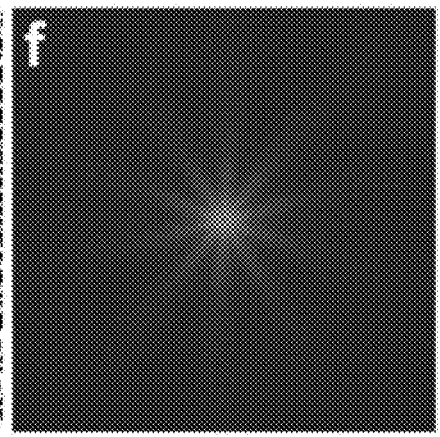
FIG. 2F shows average of FFT intensities of three different micrographs taken at 46, 48 (see FIG. 2E), and 50 hours after release, according to an embodiment of the present disclosure.
Figure 2G:
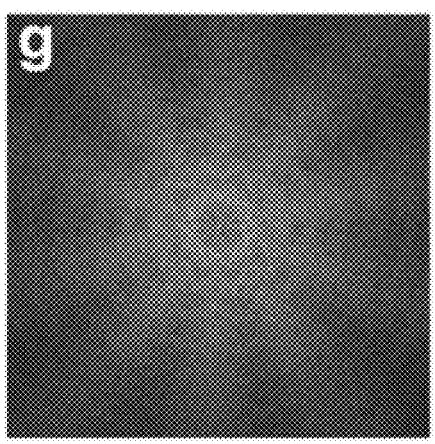
FIGS. 2G and 2H depict zooms of FIG. 2H over the same q ranges as in FIG. 2C and FIG. 2D, respectively, according to embodiments of the present disclosure.
Figure 2H:
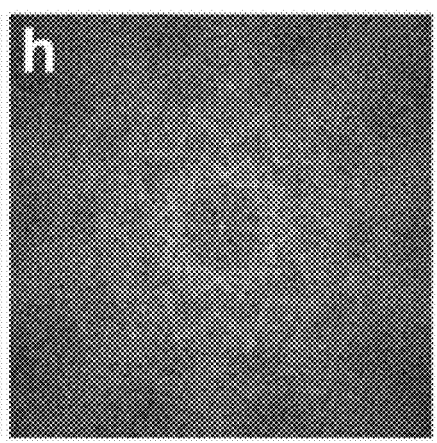
Figure 2I:
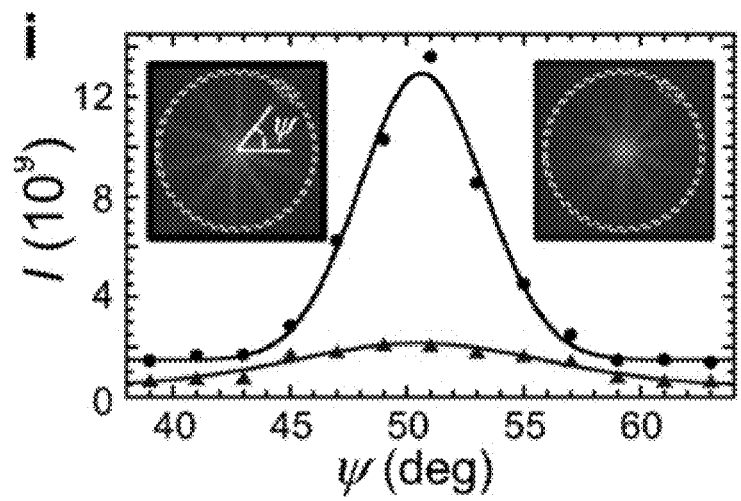
FIG. 2I shows a graph of azimuthal intensity, $I(\psi)$ High-q azimuthal line shapes $I(\psi)$ of emanating rays (see inset defining ψ and q: white dashed lines), before release (black circles) and after release (blue triangles), according to an embodiment of the present disclosure.
Figures 2J, 2K:
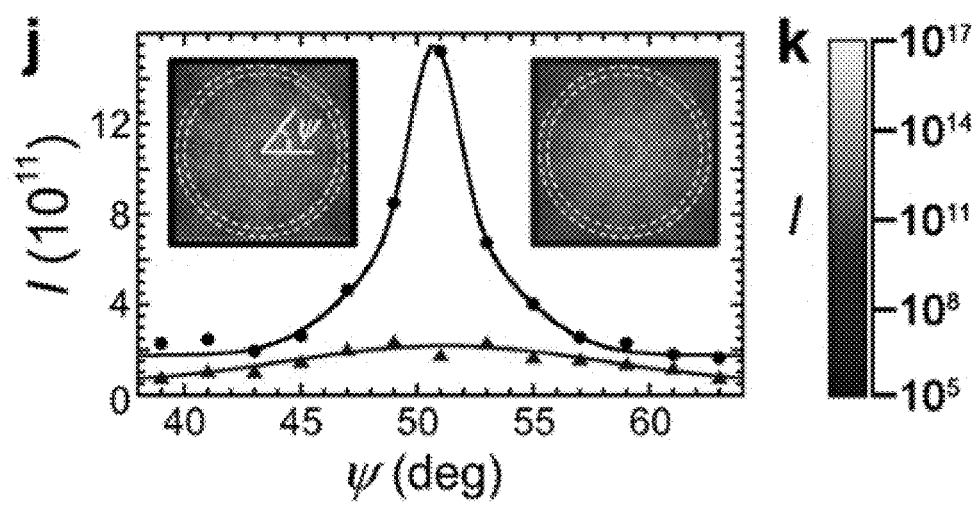
FIG. 2J shows an intermediate-q $I(\psi)$ (see inset defining ψ and q: white dashed lines), before release (black circles) and after release (blue triangles), according to an embodiment of the present disclosure.
FIG. 2K shows the intensity scale bar for all FTs, according to an embodiment of the present disclosure.

FIG. 2F shows average of FFT intensities of three different micrographs taken at 46, 48 (see FIG. 2E), and 50 hours after release, according to an embodiment of the present disclosure. Thus, Brownian fluctuations cause the 10 rays at high q to broaden azimuthally (FIG. 2F). FIGS. 2G and 2H depict zooms of FIG. 2H over the same q ranges as in FIG. 2C and FIG. 2D, respectively, according to embodiments of the present disclosure. All but the super-structural peaks at the very lowest q have become smeared out, leaving only 10-fold azimuthal intensity modulations at intermediate and high q. At intermediate q, Bragg peaks have disappeared and instead 10-fold modulations in ring-like intensities are seen (FIG. 2G ≈6× magnification), reminiscent of 6-fold modulations seen in hexatic liquid-crystal systems. Interestingly, large superstructures of motifs still retain considerable spatial and orientational order, since somewhat broadened peaks are still observed at the very lowest q (FIG. 2H ≈12×). Since entropic-thermal line broadening is very evident at high q, the azimuthal intensity, $I(\psi)$, of a ray is fitted using a Gaussian function (FIG. 2I, see the methods in the following paragraphs for more detail). FIG. 2I shows a graph of the azimuthal intensity, $I(\psi)$. High-q azimuthal line shapes $I(\psi)$ of emanating rays (see inset defining $\psi$ and q: white dashed lines), before release (black circles) and after release (blue triangles), according to an embodiment of the present disclosure. The peak I is reduced by ≈7× and the width $\psi_\sigma$ is increased by ≈2×. At intermediate q, $I(\psi)$ is fitted before release with a double Gaussian function to capture the Bragg-like peak and after release with a single Gaussian function (see the methods in the following paragraphs for more detail). FIG. 2J shows an intermediate-q $I(\psi)$ (see inset defining $\psi$ and q: white dashed lines), before release (black circles) and after release (blue triangles), according to an embodiment of the present disclosure. The disappearance of Bragg peaks, yet preservation of a 10-fold modulation in $\psi$ at this q indicates that motifs of tiles are no longer spatially ordered, but the majority of motifs do preserve a significant degree of orientational order. The black line corresponds to a fit to a double Gaussian and the blue line correspond to a fit to a Gaussian. FIG. 2K shows the intensity scale bar for all FTs.

Figure 6E:
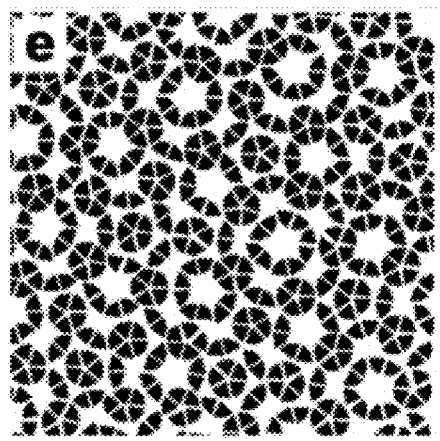
FIG. 6E shows Brownian fluctuations near equilibrium (48 h after release) have caused kite tiles to deviate from the original perfect QC order seen in the unreleased structure, according to an embodiment of the present disclosure.
Figure 6F:
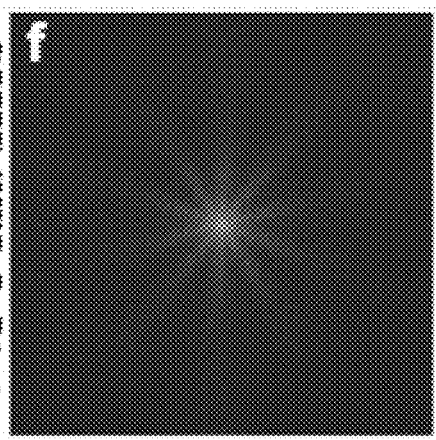
FIG. 6F shows the FT intensity of FIG. 6E, according to an embodiment of the present disclosure.

FIGS. 6A-6H show Penrose kite tiles in a P2 quasi-crystal before release (FIGS. 6A-6D) and after release (FIGS. 6E-6H), according to embodiments of the present disclosure. Similar broadening effects after release are also evident in FTs of only kite tiles (Extended Data in FIGS. 6A-6H) and only dart tiles (Extended Data in FIGS. 7A-7H). Evidence from the FTs after release supports the existence of a new phase of matter, which are called a "pentatic" liquid quasi-crystal ($LQC_5$). FIG. 6A shows Kite tiles are separated by micrograph image post-processing, from FIG. 3A. Scale bar (lower right) is 20 μm, according to an embodiment of the present disclosure. FIG. 6B shows an effective scattering pattern, given by the Fourier transform (FT) intensity of FIG. 6A, showing 10 rays extending from the center to high scattering wavenumbers q, according to an embodiment of the present disclosure. FIG. 6C shows the central region of FIG. 6B, zoomed by ≈6×, revealing Bragg peaks at intermediate and low q, corresponding to large distances, according to an embodiment of the present disclosure. FIG. 6D shows a central region of FIG. 6C, zoomed by an additional ≈2×, revealing Bragg peaks at very low q associated with super-structural ordering of motifs of kite tiles over large length scales, according to an embodiment of the present disclosure. FIG. 6E shows Brownian fluctuations near equilibrium (48 h after release) have caused kite tiles to deviate from the original perfect QC order seen in the unreleased structure, according to an embodiment of the present disclosure. FIG. 6F shows the FT intensity of FIG. 6E, according to an embodiment of the present disclosure.

Figure 6G:
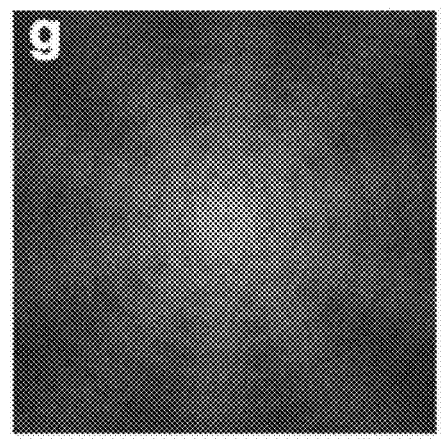
FIGS. 6G and 6H show zooms of FIG. 6F over the same q ranges as in FIG. 6C and FIG. 6D, respectively, showing the smearing of Bragg peaks into 10-fold azimuthal intensity modulations, according to an embodiment of the present disclosure.
Figure 6H:
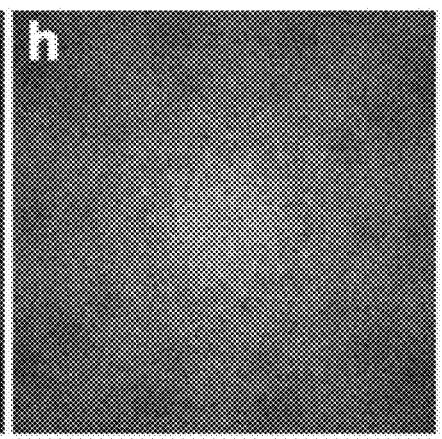

Rays have broadened azimuthally as a consequence of Brownian fluctuations. FIGS. 6G and 6H show zooms of FIG. 6F over the same q ranges as in FIG. 6C and FIG. 6D, respectively, showing the smearing of Bragg peaks into 10-fold azimuthal intensity modulations, reminiscent of liquid-crystalline materials, indicating a retention of quasi-crystalline orientational order, according to an embodiment of the present disclosure. Color scale bar of intensity is the same as in FIG. 2K.

Figure 7E:
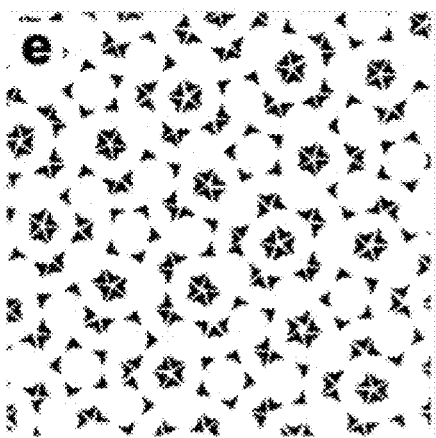
FIG. 7A shows dart tiles that are separated by micrograph image post-processing. Scale bar (lower right): 20 μm, according to an embodiment of the present disclosure.
FIG. 7B shows effective scattering pattern, given by the Fourier transform (FT) intensity of the dart tiles of FIG. 7A, showing 10 rays extending from the center to high scattering wavenumbers q, according to an embodiment of the present disclosure.
FIG. 7C show a central region of (FIG. 7B), zoomed by ≈6×, revealing Bragg peaks at intermediate and low q, corresponding to large distances, according to an embodiment of the present disclosure.
FIG. 7D shows a central region of the pattern in FIG. 7C, zoomed by an additional ≈2×, revealing Bragg peaks at very low q associated with super-structural ordering of motifs of dart tiles over large length scales, according to an embodiment of the present disclosure.
FIG. 7F shows the FT intensity of the structure shown in FIG. 7E, according to an embodiment of the present disclosure.
FIGS. 7G and 7H show zooms of the pattern shown in FIG. 7F over the same q ranges as in FIG. 7C and FIG. 7D, respectively, according to an embodiment of the present disclosure.
Figure 7F:
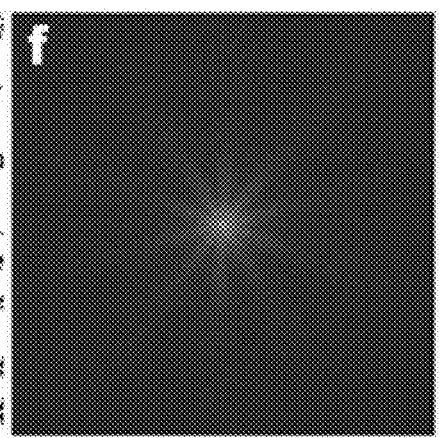
Figure 7G:
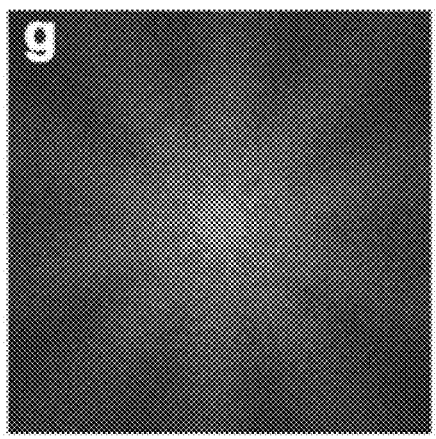
Figure 7H:
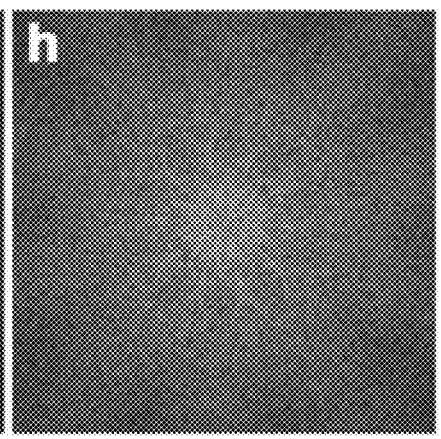

FIGS. 7A-7H show an extended data of Penrose dart tiles in a P2 quasi-crystal before release (FIGS. 7A-7D) and after release (FIGS. 7E-7H), according to embodiments of the present disclosure. FIG. 7A shows dart tiles that are separated by micrograph image post-processing. Scale bar (lower right): 20 µm, according to an embodiment of the present disclosure. FIG. 7B shows effective scattering pattern, given by the Fourier transform (FT) intensity of the dart tiles of FIG. 7A, showing 10 rays extending from the center to high scattering wavenumbers q, according to an embodiment of the present disclosure. FIG. 7C show a central region of (FIG. 7B), zoomed by ≈6×, revealing Bragg peaks at intermediate and low q, corresponding to large distances, according to an embodiment of the present disclosure. FIG. 7D shows a central region of the pattern in FIG. 7C, zoomed by an additional ≈2×, revealing Bragg peaks at very low q associated with super-structural ordering of motifs of dart tiles over large length scales, according to an embodiment of the present disclosure. FIG. 7E shows Brownian fluctuations near equilibrium (48 h after release) have caused dart tiles to deviate from the original perfect QC order seen in the unreleased structure. FIG. 7F shows the FT intensity of the structure shown in FIG. 7E, according to an embodiment of the present disclosure. Rays have broadened azimuthally as a consequence of Brownian fluctuations. FIGS. 7G and 7H show zooms of the pattern shown in FIG. 7F over the same q ranges as in FIG. 7C and FIG. 7D, respectively, showing a smearing of Bragg peaks into 10-fold azimuthal intensity modulations, reminiscent of liquid-crystalline materials, indicating a retention of quasi-crystalline orientational order, according to an embodiment of the present disclosure. Color scale bar of intensity is the same as in FIG. 2K.

Figure 3A:
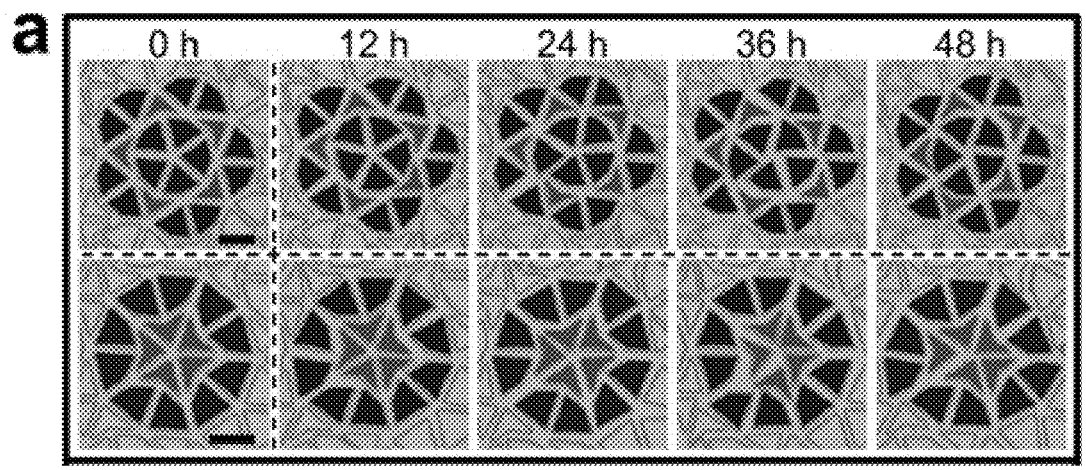
FIG. 3A shows optical micrographs (OM) of fluctuating pentagonal motifs of Penrose kite-and-dart tiles before release and 12, 24, 36, and 48 hours after release: 15 kite-5 dart flower (upper row); 10 kite-5 dart wheel (lower row), according to an embodiment of the present disclosure.

FIGS. 3A-3E show motif dynamics and super-structural orientation pair correlation function, according to embodiments of the present disclosure. FIG. 3A shows optical micrographs of fluctuating pentagonal motifs of Penrose kite-and-dart tiles before release and 12, 24, 36, and 48 hours after release: 15 kite-5 dart flower (upper row); 10 kite-5 dart wheel (lower row), according to an embodiment of the present disclosure. The scale bar in FIG. 3A is m. Entropic fluctuations lead to local chiral symmetry breaking of motifs. Equilibrium Brownian forces cause multi-tile motifs, such as the 15 kite-5 dart pentagonal flower (FIG. 3A, top) and the 10 kite-5 dart pentagonal wheel FIG. 3A, bottom), to fluctuate and distort randomly, breaking chiral symmetry locally without melting.

Figure 3B:
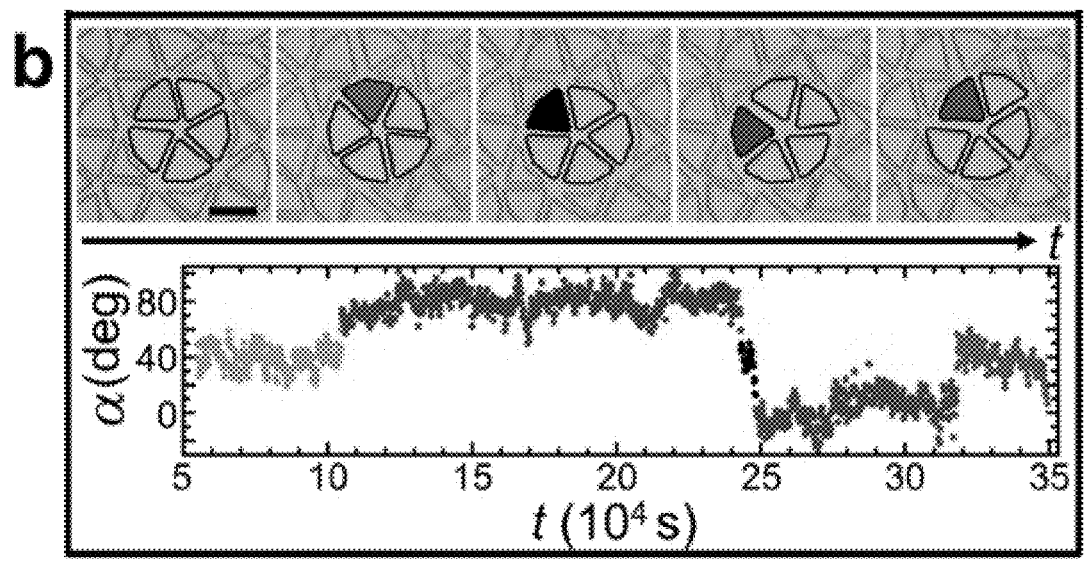
FIG. 3B shows collective rotational fluctuations of a central pentagonal star of kites (black outlines) within a flower over time; one kite is color-coded to show the collective rotation of the motif; its rotational angle α versus time t exhibits hopping behavior between preferred angles that match corrugations of the surrounding tiles, the scale bar is 10 µm, according to an embodiment of the present disclosure.

FIG. 3B shows collective rotational fluctuations of a central pentagonal star of kites (black outlines) within a flower over time, according to an embodiment of the present disclosure. One kite is color-coded to show the collective rotation of the motif. Its rotational angle α versus time t exhibits hopping behavior between preferred angles that match corrugations of the surrounding tiles. Scale bar: 10 µm.

Figure 3C:
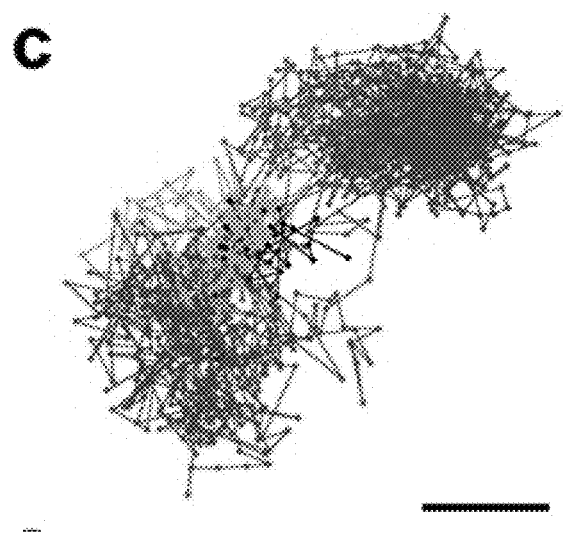
FIG. 3C shows a trajectory of the centroid of the color-coded kite shown in FIG. 3B, which displays heterogeneous dynamics, according to an embodiment of the present disclosure.

FIG. 3C shows a trajectory of the centroid of the color-coded kite shown in FIG. 3B, which displays heterogeneous dynamics, according to an embodiment of the present disclosure. The scale bar in FIG. 3C corresponds to 3 µm.

Within the fluctuating P2 system, we observe that 5 kites in pentagonal-star-kite motifs (PSKMs) can rotate collectively, and the entire motif makes rotational transitions between different preferred angles, defined by corrugations in proximate boundary tiles (FIG. 3B, top). The heterogeneous dynamics of these collective rotational fluctuations are measured by digitally tracking the rotational angle α and trajectory of the centroid of one kite in the PSKM over time (FIG. 3B, bottom and FIG. 3C). Although all motifs distort and PSKM even rotate, larger scale superstructures made up of multiple motifs appear to preserve orientational order over long range. To quantify this feature, a motif super-structural orientational pair correlation function (MSO-PCF), $g_{MSO-PCF}$, that can depend on the separation r between the centers of two similar superstructures of motifs is created.

Figure 3D:
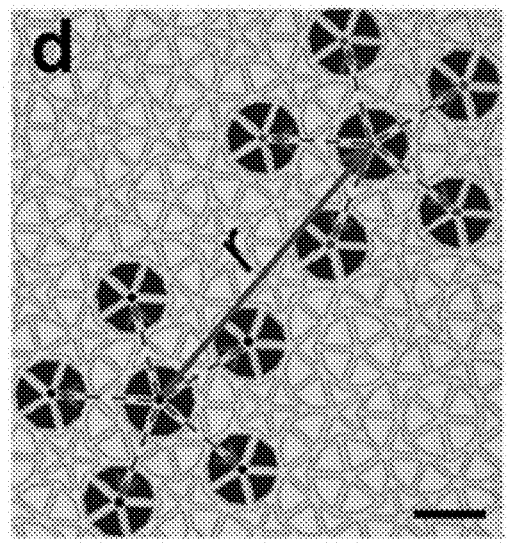
FIG. 3D shows a first pentagonal superstructure of pentagonal star-kite motifs (PSKMs, kites filled blue, black dot at center) is separated by a center-to-center distance r from a second pentagonal superstructure of PSKMs (kites filled blue, red dot at center), according to an embodiment of the present disclosure.

FIG. 3D shows a first pentagonal superstructure of pentagonal star-kite motifs (PSKMs, kites filled blue, black dot at center) is separated by a center-to-center distance r from a second pentagonal superstructure of PSKMs (kites filled blue, red dot at center), according to an embodiment of the present disclosure. Solid green arrow corresponds to the vector between centers of super-structures. The dashed green arrows correspond to vectors between centers of superstructures and constituent PSKMs, according to an embodiment of the present disclosure. The scale bar is 20 m. For instance, a superstructure of five PSKMs in a nearly regular pentagonal configuration that surround a central PSKM is defined in FIG. 3D. Super-structural bond angles (dashed lines in FIG. 3D) are then correlated in a manner analogous to bond-orientational pair correlation functions of individual particles.

Figure 3E:
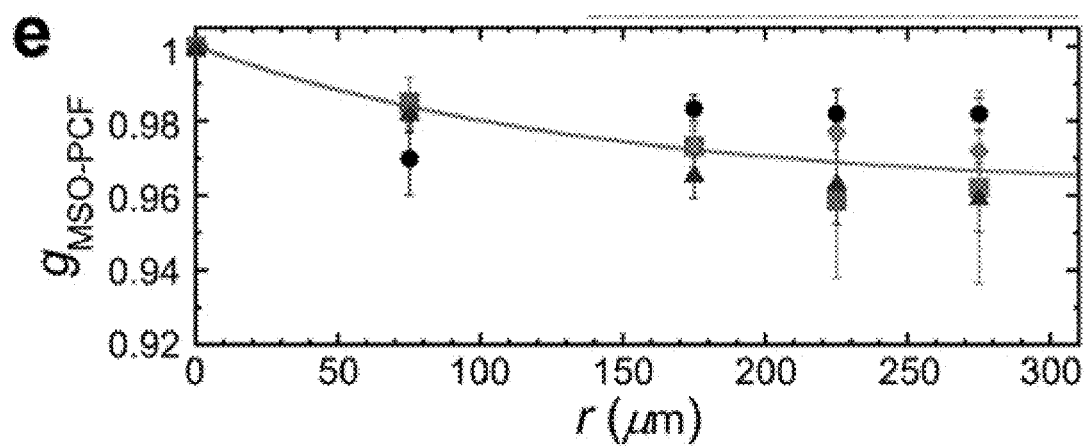
FIG. 3E shows a motif super-structural orientational pair correlation function (MSO-PCF), $g_{MSO-PCF}$, as a function of a r: 24 (black circles), 48 (blue squares), 72 (red diamonds), and 96 hours (green triangles) after release, according to an embodiment of the present disclosure.

FIG. 3E shows a motif super-structural orientational pair correlation function (MSO-PCF), $g_{MSO-PCF}$, as a function of a r: 24 (black circles), 48 (squares), 72 (diamonds), and 96 hours (triangles) after release, according to an embodiment of the present disclosure. The solid line correspond to a fit to the average of 48 and 72 hour data using exponential decay of $g_{MSO-PCF}$ from 1 down to a plateau of $g_{MSO-PCF}=0.96$ at large r. The high and persistent value of $g_{MSO-PCF}$ at large r over long times indicates long range orientational order of superstructures of motifs persists in equilibrium after release even as tile-tile spatial order is destroyed at long range as a consequence of entropic Brownian fluctuations of all tiles. Before release, $g_{MSO-PCF}(r)$ is 1, whereas after release $g_{MSO-PCF}(r)$ exponentially decays from 1 down to a plateau that is just below unity, indicating strong preservation of relative super-structural bond angles over long range (FIG. 3E). Thus, the motif super-structural orientation (MSO) is preserved over a relatively long time even as distortions and rotations of smaller motifs may occur. Moreover, because the P2-QC system of mobile tiles exhibits solid-like behavior, similar to simpler dispersed systems of colloidal hard spheres at high densities, entropically generated sound wavelets that scatter locally and are damped can be observed.

Figures 4A, 4B, 4C:
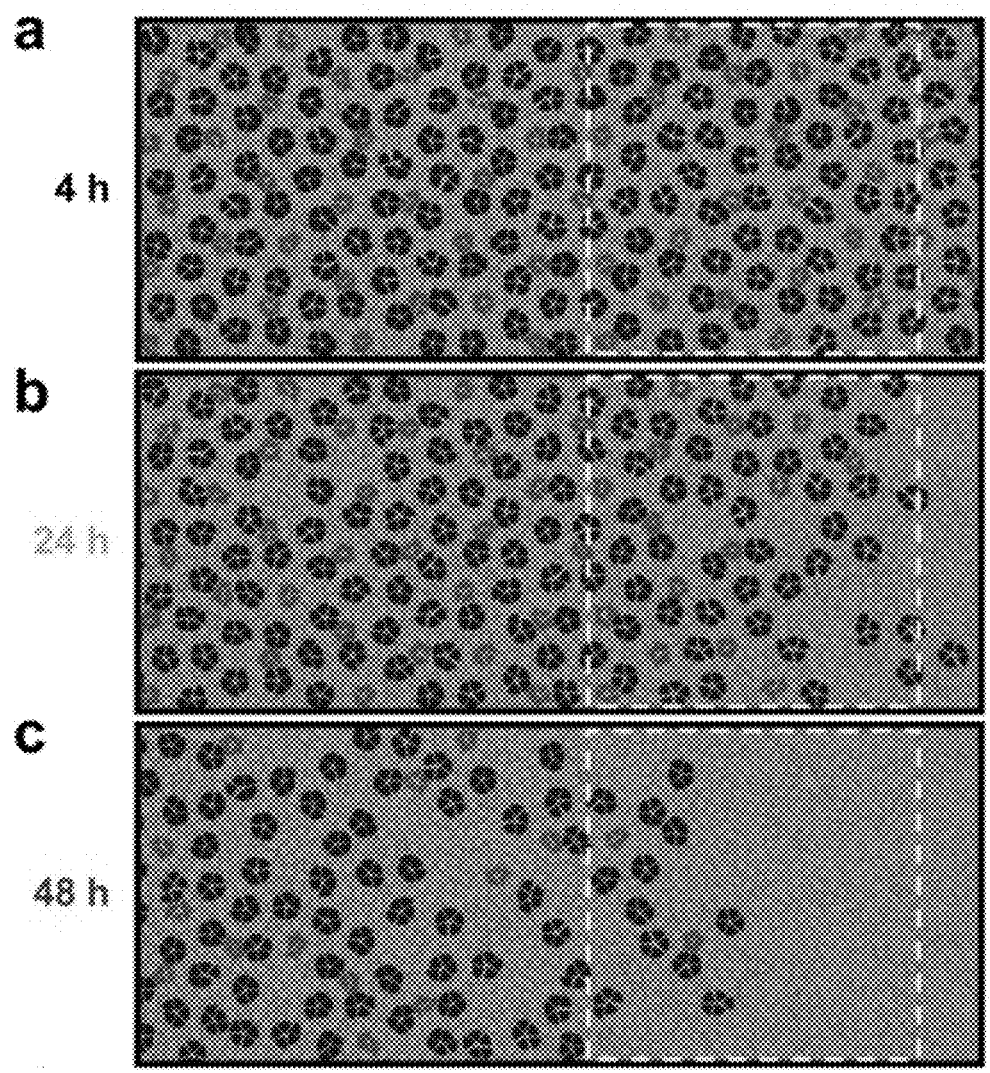
FIG. 4A shows color-coded optical micrograph of Penrose kite-and-dart tiles that diffusively melt into an unconfined open region beyond the right of the micrograph at 4 h after release, according to an embodiment of the present disclosure.
FIG. 4B shows color-coded optical micrograph of Penrose kite-and-dart tiles that diffusively melt into an unconfined open region beyond the right of the micrograph at different time 24 h after release, according to an embodiment of the present disclosure.
FIG. 4C shows color-coded optical micrograph of Penrose kite-and-dart tiles that diffusively melt into an unconfined open region beyond the right of the micrograph at different time 48 h after release, according to an embodiment of the present disclosure.
Figures 4F, 4G, 4H:
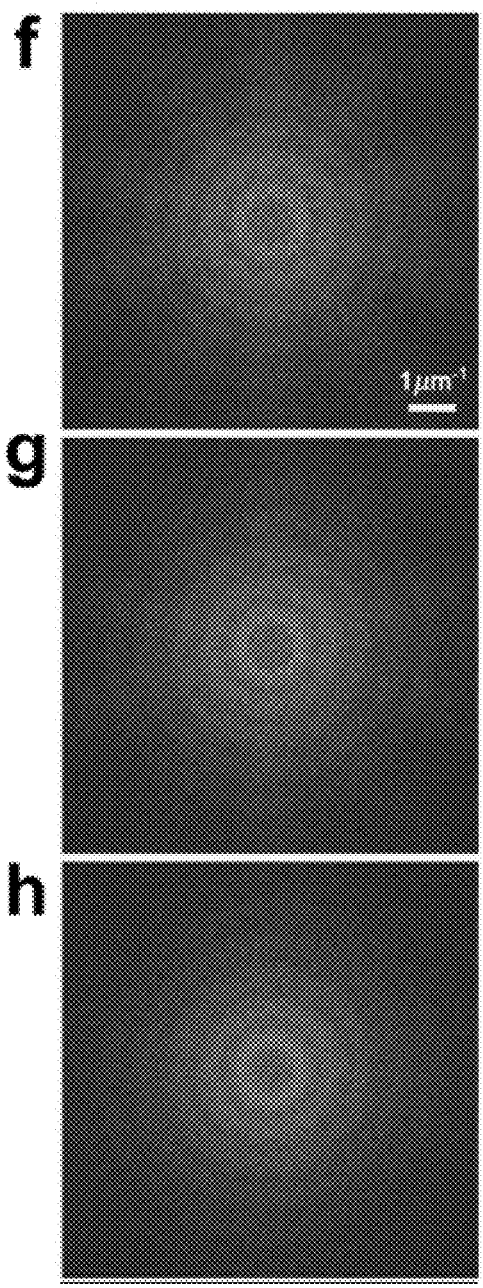
FIG. 4F shows a Fourier Transform (FT) of image (a)-inside yellow dashed lines. 10-fold azimuthal intensity modulations are evident, according to an embodiment of the present disclosure.
FIG. 4G shows a FT of image (b)-inside yellow dashed lines. 10-fold azimuthal intensity modulations are less pronounced, according to an embodiment of the present disclosure.
FIG. 4H shows a FT of image (c)-inside yellow dashed lines. 10-fold azimuthal intensity modulations are not visible, and the ring-like pattern indicates that tiles in the region are largely disordered as in a glass, according to an embodiment of the present disclosure.
Figure 4I:
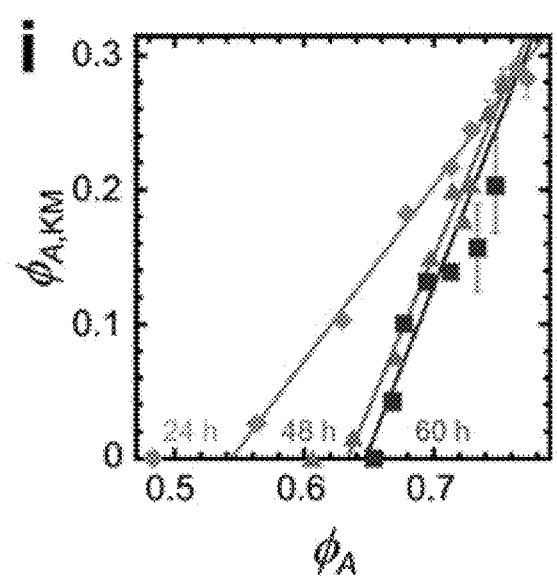
FIG. 4I shows a plot of $\phi_{A,KM}$ versus $\phi_A$. In order to determine the melting area fraction $\phi_{A,melt}$ of the P2 QC, $\phi_{A,KM}$ is plotted as a function of $\phi_A$ at times after release: 24 h (green circles), 48 h (orange diamonds), and 60 h (purple triangles), according to an embodiment of the present disclosure.

FIG. 4A-4I show entropic melting dynamics of an unconfined fluctuating Brownian quasi-crystal, according to an embodiment of the present disclosure. FIG. 4A shows color-coded optical micrograph of Penrose kite-and-dart tiles that diffusively melt into an unconfined open region beyond the right of the micrograph at different times after release 4 h, according to an embodiment of the present disclosure. FIG. 4B shows color-coded optical micrograph of Penrose kite-and-dart tiles that diffusively melt into an unconfined open region beyond the right of the micrograph at different time 24 h after release, according to an embodiment of the present disclosure. FIG. 4C shows color-coded optical micrograph of Penrose kite-and-dart tiles that diffusively melt into an unconfined open region beyond the right of the micrograph at different time 48 h after release, according to an embodiment of the present disclosure. The blue color corresponds to pentagonal star-kite motifs (PSKMs). The red corresponds to pentagonal star-dart motifs. FIG. 4D shows area fraction of Penrose kite-and-dart tiles, $\phi_A$, as a function of a distance, d, starting from the left of the top micrograph images at different times after release: 4 h (black circles), 24 h (diamonds), and 48 h (triangles), according to an embodiment of the present disclosure. The lines are fits to an empirical Fermi function (see below methods). FIG. 4E shows area fraction of unmelted PSKMs, $\phi_{A,KM}$, as a function of d at different times after release: 4 h (black circles), 24 h (diamonds), and 48 h (triangles), according to an embodiment of the present disclosure. The lines are fits to an empirical Fermi function (see the methods described in the following paragraphs). FIG. 4F shows a Fourier Transform (FT) of image (a)-inside yellow dashed lines. 10-fold azimuthal intensity modulations are evident, according to an embodiment of the present disclosure. FIG. 4G shows a FT of image (b)-inside yellow dashed lines. 10-fold azimuthal intensity modulations are less pronounced, according to an embodiment of the present disclosure. FIG. 4H shows a FT of image (c)-inside yellow dashed lines. 10-fold azimuthal intensity modulations are not visible, and the ring-like pattern indicates that tiles in the region are largely disordered as in a glass, according to an embodiment of the present disclosure. FIG. 4I shows a plot of $\phi_{A,KM}$ versus $\phi_A$. In order to determine the melting area fraction $\phi_{A,melt}$ of the P2 QC, $\phi_{A,KM}$ is plotted as a function of $\phi_A$ at times after release: 24 h (circles), 48 h (diamonds), and 60 h (triangles), according to an embodiment of the present disclosure. At the two longest times, we find nearly the same motif melting behavior, yielding an intercept with the horizontal axis of $\phi_{A,melt} \approx 0.65$. Lines: linear fits (see the methods in the following paragraphs).

In an embodiment, dense P2 patterns are caused to melt by removing a confining wall. Tiles diffuse gradually into the available empty space over time, thereby creating a gradient in $\phi_A$ (FIGS. 4A-4C). Digitally color-coded pentagonal-star-kite motifs (blue) and pentagonal-star-dart motifs (red) progressively melt. $\phi_A$ is measured as a function of distance d and t (FIG. 4D) and the area fractions of pentagonal kite motifs, $\phi_{A,KM}$ (FIG. 4E) and dart motifs.

Figure 8:
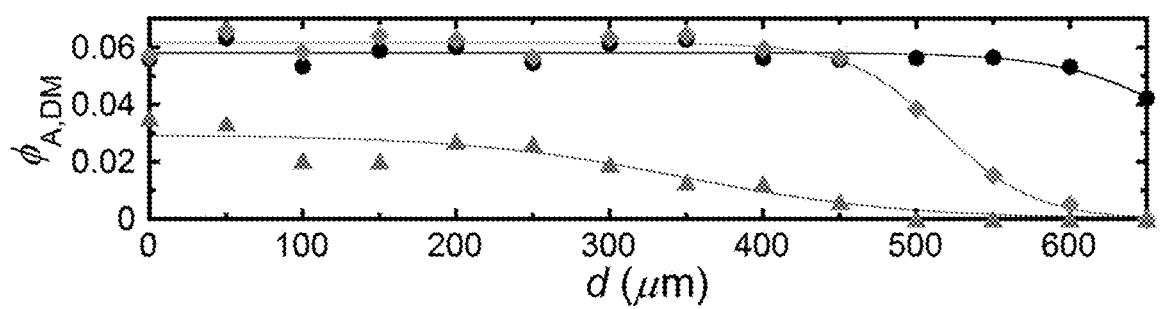
FIG. 8 shows extended data of Melting of pentagonal-star-dart motifs in an unconfined Brownian P2 quasi-crystal, according to an embodiment of the present disclosure.

FIG. 8 shows extended data of Melting of pentagonal-star-dart motifs in an unconfined Brownian P2 quasi-crystal, according to an embodiment of the present disclosure. The area fraction of pentagonal-star-dart motifs, $\phi_{A,DM}$ (red darts in FIG. 8) decays to zero at large distances d, towards the direction where the quasi-crystal is not confined. The motif melting front moves from left to right (i.e. toward the direction of open space) over time: black circles (4 h after release), diamonds (24 h), and triangles (48 h). Fits are to a Fermi-like function, and the fit parameters are displayed in Table 1. Table 1 provides fitting parameters of the Fermi-like function describing the dependence of total tile area fraction $\phi_A$, area fraction of kite motifs $\phi_{A,KM}$, and area fraction of dart motifs $\phi_{A,DM}$ on the distance d during melting of the P2 QC.

TABLE 1

| Data Fit | Fitting Parameter | t = 4 h | t = 24 h | t = 48 h |
|---|---|---|---|---|
| $\phi_A(d)$ | $\phi_A^*$ | 0.770 ± 0.001 | 0.768 ± 0.003 | 0.762 ± 0.002 |
| | $d_0$ (μm) | 846 ± 16 | 744 ± 9 | 773 ± 5 |
| | L (μm) | 98 ± 7 | 95 ± 7 | 162 ± 5 |
| | $R^2$ | 0.994 | 0.994 | 0.999 |
| $\phi_{A,KM}(d)$ | $\phi_{A,KM}^*$ | 0.314 ± 0.003 | 0.285 ± 0.005 | 0.269 ± 0.013 |
| | $d_{0,KM}$ (μm) | 750 ± 35 | 567 ± 6 | 387 ± 16 |
| | $L_{KM}$ (μm) | 79 ± 22 | 49 ± 6 | 66 ± 13 |
| | $R^2$ | 0.921 | 0.989 | 0.981 |
| $\phi_{A,DM}(d)$ | $\phi_{A,DM}^*$ | 0.058 ± 0.001 | 0.062 ± 0.001 | 0.029 ± 0.003 |
| | $d_{0,DM}$ (μm) | 691 ± 7 | 517 ± 5 | 348 ± 29 |
| | $L_{DM}$ (μm) | 41 ± 8 | 30 ± 4 | 72 ± 24 |
| | $R^2$ | 0.953 | 0.995 | 0.953 |

Fermi functions, consistent with diffusive melting, fit the measured $\phi_A(d)$ and $\phi_{A,KM}(d)$ profiles (FIG. 4D and FIG. 4E, solid lines, see the methods described in the following paragraphs). FTs of the same region before, during, and after the passage of the melting front (FIGS. 4F-4H, respectively) reveal the progressing disappearance of spatial and orientational order. Peaks at very low q, which were evident before melting (FIG. 4F), disappear, and only isotropic rings, indicative of liquid-like disorder, appear in the FTs immediately after melting (FIG. 4H). To determine the $\phi_A$ associated with melting, we eliminate d and plot $\phi_{A,KM}$ versus $\phi_A$ at different t (FIG. 4I). For longer t towards equilibrium, the measured $\phi_{A,KM}(\phi A)$ almost overlap. Therefore, considering $\phi_{A,KM} \rightarrow 0$, the P2-QC effectively melts at $\phi_{A,melt} \approx 0.65 \pm 0.02$. This melting and the diffusion of individual tiles into the empty space provides additional empirical evidence that any residual in-plane depletion attractions between tiles are weak compared to $k_B T$ (see Supplementary Information).

This first demonstration of Litho-PAMs reveals its power for generating extremely complex multi-scale Brownian monolayers of mobile shape-designed colloidal tiles that have effectively hard interactions and fluctuate entropically. This lithographic pre-assembly approach, which relies upon a specially formulated and optimized a release solution-dispersion (RSD) that maintains the monolayer during and after release, can be readily extended far beyond two-component systems, since many differently shaped tiles can be designed and pre-configured at different $\phi_A$. Thus, the phase behavior and melting of many interesting 2D systems can now be measured and compared with theories and simulations. This will lead to a broader understanding of heterogeneous dynamics in multi-component, multi-scale Brownian systems. Moreover, in-plane attractive interactions between the tiles can be tuned-in by further altering the RSD (Supplementary Discussion). By circumventing well-known problems associated with self-assembly, such as slow assembly kinetics and disorder caused by jamming during crowding, pre-assembly enables the exploration of interesting Brownian systems that approach the high degree of multi-scale complexity in biology.

Litho-PAMs can provide diverse, complex, and essentially defect-free experimental soft-matter systems suitable for critically testing predictions of theories and simulations, including fluctuating dynamics and kinetics. Specifically, Litho-PAMs can be used to reveal and measure localized and anisotropic translational and rotational dynamics associated with different particle shapes or local groups of shapes, some of which can move collectively, over a wide range of densities and length scales. These observations could inspire and motivate improvements in simulations, which some-times do not report results in units of real time that can be directly compared with experiments. Detailed statistical analyses of measured trajectories of tile collisions at different relative positions and orientations in experiments and could also potentially be compared to simulations in order to deduce and quantify interactions between neighboring tiles, such as hydrodynamic interactions and site-specific attractive or repulsive interactions.

Extending theories of multi-body systems of single colloidal shapes to multi-scale systems containing two or more different tile shapes that effectively have hard in-plane interactions, such as the Brownian P2 QC of kite and dart tiles that we have created, represents an exciting challenge. For such fluctuating monolayers of tiles, the free energy is entirely entropic in origin, which is considerably different than the free energy of strongly bonded configurations of atoms in classic solid-state QCs (see additional discussion in the methods in the following paragraphs). Ultimately, such theories of entropy-dominated fluctuating monolayers of hard complex shapes could potentially be used to predict the phase behavior, dynamic heterogeneity, and melting of the soft-matter P2 QC and other multi-scale structures made using Litho-PAMs.

Although we have demonstrated one viable route for creating Litho-PAMs using optical stepper lithography and a specifically formulated RSD that creates anisotropic roughness-controlled depletion attractions (RCDAs), the general concept of fluctuating Brownian Litho-PAMs is not limited to these specific methods of fabrication, materials, and types of interactions. Other methods of fabrication, such as forms of nanolithography (see Supplementary Discussion in Supplementary Information), could also be used. The tiles need not be slab-like, but instead could have more complex out-of-plane shapes, and their overall lateral dimensions could be significantly smaller. Beyond crosslinked polymeric photoresist, the tiles could alternatively be composed of inorganic materials or metals. Likewise, other release materials and agents could potentially be used. While anisotropic RCDAs conveniently provide strong out-of-plane lubricated attractions between the faces of tiles and the substrate yet very weak residual in-plane attractions, the use of RCDAs is not an inherent aspect of Litho-PAMs. Other types of anisotropic attractions that provide lubricated attractions between tiles and the substrate, yet do not cause strong in-plane attractions leading to aggregation of tiles, could also potentially be used. The sizes and shapes of the boundary walls can also be controlled lithographically, opening the door to the visualization of entropic and steric effects in specially confined systems of shape-designed Brownian particles.

The term "lubricated attraction" is used herein to mean an attractive interaction between the surface of a shape-designed particle and the substrate that maintains a lubricating layer of fluid between the surface of the shape-designed particle and the substrate.

As is understood in the art of colloidal science, lubricated attractions primarily result from the existence of a secondary minimum in the potential energy of interaction between two surfaces that are separated by a fluid. The magnitude of the depth of the secondary minimum (i.e., well) in this potential energy of interaction can be referred to as the "attraction," "attractive energy," "energy of attraction," or "well depth of the secondary minimum." A depletion attraction between charge-stabilized colloids is a method of creating a secondary minimum in the potential energy of interaction between charged-stabilized colloids. Likewise, a depletion attraction between the surface of a charge-stabilized colloid and the surface of a solid wall, which has the same sign charge as the surface of the colloid, can be used to create a secondary minimum in the potential energy of interaction between the surface of a colloidal particle and the surface of a solid wall.

In an embodiment of the current invention, a roughness-controlled depletion attraction is used to create a lubricated attraction between a plurality of lithographically fabricated shape-designed particles and a smooth glass wafer substrate. The roughness-controlled depletion attraction, which is induced by the addition of a depletion agent in the form of anionically stabilized polystyrene nanospheres having a preselected average diameter and volume fraction dispersed in an aqueous solution, creates a secondary minimum in the potential energy of interaction between the facial surface of each of the shape-designed particles, which are stabilized by anionic dodecylsulfate ions, and the negatively charged surface of a smooth glass wafer substrate, which is in proximity with each of the facial surfaces of the shape-designed particles. This roughness-controlled depletion attraction, in combination with the shorter-range screened charge repulsion, thus produces a lubricated attraction between each of the shape-designed particles and the substrate that is in excess of thermal energy for sufficiently large volume fraction of the depletion agent. This lubricated attraction is strong enough to prevent substantially all lithographically shape-designed particles from leaving the vicinity of the surface of the substrate, thereby differentiating the herein method from other prior methods in which the depletion agent was not acting concurrently with the de-solidification of the solid layer of release material. In such prior methods, the shape-designed particles were completely lifted-off and removed from the proximity of the substrate. Whereas in the present method, the de-solidification of the solid layer of release material and action of the depletion agent to create a depletion attraction in excess of thermal energy are concurrent, thereby creating lubricated attractions between each of the shape-designed particles and the substrate, such that essentially none of the shape-designed particles leaves the proximity of the substrate.

Complex multi-scale materials composed of colloidal building blocks represent an interesting yet challenging scientific frontier. As the desired level of complexity in multi-scale materials increases, some limitations of current self- and directed-assembly methods have become apparent. Litho-PAMs represents an alternative approach that can provide facile access to a wide range of complex 2D multi-scale materials composed of differently shaped mobile tiles, including fluctuating Brownian systems that have unusual symmetries and hierarchical structures. Thus, Litho-PAMs can be used to create and study new kinds of equilibrium phases of hard tiles, including but not limited to fluctuating Brownian P2 QCs. Strikingly, these new phases can potentially display unusual and interesting spatio-temporal dynamics at different length scales, such as the transient collective hopping motion of the PSKMs in the Brownian P2 QC. Using Litho-PAMs to systematically control the degree of coupling between different types of motifs and the rest of the system is likely to lead to a broader understanding of heterogeneous dynamics in complex multi-scale Brownian systems, well beyond disordered glassy systems. Moreover, Litho-PAMs opens up exciting possibilities for exploring and directly visualizing the evolution of multi-scale systems that have pre-assembled out-of-equilibrium initial states, not just equilibrium phases. Thus, Litho-PAMs can potentially be used to visualize directly and study defect dynamics and relaxation from desired out-of-equilibrium configurations in complex multi-scale systems that would be very difficult to create otherwise (see Additional Discussion in Methods). While our initial demonstration of Litho-PAMs has focused on the two-tile kite and dart P2 QC system, a much larger number of different tile shapes can be simultaneously fabricated and pre-configured using Litho-PAMs, yielding systems having even higher levels of multi-scale morphological complexity, ranging from sub-particle features in tile shapes, to local multi-tile motifs, all the way up to intricate and diverse superstructures.

Figure 10:
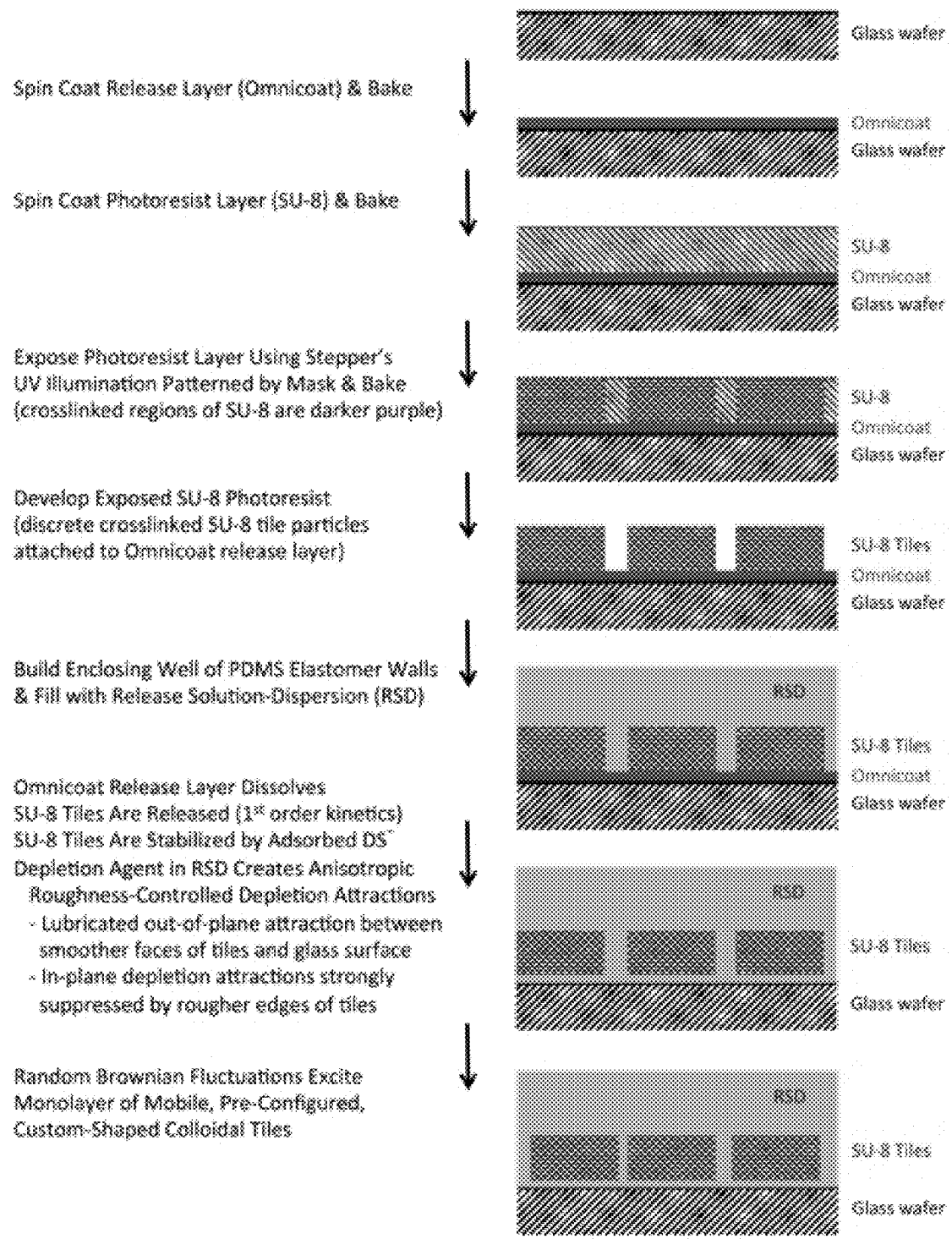
FIG. 10 shows a detailed sequence of steps for fabricating and releasing a dense lithographically pre-assembled monolayer (Litho-PAM) of mobile shape-designed tiles, according to an embodiment of the present disclosure.

In the following paragraphs various methods are described for making and fabricating various configurations described in the above paragraphs. FIG. 10 shows a detailed sequence of steps for fabricating and releasing a dense lithographically pre-assembled monolayer (Litho-PAM) of mobile shape-designed tiles, according to an embodiment of the present disclosure. The steps (side views) are used to create the 2D Brownian Penrose P2 system of kite and dart tiles. The tiles, which are composed of crosslinked polymeric SU-8 photoresist, are released from the glass wafer using a release solution-dispersion (RSD) that contains a release agent (TMAH) for dissolving the Omnicoat release layer as well as a depletion agent (nanoscale poly-styrene spheres) that strongly inhibits tiles from leaving the monolayer as a consequence of Brownian excitations.

Mask Design of a Desired Complex Pre-Assembly of Custom-Shaped Tiles.

Microscale kite-shaped and dart-shaped prismatic tiles are fabricated out of epoxy-based negative photoresist SU-8 (manufactured by Microchem Inc.), and these tiles are spatially and orientationally organized prior to release using the following top-down photolithography process. A quartz-chrome lithographic mask of kite and dart tiles, based on the Penrose P2 kite-and-dart quasi-crystalline pattern, is designed at a desired tile area fraction of $\phi_{A,des}$. Each kite is a convex quadrilateral having two adjacent sides of designed shorter length $C_{des}$ and two adjacent sides of designed longer length $D_{des}$, where a 144 deg. interior angle is between the two shorter sides and the other interior angles are 72 deg. (see FIG. 1A, scanning electron micrograph (SEM) inset). The ratio of two side lengths, $D_{des}/C_{des}$, is the golden ratio (i.e. 1.618). Each dart is a concave quadrilateral having side lengths $C'_{des}$ and $D'_{des}$, which are nearly the same as $C_{des}$ and $D_{des}$ of the kites, and four interior angles: 216 deg. (concave vertex), 72 deg. (convex vertex opposite the concave vertex), and two 36 deg. (convex vertices at the two sharp tips) (see FIG. 1C, SEM inset). A P2 quasi-crystalline pattern containing $\approx 10^6$ kite-and-dart tiles is digitally designed using lithographic layout software (L-Edit, Tanner Research, Inc.). An idealized P2 pattern is generated with thin lines, and subsequently these lines are thickened to determine vertices of the tiles at $\phi_{A,des} \approx 0.78$. The edges of these kites and darts are then identified as residing just inside these thickened lines, and coordinates of their vertices are obtained. The shorter and longer side lengths of the kites are designed to be 31.3 μm and 50.7 μm, respectively, on the quartz-chrome mask. After 5× reduction stepper optical lithographic printing, these mask dimensions lead to ideal edge lengths C≈6.2 μm and D≈10.1 μm of the prismatic SU-8 kite particles. The shorter and longer side lengths of the darts are designed to be 29.4 μm and 47.6 μm, respectively, on the mask, leading to C'≈5.8 μm and D'≈9.5 μm of the prismatic SU-8 dart particles. The overall lateral dimensions of the SU-8 tiles have been chosen to ensure that diffraction during the UV printing process does not cause them to become irreversibly bonded together through unwanted crosslinking in the spaces between them when printed at high densities. The separation between the printed SU-8 tiles at $\phi_A \approx 0.78$ is uniformly ≈1.2 μm, which is about 4 times the minimum feature size that can be printed by the particular UV stepper which we have used. Thus, although our pre-assembled pattern of kite and dart tiles is inspired by the classic P2 construction that involves infinitesimally thin lines, it is distinguishably different, since our new variation of this classic pattern of lines enables us to set $\phi_{A,des}$ and determine the vertices of all constituent kite-and-dart tiles in a well-defined manner. In order to confine these mobile kite and dart particles and to maintain a fixed $\phi_A$ after release, we have designed large millimeter-scale pentagonal-shaped confining walls. Each confining wall has a lateral thickness of about ≈100 μm and an inner edge length of ≈2 mm, making contact with the outermost confined Penrose tiles. This confining boundary can also be made out of SU-8 photoresist and is printed together with the particles in the same exposure step.

Lithographic Production of a Desired Complex Pre-Assembly of Custom—

Shaped Tiles. To observe the Penrose kite and dart particles before, during, and after release, we use a transparent glass wafer as a substrate, and we record in-situ time-lapse images using bright-field transmission microscopy. As illustrated in FIG. 10, a clean glass wafer (4 inch diameter, 500 μm thick, borosilicate) is pre-baked on a hot plate at 200° C. for 3 minutes to remove adsorbed moisture from its surface and is then cooled to 25° C. Although other smooth substrates can be used (e.g. silicon wafers), a glass wafer is chosen as a substrate to facilitate visualization of the monolayer using an inverted optical microscope and also because glass becomes negatively charged in the aqueous basic solution used in a subsequent step for releasing tiles (so anionically stabilized tiles will not stick rigidly to the glass surface). Onto this glass wafer, a sacrificial release layer of Omnicoat (Microchem Inc.) is spin-coated using a spin-coater (Headway Research Inc., PWM32 Spinner, 500 rpm for 5 s with acceleration 100 rpm/s; 3000 rpm for 30 s at acceleration 300 rpm/s), yielding an optically transparent thin layer having a thickness of about 10 nm after baking at 200° C. for 1 minute and then cooling to 25° C. Subsequently, a layer of SU-8-2002 (Microchem Inc.) negative photoresist is spin-coated on top of the Omnicoat layer and then baked at 95° C. for 90 s, yielding an optically transparent solid, yet uncrosslinked, layer of SU-8 that is 2 μm thick after cooling to 25° C. This coated wafer is exposed to patterned UV light (365 nm, typical energy dose 180 mJ/cm$^2$) through the designed photomask (Digidat Inc., 150 mm×150 mm×6.25 mm, chrome on quartz) in a lithographic stepper (ASML, PAS 5500/200, 5× reduction, Hg i-line). The substrate (e.g., glass wafer) along with the sacrificial release layer (e.g. Omnicoat layer) deposited on the substrate and the particle material (e.g., SU-8 photoresist) form a composite structure. In some embodiments, the composite structure can include more layers. In an embodiment, the substrate can be a monolithic material or can have a layered or other structure.

The printing job routine on the stepper yields 14 evenly separated identical dies containing Penrose kite-and-dart SU-8 particles within confining boundaries. These dies are evenly distributed on the wafer and separated by ≈18 mm. The patterned UV light produced by the stepper triggers crosslinking of the oligomeric epoxy SU-8 photoresist, and this wafer is baked post-exposure at 95° C. for 75 s to enhance the rate of cross-linking reactions. After cooling to 25° C., this post-exposure baked wafer is submerged in organic SU-8 developer (1-methoxy-2-propyl acetate, Microchem Inc.) for 4 minutes to remove the uncrosslinked SU-8, rinsed with isopropyl alcohol to wash away any residual developer on the wafer, and dried using a nitrogen gas stream. The result is a set of prismatic kite and dart Penrose particles in a P2 pattern. These particles are bound to the Omnicoat release material on the wafer, yet they are entirely disconnected from each other, despite the high particle area fraction. To achieve this, the energy dose and post-bake duration for SU-8 is adjusted as described above, optimizing this lithography process for transparent glass wafers. The release process is designed so that the thin Omnicoat release layer dissolves in an aqueous solvent rather than the organic developer (i.e. cyclopentantone) for the SU-8 resist layer, so unexposed resist can be removed through development, and the resulting SU-8 particles can be released independently. The thickness of the layer of release material is kept to a minimum (≈10 nm) that still provides full release of all tiles yet minimizes the amount of dissolved release material in the solution-dispersion and associated fluid flows due to concentration gradients. Transmission optical microscopy through the glass wafer in an inverted imaging configuration provides better quality images of the SU-8 particles, by comparison to reflection optical microscopy of the particles through a thicker layer of solution above an absorbing and reflecting silicon wafer limited range of actual printed yet. The actual printed $\phi_A$ of SU-8 Penrose tiles, having the same spatial P2 arrangement defined in the mask, can also be adjusted over a limited range near $\phi_A$,des by tuning the exposure's energy dose through the stepper and also through adjustment of post-exposure baking conditions.

Releasing Pre-Assembled Custom-Shaped Tiles to Form a Fluctuating Brownian Monolayer.

To obtain large areas of stable fluctuating particles in a monolayer, controlling their release is needed. If the release occurs too rapidly, then concentration gradients of the release material can drive discrete particles out of the monolayer, leading to undesirable vacancies and defects in the overall structure. The composition of the release solution may also play a role, and including a stabilizing agent, to prevent irreversible aggregation of the SU-8 tiles, as well as a depletion agent, to overcome vertical entropic excitations and keep tiles in the monolayer, is typically used.

As illustrated in FIG. 10, after development of the SU-8 photoresist, yet prior to release, around each die on the dry glass wafer, a solid square-frame enclosure of four elastomeric polydimethylsiloxane (PDMS) walls is built. The purpose of these PDMS walls is to confine a dissolving solution that is added later to release the SU-8 particles. First, a solid disk-like layer of PDMS elastomer that is about 3 mm thick and 5.5 cm diameter in a small petri dish is made. Then, the disk-like layer is cut into a square frame (inner edge length 1.3 cm, lateral wall thickness 0.2 cm). This square frame is then removed from the petri dish, and is attach to the glass wafer surrounding the die of SU-8 particles. To make the disk-like layer of PDMS, a polydimethylsiloxane PDMS elastomer is mixed with its curing agent (Sylgard 184, weight ratio 10:1 of elastomer: curing agent) on a clean petri dish, gradually de-gas the PDMS at 25° C. for 12 hours. The petri dish is then placed in a vacuum oven at 80° C. for 2 hours to remove any remaining entrapped bubbles and to cure the PDMS. Prior to attaching the polydimethylsiloxane (PDMS) walls to the glass wafer, the Omnicoat layer is removed outside of the die region using a cotton-tipped applicator soaked in release solution. These PDMS walls form a water-impermeable bond with the glass wafer around a given die, and the bonded PDMS square frame and glass wafer effectively form a chamber (i.e. polydimethylsiloxane PDMS well) into which a release solution-dispersion (RSD) can be loaded. An adequate volume of the RSD is placed in contact with the developed SU-8 tiles attached to the release layer, so that components in the solution-dispersion are in excess and not consumed. A cover slip is placed on top of the PDMS walls and in contact with the solution-dispersion to inhibit evaporation of the solution-dispersion and to prevent convective flows during and after the release process. Inside these PDMS walls, the lithographically constructed SU-8 walls confine the particles to a fixed A. The size and location of these PDMS walls can be chosen to effectively anchor the SU-8 walls to the glass wafer. In an embodiment of the present invention, the release solution-dispersion (RSD) is made by dissolving TMAH and SDS into water and then mixing this aqueous solution with an aqueous dispersion of anionically stabilized polystyrene nanospheres.

To release the kite-and-dart tiles slowly and yet preserve their pre-assembled organization in the monolayer without introducing strong in-plane attractions between them, an aqueous RSD is formulated to contain a basic release agent (tetramethylammonium hydroxide, TMAH, Sigma-Aldrich, 1% w/v) which dissolves Omnicoat, a stabilizing agent (sodium dodecyl sulfate, SDS, MP Biomedicals, ultrapure, 10 mM) which prevents irreversible aggregation of released SU-8 particles, and a depletion agent (carboxylate stabilized, surfactant free polystyrene spheres, Magsphere Inc., 52 nm diameter, 1% w/v solids) which strongly inhibits released SU-8 particles from being entropically excited normal to the surface of the glass and out of the monolayer. As illustrated in FIG. 10, the PDMS well is filled completely with this release solution-dispersion, and a cover slip is immediately placed over the filled PDMS well to reduce evaporation, which can lead to undesirable convection. As SU-8 particles are released, anionic dodecyl sulfate ions adsorb onto their surfaces, thereby providing stabilizing screened-charge electrostatic repulsions and preventing irreversible aggregation of these particles when they collide with each other in the monolayer. The depletion agent induces a roughness-controlled depletion attraction (RCDA) that causes a preferential attraction of a face of each SU-8 particle towards the flat smooth surface of the glass wafer, whereas in-plane attractions between rougher edges of particles are small compared to $k_B T$. The concentrations of SDS, the depletion agent's diameter and volume fraction, the thickness of the SU-8 particles, and the type and thickness of sacrificial layer are optimized to keep all released kite-and-dart particles in the monolayer for an extended period of time (i.e. at least several days). Because rapidly dissolving the Omnicoat can drive undesirable fluid flows that cause tiles to lift off vertically out of the monolayer, the TMAH concentration is adjusted so that tiles release gradually. Moreover, the size and volume fraction of the depletion agent have been set to ensure that each tile experiences a strong facial depletion attraction with the smooth glass substrate that is substantially larger than thermal energy $k_B T$, where T 298 K is the temperature, yet in-plane depletion attractions with other tiles are much smaller, since the edges of tiles are rougher than the faces. The walls of the PDMS well are designed to be tall enough (i.e. 3 mm high) to keep any residual convection near the cover slip away from the monolayer, suitable for time-lapse imaging over many days.

High Resolution Time-Lapse Particle Imaging by Optical Brightfield Transmission Microscopy.

After filling and covering the PDMS well, in-situ images are taken before, during, and after particle release using an inverted brightfield microscope (Nikon Eclipse TE2000)

equipped with a 20× objective lens (NIKON CFI60 Plan Achromat, 0.4 numerical aperture), a 10× objective lens (NIKON Plan Achromat, 0.25 numerical aperture), and a Nikon D5000 camera (4288 pixels×2848 pixels, silent mode). The image contrast and resolution are sufficiently large that even for the lower power 10× objective, each particle's position and orientation can be readily seen over the entire field of view. Individual images showing a fixed region of Penrose tiles are taken at a rate of one frame every 60 s over using a computer-automated camera control system.

Measuring Area Fractions of Penrose Tiles.

The interiors of all tiles in an optical micrograph are filled with colored pixels using an edge-detection routine (i.e. paint bucket fill tool) in Photoshop, and a first estimate of the area fraction is determined by counting these colored pixels and dividing by the total number of pixels. The area fraction of tiles from optical micrographs prior to release is $\phi_{A,OM}$=0.677±0.009. This value is ≈13% lower than the designed area fraction of 0.78 on the mask due to optical diffraction during the lithographic printing process and to the dose-response of the SU-8 photoresist. To convert this first estimate into better estimate of the actual measured area fraction, we next use a high resolution SEM image, which does not suffer from optical diffraction, to determine the area fraction of tiles, measured at their upper surfaces, $\phi_{A,SEMtop}$. A SEM image (magnification 1000×) of the tops of pre-assembled SU-8 tiles after lithographic exposure and development gives $\phi_{A,SEMtop}$=0.684±0.003. The ratio given by $\phi_{A,SEMtop}$ divided by $\phi_{A,OM}$ is a correction factor $f_{SEMtop\text{-}OM}$=1.01 corrects the uncertainties resulting from optical diffraction and edge of particles in the optical microscopy micrographs.

Since the SEM images of particles before release can only provide areas of the tops of the tiles, these images cannot reveal protruding features on the sides of the particles that are edge roughness, a natural consequence of the photolithographic exposure and development processes. However, such edge roughness can affect the steric interactions between adjacent tiles. To provide a measured area fraction that could be best compared to simulations of tiles that have hard interactions that could potentially be made, we use side or oblique SEM imaging of tiles that have been purposefully lifted off of the substrate following release to estimate the average edge roughness (≈180 nm). From these SEM measurements, we determine a correction factor of the area fraction as a consequence of this edge roughness to be $f_{ER}$=1.13. Combing these two correction factors, one from image analysis of optical micrographs and the other from the roughness of particles, the reported measured area fraction, $\phi_A$, can be determined from the filled tiles in the optical micrographs: $\phi_A = f_{SEMtop\text{-}OM} \cdot f_{ER} \cdot \phi_{A,OM}$. Thus, $\phi_A$ values that we report include all corrections for low-dose energy exposure, blurring caused by optical diffraction, and the roughness on the edges of the tiles. So, the reported $\phi_A$ represents a best estimate of the area fraction of tiles that can potentially be compared to future simulations of Brownian kite and dart tiles arranged into Penrose P2 patterns.

Fourier Transforms of Microscope Images Containing Filled Kite and Dart Tiles.

Measured images in 24-bit RGB color are converted to unsigned 8-bit grayscale and then cropped into a square region of 2048 pixels×2048 pixels. To enhance contrast in an image, the interiors of kite-and-dart particles are filled with black and regions outside the particles are filled with white in Photoshop. ImageJ is used to perform a 2D Fast Fourier Transform (FFT) of these black-and-white images, yielding intensity and phase. The FFT intensity is displayed using a color lookup table (C-LUT) to convert grayscale intensity values to colors. In some cases, several FFT intensities of images taken at different times are averaged together in order to create a time-averaged FFT.

Fitting Azimuthally Varying Intensities of Rays and Peaks in Fourier Transforms.

In FIG. 2I, the ψ-dependent azimuthal intensities (i.e. azimuthal line shapes) of rays at high q are fitted using a single Gaussian function with a constant background: $I(\psi)=I_0+I_h \exp[-(\psi-\psi_p)^2/(2\psi_\sigma^2)]$, where $I_0$ is the background intensity, $I_h$ is the peak intensity relative to $I_0$, $\psi_p$ is the peak angle, and $\psi_\sigma$ is the standard deviation in angle (i.e. effective azimuthal width of a ray). A fit to the data in FIG. 2i before release yields $I_0$ ($10^9$ arb. units)=1.48±0.13, $I_h(10^9)$= 11.5±0.3, $\psi_p$=50.6±0.1 deg, and $\psi_\sigma$=2.6±0.1 deg with a correlation coefficient $R^2$=0.996. A fit to the data in FIG. 2i after release yields $I_0$ ($10^9$)=0.45±0.09, $I_h$ ($10^9$)= 1.70±0.11, $\psi_p$=50.5±0.3 deg, and $\psi_{\sigma 1}$=5.4±0.5 deg with a correlation coefficient $R^2$=0.977. Thus, entropic fluctuations after release cause a noticeable increase in the width and decrease in the central intensity of the rays at high q.

In FIG. 2J, corresponding to the FT before release, the azimuthal line shape at lower q is semi-empirically fitted using a double Gaussian function: $I_0+I_{h,1} \exp[-(\psi-\psi_p)^2/(2\psi_{\sigma 1}^2)]+I_{h,2} \exp[-(\psi-\psi_p)^2/(2\psi_{\sigma 2}^2)]$, obtaining $I_0$ ($10^{11}$)=1.76±0.18, $I_{h,1}$ ($10^{11}$)=8.2±1.6, $\psi_p$=50.7±0.1 deg, $\psi_{\sigma 1}$=1.03±0.21 deg, $I_{h,2}$($10^{11}$)=5.5±1.6, and $\psi_{\sigma 2}$=3.18±0.53 deg with a correlation coefficient $R^2$=0.996. The double Gaussian function may be necessary to fit the high Bragg-like peak. A single Gaussian function cannot adequately capture this sharp peak. In FIG. 2J, after release, the sharp peak has disappeared, and so we fit the azimuthal line shape at low q using only a single Gaussian function: $I_0+I_h \exp[-(\psi-\psi_p)^2/(2\psi_\sigma^2)]$, yielding $I_0$ ($10^{11}$)=0.46±0.19, $I_h(10^{11})$=1.72±0.18, $\psi_p$=51.2±0.4 deg, and $\psi_\sigma$=6.8±1.0 deg with a correlation coefficient of $R^2$=0.96. Thus, the very sharp, Bragg-like nature of this peak has dramatically changed as a consequence of the entropic fluctuations of the kite and dart tiles in the Brownian P2 system.

Tracking Positions and Orientations of Darts in a Pentagonal Star-Dart Motif.

We have written a customized particle tracking routine in Mathematica (Wolfram Research, version 11.2) to track the centroids and pointing directions of five darts in a fluctuating pentagonal star-dart motif (PSDM), thereby revealing the local symmetry breaking configurational fluctuations of this motif caused by Brownian excitations (see Extended Data shown in FIG. 9A-9D). This routine thresholds, binarizes, and fills the five central dart tiles. A combination of Morphological Components, EdgeDetect, and ImageCorners functions are employed to calculate the centroids of and to locate the three convex vertices of each of the five darts. The centroids are sorted counterclockwise and connected as vertices to form a convex pentagon (blue lines), the area and internal angles of which are computed in each frame. The centroids and convex vertices are used to calculate the pointing directions of the darts (red arrows displayed at vertices). To correct for a slight long-time drift in the trajectories of the darts, we determine an average position of the centroids of all five darts in each frame, and then the individual trajectories of the darts are calculated relative to this collective frame (see Extended Data shown in FIG. 9B). These trajectories exhibit an anisotropy reflecting the underlying five-fold nature of the PSDM. Because a PSDM has more highly corrugated edges, it is more strongly coupled rotationally to the surrounding tiles as compared to a PSKM, so it does not exhibit collective rotational hopping motion observed for a PSKM.

FIG. 9A shows filled and thresholded optical micrographs of darts in individual video frames (frame number in upper right) are overlayed with blue pentagons having vertices at the centroids of the darts, according to an embodiment of the present disclosure. Red arrows at the vertices of the blue pentagon denote pointing directions of the darts. The shapes of the blue pentagons fluctuate over time and at any given instant can deviate significantly from a regular pentagon as a consequence of Brownian excitations of the P2 system. Actual time between frames is 720 s. Scale bar in the first frame is equal to 3 μm. FIG. 9B shows trajectories of the centroids of five darts in a PSDM over a duration of 32 h after correcting for a slight long-time drift of the entire motif, according to an embodiment of the present disclosure. The time-average position of each dart is denoted by a plus overlayed on each trajectory. The center of the PSDM is given by crossed box symbol at the center. These trajectories have non-circular shapes, indicating that the bounded Brownian motion of the darts is anisotropic, reflecting the local five-fold time-averaged QC symmetry of the motif. Considering an ensemble average over all five darts, standard deviations of step size distributions projected along directions between the center of the motif and the time-averaged centroids of the five darts are 1.3±0.2 times less than standard deviations of step size distributions projected perpendicular to these five directions. This small yet detectable anisotropy in the bounded diffusion of the darts that reflects the underlying time-averaged five-fold symmetry of their local QC environment. The scale bar in FIG. 9B is equal to 3/m. FIG. 9C shows a normalized probability distribution of the calculated area, $A_{PSDM}$, of fluctuating blue pentagons connecting centroids of darts in the PSDM shown in in FIG. 9A, according to an embodiment of the present disclosure. The black line is a fit of the points using a log-normal distribution. FIG. 9D shows a normalized probability distribution of the calculated internal angles, $\beta_{PSDM}$, of fluctuating blue pentagons connecting centroids of darts in the PSDM shown in FIG. 9A, according to an embodiment of the present disclosure. The black line is a fit of the points using a Gaussian distribution.

Calculations and Fits of the Distributions of Areas and Internal Angles of Fluctuating Pentagonal Star-Dart Motifs.

The normalized probability distributions are calculated based on the recorded set of areas and internal angles of the pentagons connecting the centroids of darts using all frames in FIG. 9A. These results are displayed in FIGS. 9C and 9D, respectively. Because five darts cannot be compressed below a limiting area corresponding to them touching, the distribution of area, $p_{A,PSDM}$, is asymmetric and exhibits a strict cut-off at low areas, so we fit it using a 3-parameter normalized log-normal distribution (here to simplify notation, we take $A=A_{PSDM}$):

$$p_A = \frac{\exp\{-[\ln((A-A_0)/\delta A)]^2/2\gamma^2\}}{\sqrt{2\pi}\,\gamma(A-A_0)}$$

for $A > A_0$, and $p_A = 0$ for $A \leq A_0$.

The results of the fit are displayed in Extended Data in FIG. 9C as the black line, and the values of the fit parameters obtained are: $A_0=52\pm7$ μm², $\delta A=22\pm7$ μm², and $\gamma=0.17\pm0.05$ (correlation coefficient $R^2=0.994$). Thus, the PSDM exhibits significant area fluctuations caused by Brownian excitations, reflecting local equilibrium density fluctuations of this particular motif within the P2 QC system. These Brownian excitations also lead to local symmetry-breaking fluctuations of the PSDM as revealed by the differently shaped blue pentagons in Extended Data shown in FIG. 9A. Overtime, these fluctuating blue pentagons exhibit interesting distortions away from a perfect regular pentagon. To quantify these distortions, we calculate the normalized probability distribution of internal angles, $p_{\beta,PSDM}$, of this fluctuating blue pentagon (see Extended Data shown in FIG. 9D). This distribution is fit using a Gaussian function, yielding a mean of 69.3 deg. and a standard deviation of 17.5 deg ($R^2=0.99$). A direct calculation using the unbinned list of internal angles gives similar results of a mean of 72.0 deg and a standard deviation of 15.9 deg, irrespective of binning parameters used to create the distribution. Thus, the time-averaged configuration of darts within a PSDM does reflect the basic five-fold symmetry of this motif through the mean internal angle of 72 deg, corresponding to a regular pentagon. Nevertheless, Brownian excitations cause large local symmetry-breaking fluctuations in the instantaneous configurations of dart tiles about this symmetric mean, leading to a relatively large and readily observable standard deviation in the distribution of these internal angles.

Melting Kite Motifs and Dart Motifs in a Brownian P2 Quasi-Crystal.

In FIG. 4A-4I, the measured $\phi_A(d)$ is fit using a modified Fermi-like function to capture the evolution of diffusive dynamics associated with melting as the Brownian P2 QC expands to occupy empty space after removing a confining wall. This function can be expressed as: $\phi_A(d)=\phi_A^*/(1+\exp[(d-d_0)/L])$, where $\phi_A^*$ is a plateau area fraction in the dense region (to the left), $d_0$ is a reference distance that roughly defines the position of the melting front, and L is a characteristic length scale associated with the width of the melting front. Similar Fermi-like fitting forms are used to fit data for the d-dependent area fractions of pentagonal-star-kite motifs, $\phi_{A,KM}$, and pentagonal-star-dart motifs, $\phi_{A,DM}$. All fitting parameters for $\phi_A$ (FIG. 4D), $\phi_{A,KM}$ (FIG. 4E), and $\phi_{A,DM}$ (see FIG. 8), as a function of time after release, t, are shown in Table 1.

Determining the Area Fraction Associated with Melting of the Brownian P2 Quasi-Crystal.

In FIG. 4I, all data for $\phi_{A,KM}(\phi_A)$ satisfying $\phi_{A,KM}>0$ are fitted to a linear function having a slope and an intercept with the $\phi_A$ (i.e. horizontal) axis. The slopes of $\phi_{A,KM}(\phi_A)$ for 24, 48, and 60 h after release are 1.30±0.04, 2.26±0.14, and 2.42±0.53, respectively, and the intercepts with the $\phi_A$-axis are 0.544±0.006, 0.633±0.004, and 0.647±0.009, respectively. At t=48 h and t=60 h after release, these intercepts are approximately the same within the uncertainties, so we estimate that the melting point of the P2 quasi-crystal is at $\phi_{A,melt}\approx0.65\pm0.02$. While this value is associated with the melting of pentagonal-star-kite motifs, larger scale superstructures of motifs become ill-defined when the fundamental motif structures become disorganized.

Immediate Melting of P2 Kite and Dart Tiles at a Lower Area Fraction. We have also pre-assembled kite and dart tiles at a uniformly lower area fraction $\phi_A\approx0.53$ by creating even larger spaces between adjacent tiles in a Penrose P2 pattern via mask design, yet still enclosing all tiles by large confining walls. As the kite and dart tiles are released after adding the solution-dispersion, the P2 pattern melts and becomes a disordered liquid-like phase, since the tiles have more empty space in which they can rotate and translate, even as they stay in the monolayer. This immediate melting behavior at uniform $\phi_A \approx 0.53$ is consistent with the higher melting area fraction $\phi_{A,melt} \approx 0.65 \pm 0.02$ that we have determined from the unconfined Brownian P2 system of SU-8 tiles. Although specific tile area fractions have been designed into the mask patterns, the area fraction of SU-8 tiles printed using a particular designed pattern can be reduced by lowering the exposure dose in the stepper down to as low as 150 mJ/cm$^2$. At lower doses, the crosslinking within the SU-8 tiles becomes significantly compromised and vertex rounding becomes extreme. This additional limited control over the area fraction of tiles at the printing stage using the stepper's exposure can potentially be useful since it can eliminate the need to design a new mask pattern.

Additional Discussion.

Although different top-down lithographic methods are used herein to produce a wide variety of custom shape-designed colloidal particles, these processes typically yield stable bulk dispersions of desired shapes in a liquid. Subsequently, these shapes have been used in depletion-driven and capillary-driven self-assembly experiments, providing new insights into how features in the shapes of particles can influence self-assembly. For instance, lithographic mutations of sub-particle features of colloidal chiral C-shapes that resemble proteins, known as proteoids, have been used to control the entropic hierarchical self-assembly of dimer crystals under slow crowding in 2D as roughness controlled depletion attractions keep the fluctuating monolayer intact. Nevertheless, the sizes of crystallites of such self-assembled structures are typically small, and a high defect density often accompanies this type of self-assembly. Although these studies have provided important scientific insights into the role of core shape and entropy in self-assembly of gradually crowded systems, including protein crystallization, these limitations have precluded the widespread use of such self-assembled structures. By contrast, using Litho-PAMs, once can produce and study complex fluctuating multi-scale systems of mobile Brownian tiles at high tile densities as we have demonstrated using optical stepper lithography and optical microscopy. Thus, present pre-assembly of Litho-PAMs is very different than prior 2D self-assembly experiments in which monolayers of shape-designed lithographic colloids have been randomly deposited at dilute area fractions in a monolayer and subsequently concentrated slowly using gravitational sedimentation in the presence of roughness-controlled depletion attractions. The tilted-cell approach has created a gradient in particle area fraction throughout; by contrast, Litho-PAMs provides a uniform area fraction over a very large surface area. Thus, pre-assembly at uniform $\phi_A$ avoids potential issues of out-of-equilibrium jamming during crowding as well as spatial gradients in $\phi_A$ that have been inherent in the tilted-cell method of 2D self-assembly.

Achieving a monolayer of fluctuating Brownian kite and dart tiles in Penrose's P2 QC pattern that is defect-free over large areas and in which single-particle as well as multi-particle collective dynamics can be readily visualized advances the experimental science of mobile multi-scale complex systems. Moreover, this achievement demonstrates that new equilibrium phases composed of many differently shaped and configured building blocks can be readily produced using top-down parallel fabrication methods, thereby circumventing bottom-up self-assembly methods and also serial directed assembly methods. For systems that can have degenerate ground states with the same free energy yet different polymorphic organizations of tiles, Litho-PAMs even enables the creation and study of different individual ground-state configurations. Such degeneracy would usually preclude simple self-assembly methods from producing different desired ground-state configurations, since different ground-state polymorphs having essentially the same energy would nucleate and grow in different local regions.

Until now, attempts to create a large-scale fluctuating Penrose QC of mobile Brownian colloidal tiles, which are organized with 5-fold symmetry and which have effectively hard interactions, have not succeeded. While a report of a soft-matter QC of nanoparticles which were crowded through evaporation has been made previously, the crystallites in this self-assembled QC were limited to 12-fold and 18-fold symmetry. Even after this report, the unusual and striking 5-fold symmetry of Penrose's P2 QC has remained elusive, and no experimental assembly method has yet been able to produce a large-scale fluctuating colloidal version of it that can be observed in real-space with particle-scale resolution until the present invention. Even if in principle a Brownian Penrose QC can be self-assembled by introducing selective site-specific edge-edge interactions among the tiles, as has been proposed and investigated in simulations, no experimental realization of this has yet been made, most likely because of the significant complexity in creating the required variety of selective edge-edge interactions on real particles. By contrast, the present pre-assembly approach of Litho-PAMs overcomes these significant limitations, and has enabled us to produce a fluctuating P2 QC of differently shaped Brownian tiles having 5-fold symmetry at high densities in a single 2D large-area domain. Moreover, we have visualized the equilibrium fluctuations of this Brownian P2 QC at high tile densities, including heterogeneous collective dynamics of certain motifs, as well as melting by slowly lowering the tile density. Our ability to observe mobile tiles fluctuating in equilibrium using optical microscopy has enabled us to identify the hallmarks of the pentatic liquid quasi-crystalline (LQC$_5$) phase of matter, analogous to the fluctuating hexatic phase of mobile hard disks subject to Brownian excitations, and this provides important in situ dynamic information that cannot be obtained by studying a static solid film of nanoparticles using electron beam microscopy after evaporating the continuous liquid phase.

Interesting fundamental questions about spatio-temporal dynamics arise when considering complex multi-scale materials composed of mobile building blocks, such as the P2 kite-dart system. Traditional models of phase behavior and equilibrium fluctuations, such as Onsager-like cage models, do not necessarily transfer over to multi-scale systems that have a great variety of dynamic fluctuating motifs and patterns that can be hundreds or more times in overall size compared to the smallest particles. Understanding equilibrium and non-equilibrium dynamics of multi-scale systems that have differently organized structures at different length scales, including those well beyond the colloidal scale, remains an interesting and challenging frontier both theoretically and experimentally. For example, directly applying the notions of Kosterlitz-Thouless (KT) theory to a fluctuating P2 quasi-crystal is a challenging problem, yet based on our observations the notions of KT theory when applied to fluctuating quasi-crystals are likely to show the emergence of liquid crystalline like features in correlation functions and order parameters at smaller length scales for values of $\phi_A$ in between the disordered liquid state at low $\phi_A$ and the full-tiling limit as $\phi_A \to 1$. Just as disks can form a hexatic liquid crystal phase over a certain range of $\phi_A$, our observations indicate that liquid-crystal like modulations in the FTs develop for fluctuating Brownian P2 quasi-crystals at intermediate wavenumbers. Yet, we also find that the degree of fluctuation-induced smearing of QC Bragg peaks at the smallest wavenumbers q, corresponding to the very largest length scales, is not as large as the degree of fluctuation-induced smearing at intermediate q. These features differentiate the FTs of the fluctuating $LQC_5$ phase from the q-independent perfect Bragg peaks associated with crystallography of ideal static QCs constructed geometrically. The $g_{MSO-PCF}(r)$ that we have developed (see the methods described in the following paragraphs) is a first attempt at quantifying superstructural orientational order in hierarchically organized multi-scale materials in real space, and this concept can be further broadened and generalized. This brings up an important theoretical question for multi-scale materials that can have different symmetries and potentially incommensurate organizational structures at different length scales. What is truly meant by short, intermediate, and long range order? Based on the example of a fluctuating P2 QC, we believe that it may be necessary to correlate the type and degree of order with a range of length scales (or equivalently range of q) in multi-scale materials, possibly also even spatial locations, and a new theory would seek to couple these differently structured regions together self-consistently. Furthermore, a theoretical exploration of melting in hierarchically organized systems of differently shaped fluctuating building blocks, including kites and darts in the fluctuating P2 QC system, would potentially enable a direct comparison with our experimental results of melting. At a first level, such a theoretical exploration could be based around a multi-body free energy that is entirely entropic in origin, by considering the entropy of allowed microstates of positions and orientations of all tiles subject to constraints of non-overlap.

For classic solid-state atomic QCs, the notion of phason strain can be used to explain real-space experimental observations that positions of certain atoms do not conform to a perfect ideal QC structure. To analyze these images, QC tiles are decorated with dots and lines to represent atoms and the bonds between atoms, respectively. Alternative tilings, which are not perfect Penrose QCs and do not follow standard matching rules everywhere but still fill space, can be made with these decorated tiles, thereby creating different local isomorphs. These alternative tilings typically lead to the phenomenon of phason strain when atom and bond decorations in adjacent tiles do not match up. However, in the case of the Brownian P2 QC made using Litho-PAMs, the hard tiles are the fundamental particles, so there are neither atoms nor covalent bonds between constituent tiles. Thus, atomic interpretations of phason strain, which have been used to explain phenomena in solid-state QCs having very strong attractive interactions between constituent atoms, are not directly applicable to these dispersed hard tile systems. Instead, a description of an entirely entropic free energy of the P2 QC hard tile system, derived from an ensemble of allowed positions and orientations of the tiles subject to non-overlap constraints, would be most appropriate for predicting its equilibrium properties and fluctuations. It would be possible to print alternative local isomorphs that do not necessarily follow matching rules for perfect Penrose QCs using Litho-PAMs, but the free energies of these tile systems containing different local isomorphs may effectively be degenerate, since there are no substantial in-plane attractive interactions between the tiles. In the future, Litho-PAMs could be used to introduce purposefully different types of defects in the tilings, such as dislocations and disclinations, and these could have a substantial impact on a free energy of the tiles that is primarily entropic in origin.

It is interesting to consider the motifs and superstructures of motifs that we have identified through configurations of P2 tiles at different scales in light of prior work on coverings and quasi-unit cells. The notion of overlapping decorated decagonal tiles can be a useful method of generating pentagonal quasi-crystalline tilings according to prescribed geometrical rules governing the overlap. The overlapping decagonal systems are called "coverings," to distinguish them from tilings, because non-overlap is typically an accepted requirement of tilings. The notion of maximizing the density of decorated quasi-unit cells can be introduced as a simple yet powerful general method of generating quasi-crystalline tilings. Using this quasi-unit cell approach, it is possible to explain, for example, the formation of $Al_{72}Ni_{20}Co_8$ quasi-crystals observed using high angle annular dark field imaging by Saitoh et al. The C-clusters (i.e. representing an energetically preferred low-energy atomic cluster, implying strong attractive interactions between atoms compared to $k_BT$) of Steinhardt and Jeong's quasi-unit cells are overlapped and when their density is maximized, remarkably a Penrose tiling is produced. Thus, in these prior works, overlap of decagons or of quasi-unit cells are needed to produce quasi-crystalline coverings or tilings. By contrast, the fluctuating Brownian P2 QC system is composed of non-overlapping kite and dart tiles in a monolayer at an area fraction less than unity, so formally this system is neither a covering nor a close-packed tiling (which would correspond to $\phi_A=1$).

As it can be appreciated from the above paragraphs, lithographically pre-assembled colloidal linkages of shape-designed discrete mobile microscale tiles coupled together by lock-and-key sub-particle features that essentially yield hinge-like semi-flexible steric bonds are designed and fabricated. Using anisotropic roughness-controlled depletion attractions, caused by a nanoscale depletion agent in a specialized release solution-dispersion, these linkage tiles are released from a substantially flat, smooth glass substrate and limit their motion to the plane immediately above it. Although in-plane interactions between neighboring linkage tiles are effectively hard, the designed geometries of these lock-and-key linkage particles lead to steric constraints that prevent un-bonding events between interlocked neighbors, yielding long-lived fluctuating Brownian poly-colloids that provide a readily visualized analog of molecular polymers. The versatility of this approach is illustrated by fabricating linear, ring, diblock, triblock, star, brush, and dendritic poly-colloids having desired pre-assembled topologies, configurations, and inherent local curvatures. Extending such linear and quasi-one dimensional designs into two-dimensional designs, fluctuating square, hexagonal, and honeycomb meshes that contain crosslinking linkage colloids which are coupled to more than two neighbors can be formed. Using optical microscopy, the dynamic configurational changes of these poly-colloids caused by Brownian excitations down to the monomer scale can be observed and measured. In addition, poly-colloids having bonds that offer a translational sliding degree of freedom that is atypical of bonds in molecular polymers can be made. Thus, linkage poly-colloids made using Litho PAMs can be used to model fluctuating molecular polymers and also can be designed to have unusual types of bonds that are not present in molecular or other colloidal polymers.

Beyond embodiments of Litho PAMs that yield dense tile-like configurations of non-interlocked polygonal shapes, such as a fluctuating P2 quasi-crystal, it is non-obvious to create a design of a set of discrete lock-and-key shapes that can form such sterically hindered bonds upon release from the substrate. Such systems of interlocking tiles do not require bounding walls, which are typically necessary for Litho PAMs of convex shapes, in order to remain together in a coherent fluctuating assembly over long periods of time.

In an embodiment of the current invention, a discrete lock-and-key particle from among a plurality of lock-and-key particles, which form a lock-and-key configuration comprised of the plurality of lock-and-key particles, contains at least a convex region and also a concave region within the same particle shape of the discrete lock-and-key particle, such that the convex region of a first of the lock-and-key particles is inserted into, but not touching, the concave region of a second of the lock-and-key particles that is proximate to the first of the lock-and-key particle, in an initial lock-and-key configuration of the lock-and-key particles.

In an embodiment of the current invention, a discrete lock-and-key particle from among a plurality of lock-and-key particles, which form a lock-and-key configuration comprised of the plurality of lock-and-key particles, contains at least a convex region and also a concave region within the same particle shape of the discrete lock-and-key particle, such that the convex region of a first of the lock-and-key particles is inserted into, but not touching, the concave region of a second of the lock-and-key particles that is proximate to the first of the lock-and-key particle, in an initial lock-and-key configuration of the lock-and-key particles, wherein the convex region of a first of the lock-and-key particles is sterically prohibited from leaving the concave region of a second of the lock-and-key particles.

In an embodiment of the current invention, we have fabricated a ring-like linkage composed of discrete head-tail lock-and-key colloidal linkage particles. This is effectively a colloidal version of a long-lived ring polymer as a consequence of steric constraints of the convex head of each particle with respect to the concave tail of its neighboring particle, so the convex head remains within the concave tail. Entropic excitations cause Brownian fluctuations of the lock-and-key particles, leading to changes in the configuration of the ring in the plane that result in its shape becoming non-circular.

In other embodiments, because the method of confining the mobile tiles to the monolayer after release is based on a physical mechanism of depletion attractions, the tiles can be composed of hard-solid or soft-solid materials, other than organic crosslinked SU-8 photoresist, that can substantially retain their shapes over time. Examples of other materials include metals, metal alloys, inorganic materials including oxides and nitrides, carbon or carbon-based materials (e.g. graphene and graphene oxide), semiconductor materials, doped semiconductor materials, electrically insulating materials, electrically conducting materials, and ionic crystals.

In other embodiments of the herein invention, the surface roughness on different portions of the surfaces of shape-designed particles can be engineered to enable the use of depletion agents, other than those described in the example we have shown for producing a P2 quasi-crystal of fluctuating tiles, to create anisotropic roughness-controlled depletion attractions.

In other embodiments of the herein invention, other depletion agents that are suitable for use with the herein invention include colloidal polymeric, micellar, droplet, and particulate objects that are readily and stably dispersed in the continuous liquid medium. Such other depletion agents can have non-spherical or fluctuating shapes.

In other embodiments of the herein invention, sizes and shapes of depletion agents, other than the size and spherical shape used to illustrate the Litho-PAMs method with P2 quasi-crystalline arrangement, can also be used. It can be desirable for the size and shape distributions of such objects used as depletion agents to be monodisperse or to have low polydispersity. In other embodiments of the herein invention, released lithographic particles can be stabilized against aggregation by other than an adsorbed surfactant (i.e., other than adsorbed SDS). For instance, the use of non-ionic stabilizers, such as poly-ethylene glycol (PEG), can also provide for non-ionic or steric stabilization of released lithographic particles against aggregation. Moreover, in other embodiments of the herein invention, covalent bonding of stabilizing agents to the surfaces of or to portions of the surfaces of the lithographic particles can be performed before, during, or after release.

In other embodiments of the herein invention, rather than using a depletion agent to confine the monolayer of mobile tiles after release, instead a second upper confining surface can be placed or lithographically manufactured substantially parallel to the first lower confining surface. The separation between the first lower confining surface and the second upper confining surface is chosen to be small enough so that released tiles cannot rotate or translate out of the fluctuating monolayer. In other embodiments of the herein invention, a convex portion of a first shape designed the can be lithographically fabricated substantially inside a concave portion of a second proximate neighboring shape-designed tile, leading to a colloidal linkage between the first shape-designed the and the second proximate neighboring shape-designed tile.

For example, such colloidal linkage may be a circular protuberance portion in the shape of the first shape-designed the that is fabricated inside an annular sector portion in the shape of the second proximate neighboring shape-designed tile, wherein the inner radius of the annular sector portion is larger than the radius of the circular protuberance portion. In other embodiments of the current invention, colloidal linkages between proximate tiles can be arranged in a manner as to yield a fluctuating interconnected one dimensional linear chain or to yield a two-dimensional mesh after release.

Figure 11:
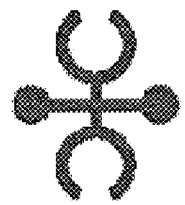
FIG. 11 shows a design of a discrete particle shape that has sub-particle features, such as two convex circular protuberance features and two concave annular sector features, suitable for forming steric colloidal linkages with similarly shaped neighboring particles and suitable for being a component of a 2D square mesh formed, according to an embodiment of the present disclosure.

Example embodiment of a 2D mesh of fluctuating discrete particles that have steric colloidal linkages made using lithographic pre-assembly. FIG. 11 shows a design of a discrete particle shape that has sub-particle features, such as two convex circular protuberance features and two concave annular sector features, suitable for forming steric colloidal linkages with similarly shaped neighboring particles and suitable for being a component of a 2D square mesh formed according to an embodiment of the present disclosure.

Figure 12:
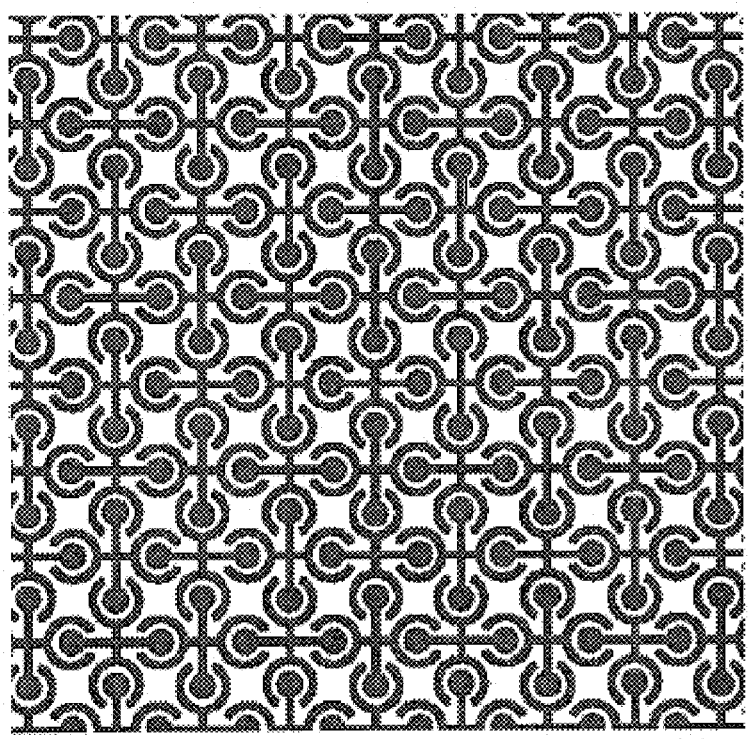
FIG. 12 shows an Example of a designed mask pattern that can be used in an embodiment of the current invention to create a fluctuating pre-assembled square-mesh monolayer composed of a plurality of individual discrete lithographic particles, according to an embodiment of the present disclosure.

FIG. 12 shows an Example of a designed mask pattern that can be used in an embodiment of the current invention to create a fluctuating pre-assembled square-mesh monolayer composed of a plurality of individual discrete lithographic particles, according to an embodiment of the present disclosure. Each lithographic particle has two convex circular protuberance features and has two concave annular sector features that are large enough so that the convex protuberance features can be formed within yet not touching the annular sector features of a proximate neighboring particles. The solid-filled regions represent the shapes of the particles that would be formed after performing an appropriate lithographic process using this mask, and the white regions represent spaces between the particles that would be formed.

Figure 13:
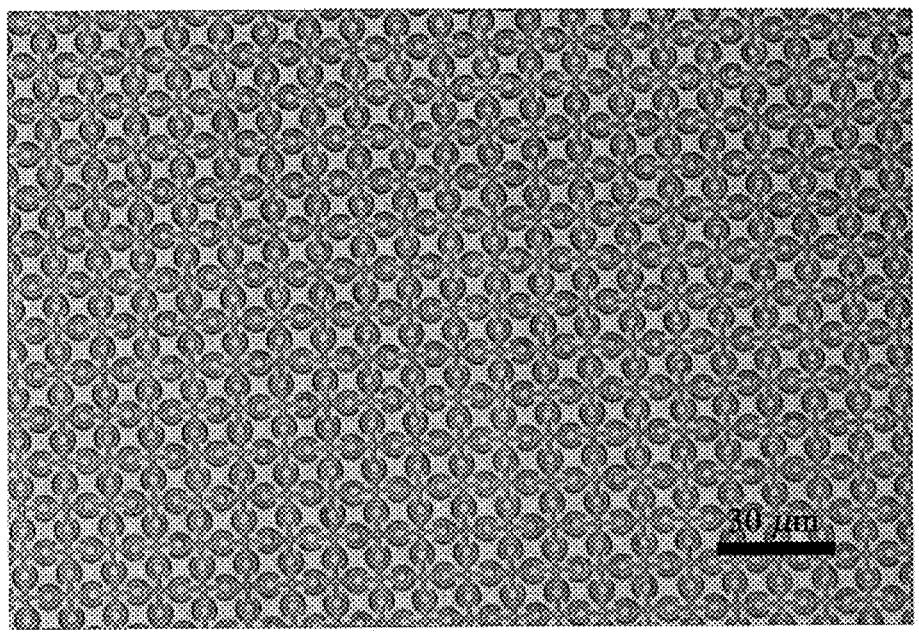
FIG. 13 shows a brightfield optical transmission micrograph of a plurality of individual discrete shape-designed particles composed of crosslinked SU-8 photoresist that have been created using optical stepper lithography, prior to release, according to an embodiment of the present disclosure.

FIG. 13 shows a brightfield optical transmission micrograph of a plurality of individual discrete shape-designed particles composed of crosslinked SU-8 photoresist that have been created using optical stepper lithography, prior to release, according to an embodiment of the present disclosure. The shape-designed particles are still bound to a release layer underneath them (composed of Omnicoat), which has been spin-coated onto a glass wafer. The total spatial extent of the mesh in this demonstrative example is approximately 3.3 mm×5.2 mm (i.e., much larger than the limited field of view shown), although these dimensions could be designed to be much larger. The thickness of each SU-8 particle normal to the image plane is approximately 2 microns.

Figure 14:
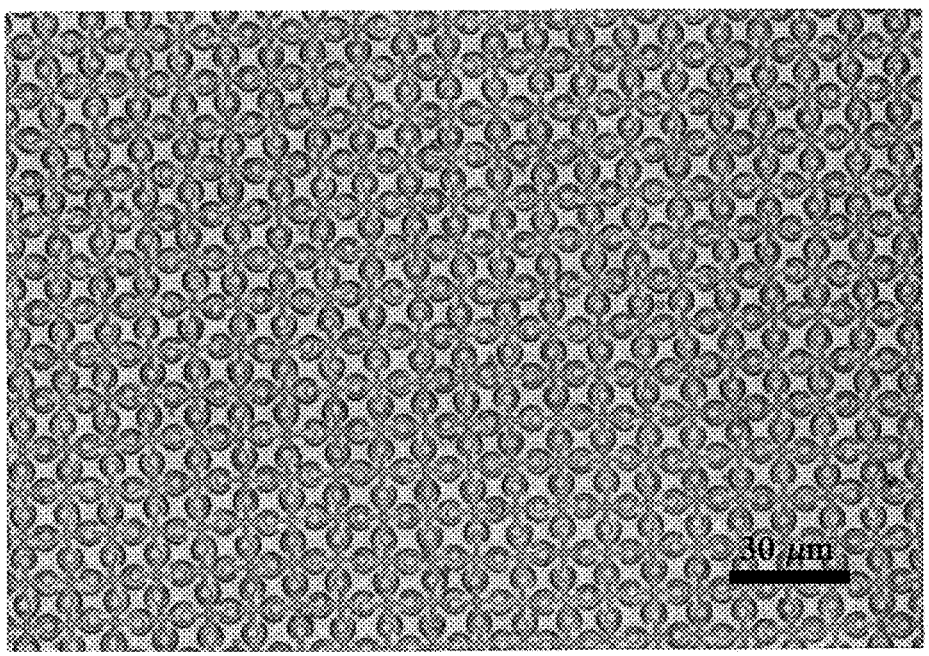
FIG. 14 shows a brightfield optical transmission micrograph of a plurality of individual discrete shape-designed particles composed of crosslinked SU-8 photoresist that have been created using optical stepper lithography (see FIG. 13), taken 48 h after release of these particles using a RSD composition that is substantially the same as has been used to create the fluctuating Penrose P2 quasi-crystal, according to an embodiment of the present disclosure.

FIG. 14 shows a brightfield optical transmission micrograph of a plurality of individual discrete shape-designed particles composed of crosslinked SU-8 photoresist that have been created using optical stepper lithography (see FIG. 13), taken 48 h after release of these particles using a RSD composition that is substantially the same as has been used to create the fluctuating Penrose P2 quasi-crystal, according to an embodiment of the herein invention. Brownian excitations cause these pre-assembled discrete lithographic particles that make up the mesh to fluctuate, so their positions and orientations in this micrograph differ from the exact periodicity in the micrograph before release (i.e. in FIG. 13), yet the overall morphology of this fluctuating mesh is maintained over long periods of time after release despite these excitations. Each colloidal linkage between a given particle in the mesh and a neighboring particle in the mesh permits a range of relative translational and rotational motion of the given particle in the mesh with respect to the neighboring particle in the mesh. The use of confining walls around the mesh is optional since the mesh does not come apart because of the lock-and-key nature of the linkages that have been formed. As designed and pre-assembled, a convex circular protuberance feature of a given particle that is present within a concave annular sector feature of a neighboring particle is sterically inhibited from leaving that concave annular sector feature of that neighboring particle even in the presence of Brownian excitations. This aspect enables the fluctuating mesh to exist without melting even in the absence of confining walls. We note that self-assembling a steric mesh system held together by steric linkages, such as the example in FIG. 14, by slowly crowding an initially dilute monolayer of linkage particles given in FIG. 11 is disallowed because the opening in the concave annular sector feature is not large enough to allow the insertion of the convex circular protuberance feature.

Motif Superstructural Orientational Pair Correlation Function (MSO-PCF).

In structurally complex and hierarchically organized multi-scale materials, readily identifiable local groups of particles (i.e. local polymorphic configurations) can be defined as a distinguishable motif containing a prescribed set of one or more types of building blocks (e.g. particles) in specific relative arrangements, typically that are either densely arranged or even attractively bonded. Motifs can fluctuate and deform away from idealized symmetric configurations as a consequence of thermal fluctuations, but their fundamental relative local structures must be maintained over time in equilibrium and not break up in order for the motif to be a well-defined and enduring thermodynamic entity while the system is in equilibrium with a heat bath at selected temperature T. Motifs can be defined purely through geometric assignment, irrespective of whether or not attractive bonds exist between the building blocks (i.e. individual particles). Thus, motifs can be defined for systems of particles that have hard interactions if they are at large enough densities that the motifs are maintained over time. The center of a particular motif can be identified (e.g. through a mass-weighted approach involving constituent building blocks), and certain motifs can possess an axial orientation or even a pointing direction, depending upon their specific geometries and broken symmetries. In certain systems, motifs can be organized into local superstructural sets, wherein local groups of motifs at different spatial locations within the material have an identifiably similar geometrical configuration. These local superstructural sets of motifs also are fluctuating under thermal excitations, leading to time-varying relative locations of the centers of motifs within a given local set, which can be characterized in terms of a set of time-varying superstructural angles corresponding to that particular local set of motifs.

In certain hierarchically organized materials, motifs are recurring features in a pattern, wherein one motif is surrounded by other similar motifs, such that a particular motif can be identified as a central motif. If this is the case, then a set of superstructural angles at any given instant in time can be defined between the center of the central motif and the centers of the other surrounding motifs. If a set of motifs is symmetrically arranged but lacks a central motif, then the center of the set can be defined by the average center positions of all motifs in the set. We call the angles between the center of a local superstructural group of motifs and a particular exterior motif "superstructural angles", since these angles are defined with respect to the centers of motifs, rather than the centers of individual particles. Also, we refrain from using the terminology "bond orientation" since bonding as a consequence of attractive interactions is not present in systems of hard particles. In other words, the set of superstructural angles of a given local set of motifs is a purely geometrical property of their configuration, not of the degree of enthalpic attractions between constituent building blocks, which is normally associated with bonding. Thus, our definition of motif superstructural angles represents a higher order collective geometrical property as compared to, for example, the traditional "bond orientations" of six individual disks surrounding a central disk in a simple hexatic LC phase. Likewise, the orientational correlations between pairs of sets of motifs, calculated using the superstructural angles in a first set of motifs with respect to the superstructural angles in a second set of motifs, can be examined as a function of the separation r between these motifs to determine if superstructural orientational order is maintained over distances larger than the minimum motif-motif separation. This definition of a higher-order collective geometrical property based on local superstructures of motifs is especially useful when local collective translational or rotational motion of individual particles would potentially indicate orientational disorder, yet hide hierarchical order at larger scales that may persist in equilibrium despite the mobility of some individual particles.

To calculate the motif superstructural orientational pair correlation function, it is necessary to define the motif, which can contain one or more different types of particles. Here, for simplicity, we consider a motif that consists of m particles of the same type (e.g. a pentagonal star made up of m=5 kites). The centers of motifs do not necessarily have to reside inside a physical building-block particle. We define the center of a motif as the mass-weighted average over all of its m particles. Having defined the locations of motifs, we then define a superstructural set of motifs as a local collection of m motifs arranged within a certain local range (e.g. a superstructural set of n=5 pentagonal star motifs around a central pentagonal star motif). The center of a superstructural set is defined as the mass-weighted average over all of its n motifs in the set. Here, if there is a central motif in a superstructural set, we exclude this central motif from the value of n, so n essentially refers to the number of external motifs in the set. By nature of the definitions of motifs and superstructural sets of motifs, we assume m≥2 and n≥2.

To calculate the motif superstructural orientational PCF (MSO-PCF), we define a first set of motif superstructural angles $\{\theta_{a,j}\}$ associated with a first superstructural set of n motifs at an average first motif set position $r_a$, where a is an integer label associated with the first superstructural set of motifs and j is an integer index that ranges from 1 to n motifs within that set. Likewise, we define a second set of n motif superstructural angles $\{\theta_{b,k}\}$ associated with a second superstructural set of n motifs centered at an average second motif set position $r_b$, where b is an integer label associated with the second superstructural set of motifs and k is an integer index that ranges from 1 to n motifs within that set. All angles are defined relative to a direction in the fixed lab frame (e.g. positive x-direction), and each set of angles is defined as an ordered list in a counterclockwise direction from this direction. The spatial separation r between the centers of the first and the second superstructural sets of motifs can thus be defined as $r=|r|=|r_b-r_a|$. Typically, the minimum accessible value of r in this calculation will be significantly larger than the maximum spatial dimension of the constituent particles.

Having defined the superstructural angles at a particular instant in time, we then can calculate the n-fold MSO-PCF by adding up the complex exponentials of the angles multiplied by a symmetry number associated with the number of motifs in a superstructural set:

$$G_n^{MSO}(r) = G_n^{MSO}(|r_b - r_a|) = \left\langle \left| \frac{1}{n} \sum_{l=1}^{n} \exp[in(\theta_{b,l} - \theta_{a,l})] \right| \right\rangle_{\forall a, \forall b > a}, \quad (S1)$$

where the condition b>a in the averaging avoids double-counting the same pair of superstructural sets of motifs. When superstructural sets of motifs possess the same orientation angles (e.g. as in a perfect superstructural crystal or quasi-crystal), then this calculation returns an average value of one that does not decay as r increases. By contrast, if the superstructural sets do not have the same set of angles, then the value of the MSO-PCF is less than one. Typically, for a system experiencing thermal fluctuations, there will be distributions of the superstructural angles which can have significant widths, and this can lead to decays in the MSO-PCF as a function of r. If desired, further averaging can be achieved by calculating the MSO-PCF for a set of discrete time instants and then averaging the results together to obtain a time-averaged MSO-PCF. While some ensemble-averaging is implied in the above equation, a higher degree of ensemble averaging can be achieved by obtaining independent configurational data for an entirely different region in the sample material at identical conditions. Although not explicitly apparent from the simplified notation, the MSO-PCF for a given material can depend on its composition and density.

As an example, we calculate the MSO-PCF of a particular superstructure of motifs in the Penrose P2 QC pattern at times t=24 h, 48 h, 72 h, and 96 h after release and equilibration. A local motif is first defined by m=5 kites, which are arranged into a compact and convex pentagonal star as shown in FIG. 3*d*. In certain instances within the P2 pattern, a central pentagonal-star-kite motifs is surrounded by n=5 external pentagonal stars that are not immediately adjacent (see FIG. 3D). The coordinates of the center of the motif are obtained directly at single pixel resolution from a digital micrograph taken at time t. We define a first set of five superstructural angles associated with an average first motif set position $r_a$ (first set: black circles in FIG. 3D). Likewise, we define a second set of 5 motif superstructural angles at a different average second motif set position $r_b$ using the same procedure (second set: red circles in FIG. 3D). We then use Eq. S1 to calculate a first contribution to $G_5^{MSO}$, part of the average denoted by the brackets, and repeat this process over all pairs of superstructural sets in the image, keeping track of each contribution and its associated center-to-center separation. We then bin all of these results according to r and calculate the average $G_5^{MSO}$ within each bin interval, displaying this average $G_5^{MSO}$ t the average r associated with a particular bin. To examine if there is any temporal evolution, we analyze 4 different micrographs at t=24 h, 48 h, 72 h, and 96 h after release using a binning interval of 50 μm and plot average $G_5^{MSO}$ as a function of r, as shown in FIG. 3E (where it has been re-labeled simply as $g_{MSO-PCF}$).

Stabilizing Short-Range Screened Electrostatic Repulsions.

Following adsorption of dodecyl sulfate anions (DS−) from the release solution-dispersion (RSD) onto the surfaces of the crosslinked SU-8 tiles, the in-plane electrostatic interaction between tiles in the monolayer is governed by a screened electrostatic repulsion between their charged rough edges. Most theories of electrostatic interactions between particles that have charged surfaces and are dispersed in an electrolyte solution have been developed for smooth particles, yet not for rough particles. Consequently, there is no exact calculation presently available for our specific case. From the significant ionic content in the RSD, primarily from the concentrations of dissociated monovalent TMAH and SDS in water, we estimate that the characteristic Debye screening length for electrostatic repulsions is $\lambda_D \approx 1$ nm. The strength of the electrostatic repulsion decays exponentially for separations between smooth charged surfaces beyond this screening length. However, because the edges of the tiles have rough surfaces (i.e. characteristic asperity heights that are much larger than $\lambda_D$), then this edge roughness plays an important role and creates complexities when attempting to compute an average total in-plane electrostatic interaction energy between the edges of two proximate tiles. At present, there is no theory that completely describes all of these complicated effects related to screened electrostatic repulsions between charged yet rough surfaces of proximate particles. Our empirical microscopic observations of the behavior of the tiles after release indicate that the screened electrostatic repulsion is very strong relative to $k_B T$ at very short range, since we do not see widespread irreversible aggregation of adjacent tiles or out-of-plane sticking of tiles to the negatively charged glass surface through attractive London van der Waals interactions over several days. However, since the electrostatic repulsions are highly screened such that $\lambda_D$ is small, adjacent tiles that are separated even by an asperity height of the edge roughness have electrostatic repulsive interaction energies that are much smaller than $k_B T$. So, a highly screened charge repulsion between rough edges of the released tiles effectively approximates a hard in-plane interaction potential, which is consistent with our microscopic observations of the qualitative behavior of mobile tiles before and after collisions with neighboring tiles.

In-Plane Roughness-Controlled Depletion Attraction.

Our strategy of reducing the strength of the edge-edge attractive interactions between tiles in the presence of a depletion agent is based on the greater roughness of the edges of tiles, compared to their faces, that is a natural consequence of the lithographic process used to make the SU-8 tiles. Because the edges of the SU-8 P2 tiles have asperities with a characteristic roughness height of ~180 nm, which is well in excess of the Debye screening length, we neglect the effect of electrostatic repulsions in estimating the magnitude of the in-plane roughness controlled depletion attractions (RCDA). In order to suppress in-plane depletion attractions between tiles, we have chosen the diameter of the spherical depletion agent (i.e. d=52 nm diameter sulfate-stabilized polystyrene nanospheres) in the RSD to be significantly less than this characteristic edge asperity height. As Zhao and Mason have shown experimentally, when this characteristic asperity height becomes significantly larger than the diameter of the depletion agent, then the depletion attraction is suppressed. This is a consequence of a dramatic reduction in the overlapping excluded volume, $V_{oe}$, between the rough edges at contact compared to perfectly smooth edges (see differences in $V_{oe}$ shown in FIG. 15). Moreover, in most in-plane encounters between the particles, these rough edges are not perfectly aligned, and this will further reduce the strength of the in-plane depletion attraction.

Figure 15:
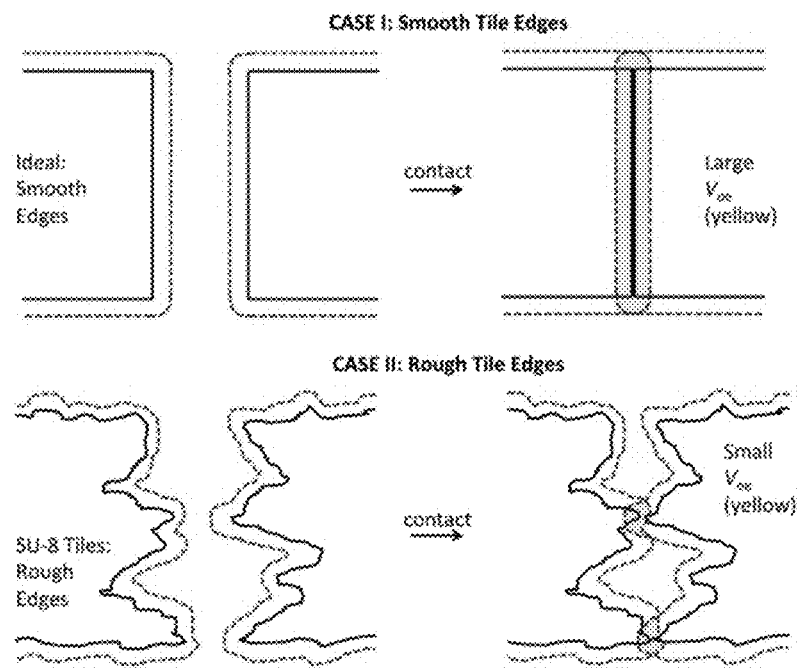
FIG. 15 shows contrasting overlapping excluded volumes between two neighboring tiles having either smooth edges or rough edges, according to an embodiment of the present disclosure.

FIG. 15 shows contrasting overlapping excluded volumes between two neighboring tiles having either smooth edges or rough edges, according to an embodiment of the present disclosure. Cross-sectional side views are shown. Black solid lines indicate the edges of the two neighboring tiles. Blue lines indicate regions of geometrical exclusion of the centers of spherical depletion agents near the edges of tiles. Yellow areas indicate overlapping excluded volumes, $V_{oe}$. The upper diagram (case I) represents when entropic excitations cause tiles having smooth edges (left) to closely approach and come nearly into contact (right), a large overlapping excluded volume is formed, which, depending on the volume fraction of depletion agent, can lead to a significant in-plane depletion attraction. The lower diagram (case II) represents when entropic excitations cause tiles having randomly rough edges (left) to closely approach and come nearly into contact (right), a much smaller overlapping excluded volume is formed, corresponding to a much smaller in-plane depletion attraction typically less than thermal energy $k_B T$.

As yet, there is no precise theory of RCDAs, and each tile has a different specific edge geometry, but on average, we estimate that the average ratio of overlapping excluded volumes participating in the depletion attraction between edges of tiles in our system, compared to perfectly smooth and aligned surfaces, is about $V_{oe,rough}/V_{oe,smooth} \approx 10^{-3}$. Based on the edge dimensions of the tiles and the diameter of the depletion agent, $V_{oe,smooth} \approx A_{edge} d \approx (2000$ nm$)(9500$ nm$)(52$ nm$) \approx 10^9$ nm$^3$ for perfectly aligned parallel edges. Since the concentration of depletion agent is low, the osmotic pressure of the depletion agent can be reasonably approximated by a linear dependence of $\Pi_d$ on $\phi_d$: $\Pi_d = (\phi_d/V_d) k_B T = 0.01/(3.14 \times (52$ nm$)^3/6) k_B T \approx 10^{-7}$ nm$^{-3} k_B T$, where $V_d$ is the volume of a spherical depletion agent at a volume fraction of $\phi_d$ in the RSD. We estimate the magnitude of the potential interaction strength of the depletion attraction between rough edges at contact: $U_{c,rough} = \Pi_d V_{oe,rough} \approx \Pi_d (10^{-3} V_{oe,smooth}) (10^{-7}$ nm$^3 k_B T) \times 10^9$ nm$^3 \times 10^{-3} \approx 0.1 k_B T$. This order of magnitude estimate is consistent with our microscopic observations that the tiles do not aggregate in-plane or show significant signs of edge-edge attractions after collisions of edges (e.g. long dwell times with aligned edges close together), as can be seen in the time-lapse movies.

Out-of-Plane Roughness-Controlled Depletion Attraction.

The glass wafer substrate is of lithographic quality, similar to polished Si wafers, and its characteristic roughness is no more than 1 nm, so it can be treated as effectively smooth. The facial roughness of the SU-8 tiles is significantly less than the edge roughness; the characteristic tallest asperity heights on the faces of the SU-8 particles given the lithographic processes that we use is ≈30 nm. Most of the facial asperities are much smaller than the tallest ones, so this height estimate of the asperities represents an upper bound. The faces of both types of tiles also have much larger areas than their edges, increasing the attraction. The facial area of a SU-8 P2 kite is $A_{kite} \approx 59$ μm$^2$ and of a P2 dart is $A_{dart} \approx 32$ μm$^2$. We crudely estimate that the degree of suppression of the depletion attraction by the facial roughness is much less than when two rough edges make contact, so the ratio $V_{oe,rough}/V_{oe,smooth}$ for a tile face with the smooth glass is only ≈$10^{-1}$. If a kite would have an ideally smooth face, then $V_{oe,smooth,kite} = A_{kite} d \approx 5.9 \times 10^7$ nm$^2$ (52 nm)≈$3 \times 10^9$ nm$^3$. Using $\Pi_d = 10^{-7}$ nm$^{-3}$ $k_B T$, then $U_{c,rough,kite} \approx \Pi_d V_{oe,rough,kite} \approx \Pi_d (10^{-1} V_{oe,smooth,kite}) \approx (10^{-7}$ nm$^3 k_B T) \times 10^{-1} (3 \times 10^9$ nm$^3) \approx 30 k_B T$. Since the kite has roughly twice the area of the dart, then $U_{c,rough,dart} \approx 15 k_B T$. This crude order of magnitude estimate of ≈10 $k_B T$ for the scale of out-of-plane RCDAs is consistent with our microscopic observations that both kite and dart tiles remain in a monolayer over many days and Brownian excitations at room temperature are not sufficient to overcome this facial depletion attraction (plus any residual gravitational potential energy) to cause tiles to rise above and leave the monolayer.

In an embodiment, the preselected temperature at which the shaped-designed particles remain substantially in the layer proximate the substrate depends on the type of fluid material used and the environmental conditions. In an embodiment, the solvent of the fluid material, release solution-dispersion, is a non-aqueous liquid. Such non-aqueous liquids include non-aqueous solvents such as organic and inorganic solvents; oils such as aliphatic hydrocarbon oils, aromatic hydrocarbon oils, fully or partially fluorinated oils, and silicone oils; and non-aqueous solutions such as non-aqueous micellar and polymer solutions.

In an embodiment of the current invention, the process of releasing the shape-designed particles through immersion in the RSD is performed at a preselected temperature that lies within the range over which the primary solvent used in the RSD remains in a liquid phase. In the case of aqueous RSD that has water as the primary solvent, this would be a temperature range between about 273 K and about 373 K. While this range of temperatures is appropriate for ambient lab conditions at normal pressure of about 1 atm, it is understood that the process of releasing the shape-designed particles in the RSD could be performed at some other pressure than 1 atm, in which case the appropriate range of temperatures would be adjusted to correspond with the melting point and boiling point of the primary solvent at that other pressure.

By contrast to the classic descriptions of atomic QCs, in which QC tiles are typically decorated with attractively bonded atoms, instead, for our Brownian P2 QC system of hard tiles, there are no strong in-plane attractive interactions between the tiles. So, the components of our PSKMs are not formally attractive clusters, but instead are effectively unbonded configurations of mobile tiles that have nearly hard in-plane interactions. As a consequence of entropic excitations and the weak coupling of the PSKM motif to surrounding tiles, kite tiles in a local PSKM can rotate collectively and heterogeneously in a random hopping manner. We emphasize that the Brownian P2 QC system we have made using Litho-PAMs is effectively a high-density colloidal system of tile-particles that have nearly hard in-plane interactions (i.e. overlaps of tiles are forbidden, yet the tiles do not become rigidly stuck together by attractions). Consequently, the 2D Brownian P2 QC system is not composed of attractive constituents that form clusters containing strong attractive bonds relative to thermal energy. Instead, identification of motifs, such as PSKMs, is based purely on observed long-lived local configurations, not on any form of attractive interaction that could create an attractively bonded cluster. At least regarding in-plane behavior, our experimental system of pre-configured hard kites and darts is thus close to a realization of a 2D system of tiles that has a free energy which is entirely entropic in origin (i.e. analogous to a much simpler system of hard disks that exhibits a hexatic phase at high densities), depending only on the accessible microstates associated with the positions and orientations of all tiles at a fixed density. The absence of strong attractions between the tiles can be seen in our demonstration of melting of the P2 QC by removing a boundary wall (see FIG. 4); the PSKMs eventually break up as tiles diffuse into open free space in the plane, and the local area fraction of tiles is slowly reduced through this diffusion. It may be desirable in some cases to induce attractions between tiles in the plane purposefully, and such attractions can potentially be achieved by increasing the size and concentration of the depletion agent used or by adding an appropriate aqueous solution of a salt.

The transient collective hopping rotational motion that we have observed for 5 kite tiles in PSKMs indicates that there is only weak coupling of these PSKMs to the surrounding tiles; the corrugations on the outer edges of a PSKM are very small by comparison to those of a PSDM, which is strongly interdigitated with surrounding tiles and does not exhibit such collective hopping rotations. This weak geometrical coupling of the PSKM to surrounding structures effectively creates a transient and localized near-circular shear band which even entropic excitations reveal in the absence of an externally applied shear. Because QCs can exhibit very interesting mechanical properties, ranging from brittle to ductile, it would be interesting to apply external shear to these mobile systems. In future extensions of Litho-PAMs, we envision that actively shearing monolayers of dense tiles will be readily achievable by appropriately corrugating the lithographic boundary walls, releasing at least one boundary wall from the substrate, and then mechanically moving at least one boundary wall relative to another (e.g. using a piezoelectric actuator) to produce a controlled shear excitation having variable frequency and amplitude. Roughness controlled depletion attractions that keep the tiles in-plane would also keep the released lithographic boundary walls near the surface of the glass substrate. The orientations of these mobile boundary walls, relative to directions of the QC, could be varied by design to see if localized shear bands develop at higher shear strains depending on the relative orientations. It is possible that strong shear excitations of tiles outside of the linear regime, could lead to jamming of the tiles and even buckling of the monolayer of shear jammed tiles out of the plane. External controlled movement of the boundary walls could also potentially be used to impose elongational or dilational deformations, rather than shear deformations, to 2D systems created using Litho-PAMs while maintaining fixed $\phi_A$. In addition to $\phi_A$-preserving deformations, tiles could be compressed by moving one or more boundary walls inward to increase $\phi_A$; such compression could be interesting to study, since the propensity for heterogeneous dynamics of certain motifs (e.g. collective hopping rotations of PSKMs) is likely to be significantly reduced as $\phi_A$ approaches unity.

The method of Litho-PAMs can be extended to create significantly smaller tiles than those we have first demonstrated using optical UV stepper lithography if the depletion agent in the RSD is correspondingly altered and re-optimized. Spin-coating can produce SU-8 layers having uniform thickness down to about 10 nm after baking, and advanced steppers can produce ≈10 nm feature sizes over large die areas. So, in principle, tiles that have complex shapes and maximum lateral dimensions down to ≈50 nm and thicknesses down to ≈10 nm could be fabricated using advanced optical lithographic steppers that are currently available. For a 5 cm×5 cm die region, easily achievable with such advanced steppers, this would correspond to ≈$10^{12}$ tiles (having up to as many different shapes of tiles) in a desired pre-assembled configuration. Adjusting the depletion agent's size and its concentration in the RSD would most likely be necessary in order to maintain an intact mobile monolayer of smaller tiles after release. Likewise, nanoimprint lithography is a parallel fabrication process that, in principle, could be used to produce tiles suitable for Litho-PAMs, yet it would likely be necessary to correct unwanted bridging artifacts connecting adjacent tiles in close proximity, especially over large printed areas. Other forms of nanoscale lithography, including e-beam, x-ray, dip-pen lithography, could be used to fabricate the tiles at even smaller scales than we have demonstrated, yet these serial writing methods have the drawback of being significantly slower than parallel methods. Overall, the production of dense configurations of lithographically pre-assembled colloidal shapes, which we have illustrated in 2D with Litho-PAMs, can be readily extended to other forms of lithography, including 3D micro- and nano-lithographic methods.

Lithographically pre-assembled colloidal linkages of shape-designed discrete mobile microscale tiles coupled together by lock-and-key subparticle features that essentially yield hinge-like semi-flexible steric bonds can be designed and fabricated. Using anisotropic roughness-controlled depletion attractions, caused by a nanoscale depletion agent in a specialized release solution-dispersion, we release these linkage tiles from a flat, smooth glass substrate and limit their motion to the plane immediately above it. Although in-plane interactions between neighboring linkage tiles are effectively hard, the designed geometries of these lock-and-key linkage particles lead to steric constraints that prevent unbonding events between interlocked neighbors, yielding long-lived fluctuating Brownian poly-colloids that provide a readily visualized analog of molecular polymers. We illustrate the versatility of this approach by fabricating linear, ring, diblock, triblock, star, brush, and dendritic poly-colloids having desired pre-assembled topologies, configurations, and inherent local curvatures. Extending this into two dimensions, we form fluctuating square, hexagonal, and honeycomb meshes that contain crosslinking linkage colloids which are coupled to more than two neighbors. Using optical microscopy, we observe and measure the dynamic configurational changes of these poly-colloids caused by Brownian excitations down to the monomer scale. In addition, we make poly-colloids having bonds that offer a translational sliding degree of freedom that is atypical of bonds in molecular polymers. Thus, linkage poly-colloids made using LithoPAMs can be used to model fluctuating molecular polymers and also can be designed to have unusual types of bonds that are not present in molecular or other colloidal polymers.

Beyond embodiments of LithoPAMs that yield dense tile-like configurations of convex polygonal shapes, such as a fluctuating P2 quasi-crystal, it is non-obvious to create a design of a set of discrete lock-and-key shapes that can form such sterically hindered bonds upon release from the substrate. Such systems of interlocking tiles do not require bounding walls, which are typically necessary for Litho-PAMs of non-interlocking tiles, in order to remain together in a coherent fluctuating assembly over long periods of time.

In an embodiment of the current invention, a discrete lock-and-key particle from among a plurality of lock-and-key particles, which form a lock-and-key configuration comprised of the plurality of lock-and-key particles, contains at least a convex region and also a concave region within the same particle shape of the discrete lock-and-key particle, such that the convex region of a first of the lock-and-key particles is inserted into, but not touching, the concave region of a second of the lock-and-key particles that is proximate to the first of the lock-and-key particle, in an initial lock-and-key configuration of the lock-and-key particles.

In an embodiment of the current invention, a discrete lock-and-key particle from among a plurality of lock-and-key particles, which form a lock-and-key configuration comprised of the plurality of lock-and-key particles, contains at least a convex region and also a concave region within the same particle shape of the discrete lock-and-key particle, such that the convex region of a first of the lock-and-key particles is inserted into, but not touching, the concave region of a second of the lock-and-key particles that is proximate to the first of the lock-and-key particle, in an initial lock-and-key configuration of the lock-and-key particles, wherein the convex region of a first of the lock-and-key particles is sterically prohibited from leaving the concave region of a second of the lock-and-key particles.

In an embodiment of the current invention, we have fabricated a ring-like linkage composed of discrete head-tail lock-and-key colloidal linkage particles. This is effectively a colloidal version of a long-lived ring polymer as a consequence of steric constraints of the convex head of each particle with respect to the concave tail of its neighboring particle, so the convex head remains within the concave tail. Entropic excitations cause Brownian fluctuations of the lock-and-key particles, leading to changes in the configuration of the ring in the plane that result in its shape becoming non-circular.

Figure 16:
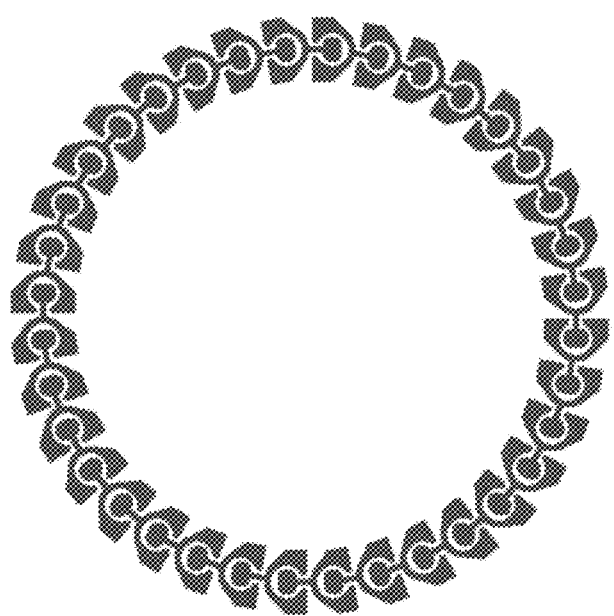
FIG. 16 shows a ring-like linkage of head-tail colloidal linkages, according to an embodiment of the present disclosure.

FIG. 16 shows a ring-like linkage of head-tail colloidal linkages, according to an embodiment of the present disclosure. Individual particles are chiral and the head is bent with respect to the tail.

Figure 17:
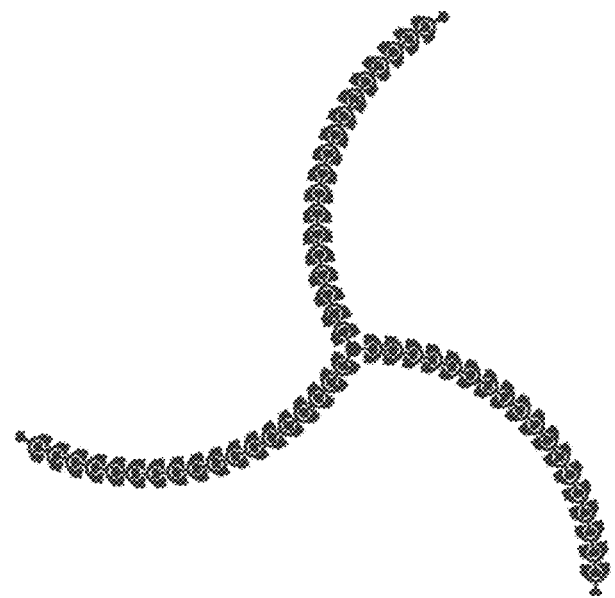
FIG. 17 shows a chiral star configuration of head-tail colloidal linkages, according to an embodiment of the present disclosure.

FIG. 17 shows a chiral star configuration of head-tail colloidal linkages, according to an embodiment of the present disclosure. There are two types of linkage shapes. A first type with a central achiral tri-head and a second type with a chiral head-tail monomers.

Figure 18:
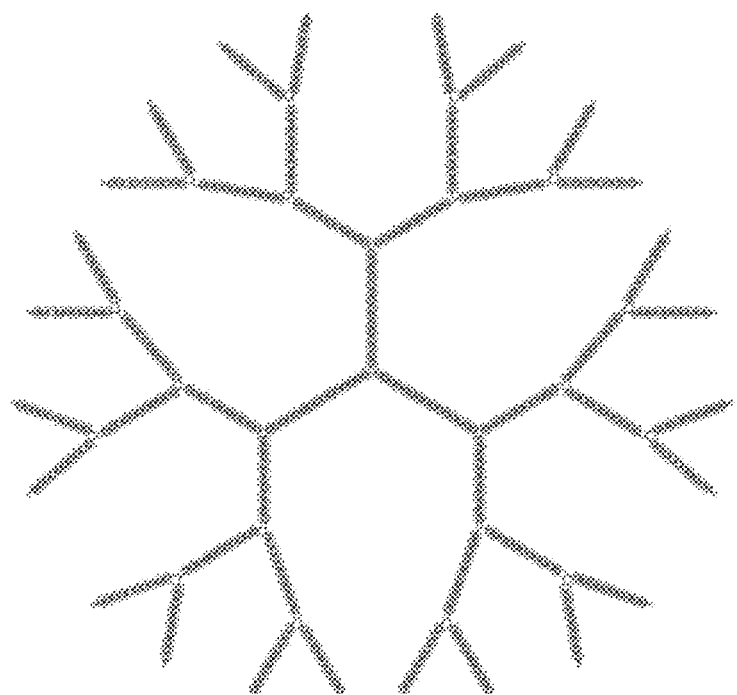
FIG. 18 shows a dendrimer configuration of colloidal linkages, according to an embodiment of the present disclosure.

FIG. 18 shows a dendrimer configuration of colloidal linkages, according to an embodiment of the present disclosure.

Figure 19:
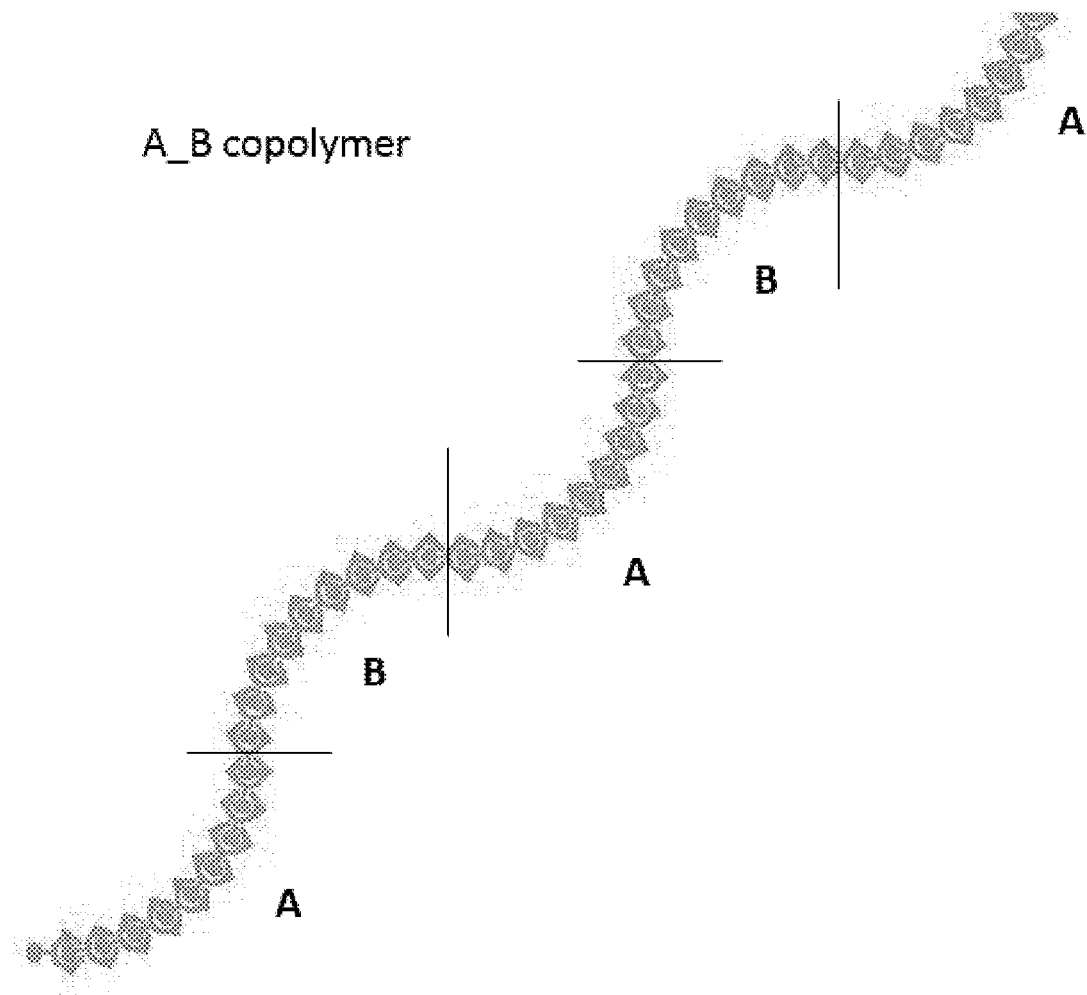
FIG. 19 shows a linear co-polymer configuration of A/B chiral colloidal linkages, according to an embodiment of the present disclosure.

FIG. 19 shows a linear co-polymer configuration of A/B chiral colloidal linkages, according to an embodiment of the present disclosure. The A and B colloidal linkages alternate to form an "ABAB . . . " pattern.

Figure 20:
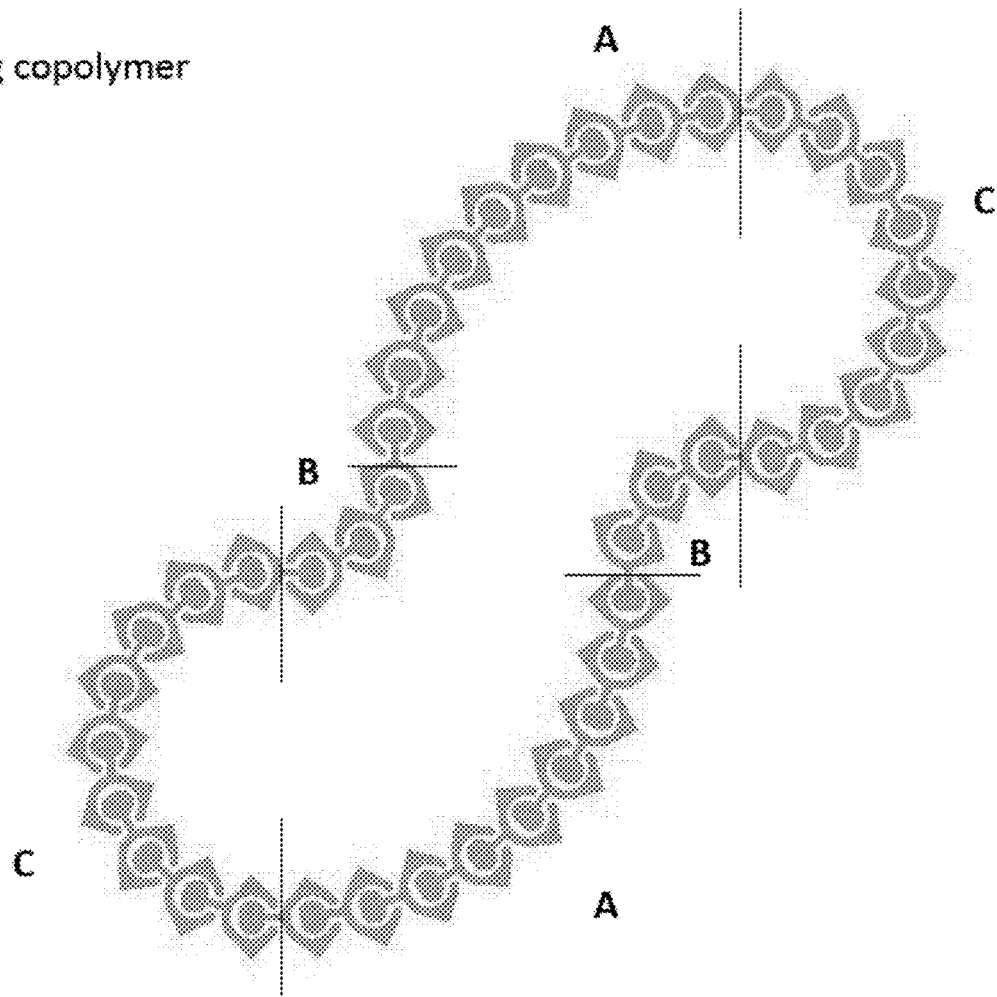
FIG. 20 shows a ring co-polymer configuration of A/B/C chiral colloidal linkages, according to an embodiment of the present disclosure.

FIG. 20 shows a ring co-polymer configuration of A/B/C chiral colloidal linkages. In this embodiment, the A, B and C chiral colloidal linkages alternate to form an "ABCABC" pattern.

Figure 21:
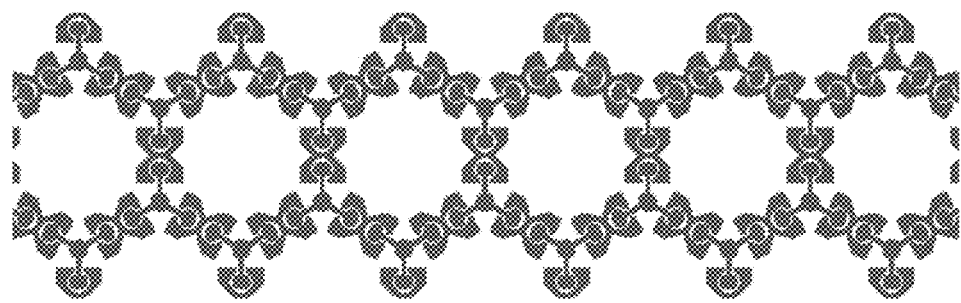
FIG. 21 shows a honeycomb quasi-one dimensional strip of colloidal linkages, according to an embodiment of the present disclosure.

FIG. 21 shows a honeycomb quasi-one dimensional strip of colloidal linkages, according to an embodiment of the present disclosure. In this embodiment, two types of achiral linkage particles are used, namely, tri-head and bi-tail.

Figure 22:
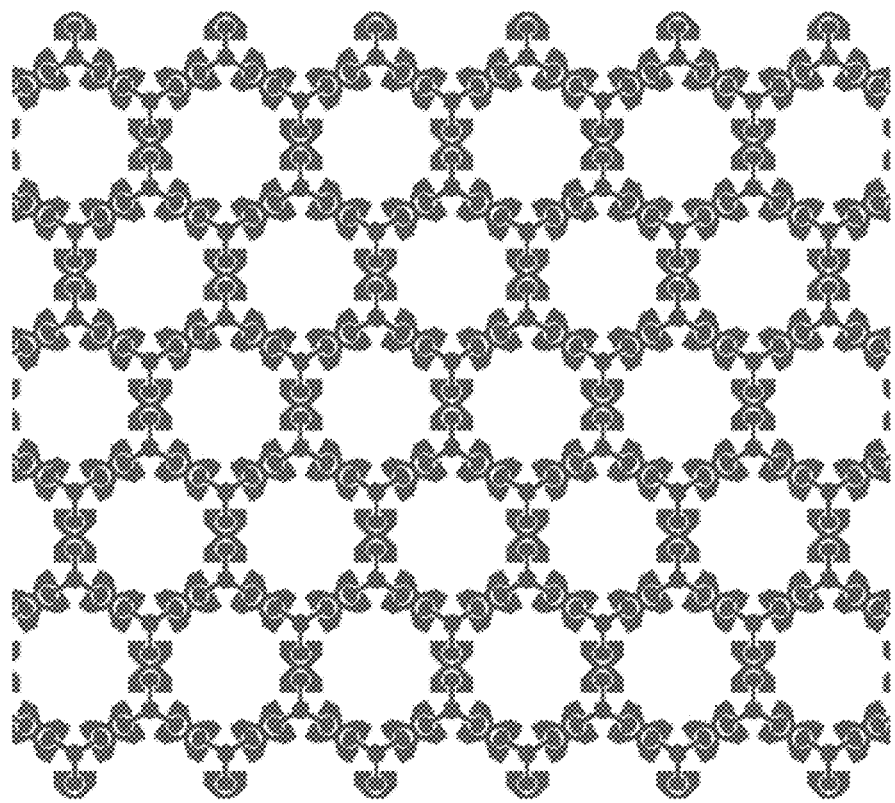
FIG. 22 shows a honeycomb mesh of colloidal linkages, according to an embodiment of the present disclosure.

FIG. 22 shows a honeycomb mesh of colloidal linkages, according to an embodiment of the present disclosure. Similar to the embodiment shown in FIG. 21, two types of achiral linkage particles are used, namely, tri-head and bi-tail.

Figure 23A:
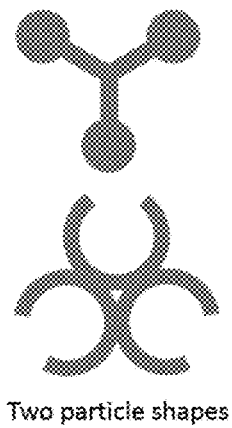
FIG. 23A shows two particle shapes, according to an embodiment of the present disclosure.
Figure 23B:
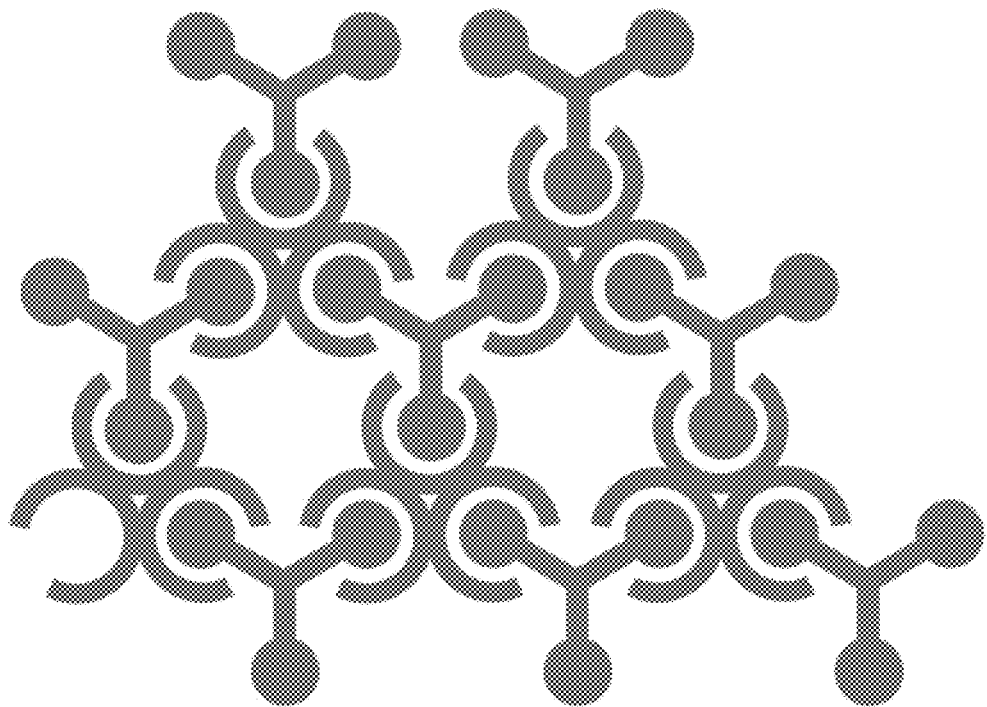
FIG. 23B shows colloidal linkages forming a lattice-like configuration using the two particle shapes shown in FIG. 23A.

FIG. 23A shows two particle shapes, according to an embodiment of the present disclosure. FIG. 23B shows colloidal linkages forming a lattice-like configuration using the two particle shapes shown in FIG. 23A.

Figure 24A:
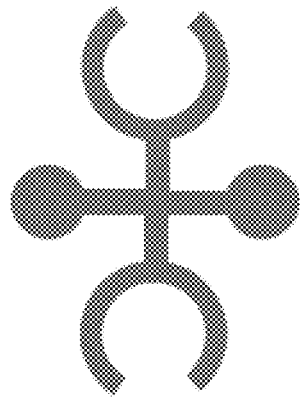
FIG. 24A shows a single particle shape, according to an embodiment of the present disclosure.
Figure 24B:
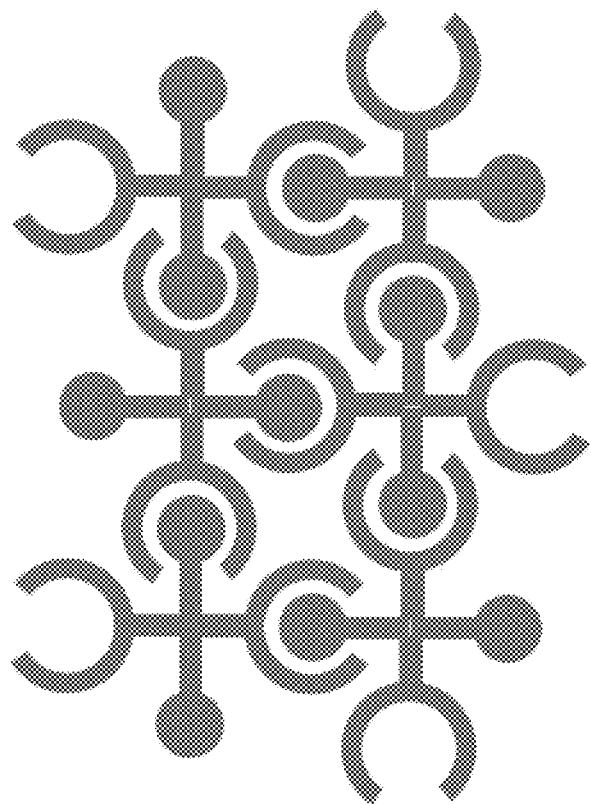
FIG. 24B shows colloidal linkages forming a lattice-like configuration using the single particle shape shown in FIG. 24A.

FIG. 24A shows a single particle shape, according to an embodiment of the present disclosure. FIG. 24B shows colloidal linkages forming a lattice-like configuration using the single particle shape shown in FIG. 24A.

Figure 25A:
FIG. 25A shows a linear chain of colloidal linkages having higher extensibility, according to an embodiment of the present disclosure.

FIG. 25A shows a linear chain of colloidal linkages having higher extensibility, according to an embodiment of the present disclosure. The allowed fluctuations along the length of the chain are larger given the shapes of head and tail sections of each linkage particle as shown in FIG. 25A.

Figure 25B:
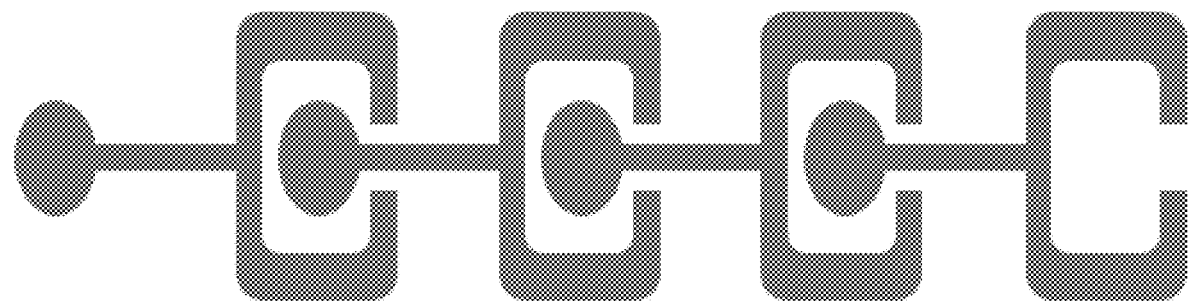
FIG. 25B shows a linear chain of colloidal linkages designed to enable a reduced persistence length, according to an embodiment of the present disclosure.

FIG. 25B shows a linear chain of colloidal linkages designed to enable a reduced persistence length, according to an embodiment of the present disclosure. The allowed angle of rotation of one linkage relative to another is higher given the specific shapes of the head and tail geometries of the linkage particles as shown in FIG. 25B.

Figure 26:
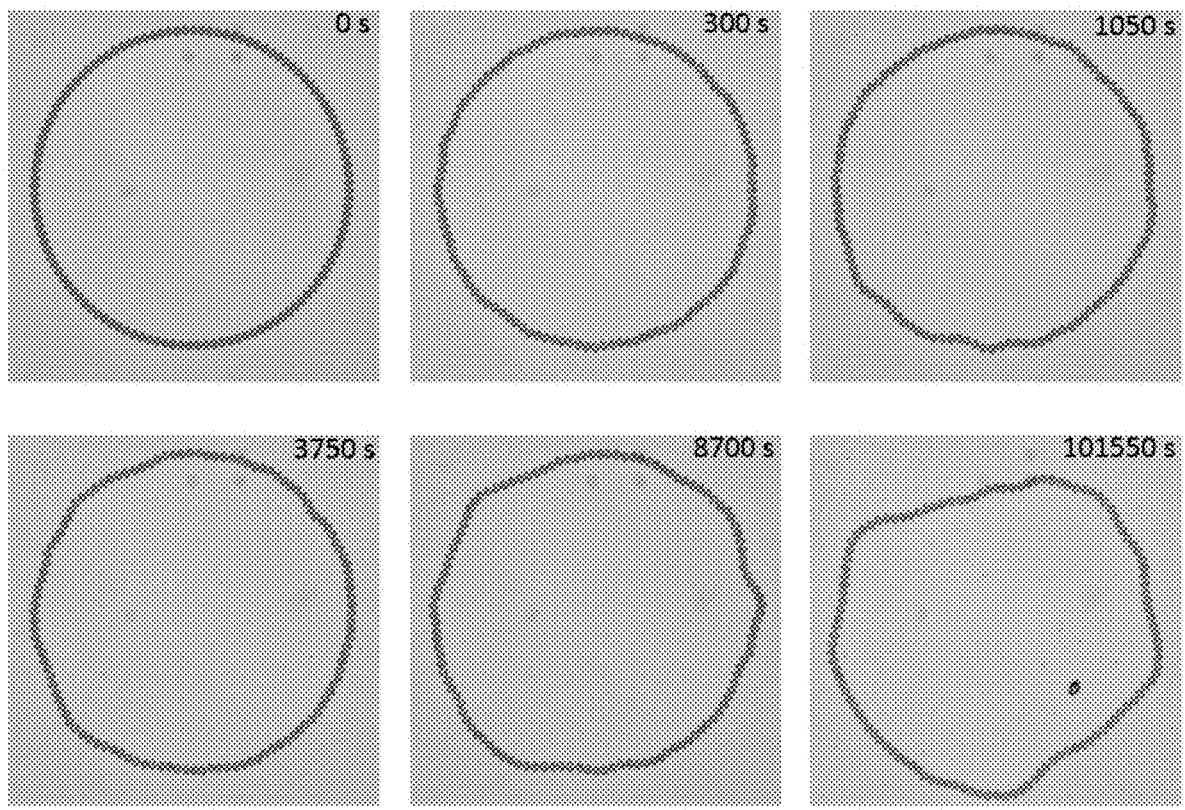
FIG. 26 shows a fluctuating ring of mobile lock-and-key colloidal linkages, according to an embodiment of the present disclosure.

FIG. 26 shows a fluctuating ring of mobile lock-and-key colloidal linkages, according to an embodiment of the present disclosure. Each image frame in FIG. 26 is taken at a specific time. The upper left corner image frame shows the configuration at time equal 0 second. The lower right corner image frame shows the configuration at time equal 101550 seconds. The frames in between show the mobility of the lock-and-key colloidal linkage configuration with time. The time is provided at the upper right corner of each image frame (in seconds). The diameter of the circular ring of particles is about 250 microns. This scale is the same for all images in FIG. 26.

REFERENCES

1 Penrose, R. The role of aesthetics in pure and applied mathematical research. *Bull. Inst. Math. Appl.* 10, 266-271, (1974).
2 Penrose, R. Pentaplexity a class of non-periodic tilings of the plane. *Math. Intell.* 2, 32-37, (1979).
3 Bursill, L. A. & Ju Lin, P. Penrose tiling observed in a quasi-crystal. *Nature* 316, 50, (1985).
4 Gardner, M. *Penrose tiles to trapdoor ciphers*. (W.H. Freeman, New York, 1989).
5 Zeng, X. et al. Supramolecular dendritic liquid quasicrystals. *Nature* 428, 157, (2004).
6 Hayashida, K., Dotera, T., Takano, A. & Matsushita, Y. Polymeric quasicrystal: mesoscopic quasicrystalline tiling in ABC star polymers. *Phys. Rev. Lett.* 98, 195502, (2007).
7 Talapin, D. V. et al. Quasicrystalline order in self-assembled binary nanoparticle superlattices. *Nature* 461, 964, (2009).

8 Fischer, S. et al. Colloidal quasicrystals with 12-fold and 18-fold diffraction symmetry. *Proc. Natl. Acad. Sci. U.S.A.* 108, 1810-1814, (2011).

9 Hoover, M. D. et al. A method for producing non-spherical monodisperse particles using integrated circuit fabrication techniques. *J. Aerosol Sci.* 21, 569-575, (1990).

10 Hernandez, C. J. & Mason, T. G. Colloidal alphabet soup: monodisperse dispersions of shape-designed lithoparticles. *J. Phys. Chem. C* 111, 4477-4480, (2007).

11 Yang, S.-M., Kim, S.-H., Lim, J.-M. & Yi, G.-R. Synthesis and assembly of structured colloidal particles. *J. Mater. Chem.* 18, 2177-2190, (2008).

12 Zeng, C., Chen, Y., Kirschbaum, K., Lambright, K. J. & Jin, R. Emergence of hierarchical structural complexities in nanoparticles and their assembly. *Science* 354, 1580, (2016).

13 Grier, D. G. A revolution in optical manipulation. *Nature* 424, 810-816, (2003).

14 Bae, W.-G. et al. Scalable multiscale patterned structures inspired by nature: the role of hierarchy. *Adv. Mater.* 26, 675-700, (2014).

Roichman, Y. & Grier, D. G. Holographic assembly of quasicrystalline photonic heterostructures. *Opt. Express* 13, 5434-5439, (2005).

Mikhael, J., Roth, J., Helden, L. & Hechinger, C. Archimedean-like tiling on decagonal quasicrystalline surfaces. *Nature* 454, 501, (2008).

17 Boles, M. A., Engel, M. & Talapin, D. V. Self-assembly of colloidal nanocrystals: from intricate structures to functional materials. *Chem. Rev.* 116, 11220-11289, (2016).

18 Niederberger, M. Multiscale nanoparticle assembly: From particulate precise manufacturing to colloidal processing. *Adv. Funct. Mater.*, 1703647, (2017).

19 Grzelczak, M., Vermant, J., Furst, E. M. & Liz-Marzán, L. M. Directed self-assembly of nanoparticles. *ACS Nano* 4, 3591-3605, (2010).

20 Campbell, M., Sharp, D. N., Harrison, M. T., Denning, R. G. & Turberfield, A. J. Fabrication of photonic crystals for the visible spectrum by holographic lithography. *Nature* 404, 53-56, (2000).

21 Ullal, C. K. et al. Photonic crystals through holographic lithography: simple cubic, diamond-like, and gyroid-like structures. *Appl. Phys. Lett.* 84, 5434-5436, (2004).

22 Kawata, S., Sun, H.-B., Tanaka, T. & Takada, K. Finer features for functional microdevices. *Nature* 412, 697, (2001).

23 Zhao, K. & Mason, T. G. Directing colloidal self-assembly through roughness-controlled depletion attractions. *Phys. Rev. Lett.* 99, 268301, (2007).

24 Zhao, K. & Mason, T. G. Frustrated rotator crystals and glasses of Brownian pentagons. *Phys. Rev. Lett.* 103, 208302, (2009).

25 Nelson, D. R., Rubinstein, M. & Spaepen, F. Order in two-dimensional binary random arrays. *Philos. Mag. A* 46, 105-126, (1982).

26 Chou, C.-F., Ho, J. T., Hui, S. W. & Surendranath, V. Scaling of 6 n-fold bond-orientational order parameters in a hexatic liquid-crystal thin film. *Phys. Rev. Lett.* 76, 4556-4559, (1996).

27 Nelson, D. R. *Defects and Geometry in Condensed Matter Physics.* (Cambridge University Press, New York, 2002).

28 Zhao, K., Bruinsma, R. & Mason, T. G. Local chiral symmetry breaking in triatic liquid crystals. *Nat. Commun.* 3, 801, (2012).

29 Weeks, E. R., Crocker, J. C., Levitt, A. C., Schofield, A. & Weitz, D. A. Three-dimensional direct imaging of structural relaxation near the colloidal glass transition. *Science* 287, 627, (2000).

30 Chen, K. et al. Low-frequency vibrations of soft colloidal glasses. *Phys. Rev. Lett.* 105, 025501, (2010).

31 Wang, P.-Y. & Mason, T. G. Colloidal lock-and-key dimerization reactions of hard annular sector particles controlled by osmotic pressure. *J. Am. Chem. Soc.* 137, 15308-15314 (2015).

32 Zhao, K., Bruinsma, R. & Mason, T. G. Entropic crystal-crystal transitions of Brownian squares. *Proc. Natl. Acad. Sci. U.S.A.* 108, 2684-2687 (2011).

33 Zhao, K. & Mason, T. G. Twinning of rhombic colloidal crystals. *J. Am. Chem. Soc.* 134, 18125-18131 (2012).

34 Lewandowski, E. P., Bernate, J. A., Tseng, A., Searson, P. C. & Stebe, K. J. Oriented assembly of anisotropic particles by capillary interactions. *Soft Matter* 5, 886-890 (2009).

35 Cavallaro, M., Botto, L., Lewandowski, E. P., Wang, M. & Stebe, K. J. Curvature-driven capillary migration and assembly of rod-like particles. *Proc. Natl. Acad. Sci. U.S.A.* 108, 20923-20928 (2011).

36 Wang, P.-Y. & Mason, T. G. Dimer crystallization of chiral proteoids. *Phys. Chem. Chem. Phys.* 19, 7167-7175 (2017).

37 Gardner, M. Penrose Tiles to Trapadoor Ciphers. (W.H. Freeman, New York, 1989). Zhao, K. & Mason, T. G. Shape-designed frustration by local polymorphism in a near-equilibrium colloidal glass. *Proc. Natl. Acad. Sci. U.S.A.* 112, 12063-12068 (2015).

39 Caspar, D. L. D. & Fontano, E. Five-fold symmetry in crystalline quasicrystal lattices. *Proc. Natl. Acad. Sci. U.S.A.* 93, 14271-14278 (1996).

40 Dotera, T., Oshiro, T. & Ziherl, P. Mosaic two-lengthscale quasicrystals. *Nature* 506, 208-211 (2014).

41 Steinhardt, P. J. & Jeong, H.-C. A simpler approach to Penrose tiling with implications for quasicrystal formation. *Nature* 382, 431-433 (1996).

42 Dontabhaktuni, J., Ravnik, M. & Zumer, S. Quasicrystalline tilings with nematic colloidal platelets. *Proc. Natl. Acad. Sci. U.S.A.* 111, 2464-2469 (2014).

43 Kosterlitz, J. M. & Thouless, D. J. Ordering, metastability and phase transitions in two-dimensional systems. *J. Phys. C* 6, 1181-1203 (1973).

44 Steurer, W. & Deloudi, S. *Crystallography of Quasi-Crystals.* (Springer, Berlin, 2009).

45 Socolar, J. Phason strain in quasicrystals. *J. Physique Colloques* 47, C3/217-C3/226 (1986).

46 Li, F. H., Pan, G. Z., Huang, D. X., Hashimoto, H. & Yokota, Y. Phason-strain identification for quasicrystals by high-resolution electron microscopy. *Ultramicroscopy* 45, 299-305 (1992).

47 Gummelt, P. Penrose tilings as coverings of congruent decagons. *Geom. Dedicata* 62, 1-17 (1996).

48 Saitoh, K., Tsuda, K., Tanaka, M., Kaneko, K. and Tsai, A. P., Structural study of an $Al_{72}Ni_{20}Co_8$ decagonal quasicrystal using the high-angle annular dark-field method. *Jpn. J. Appl. Phys.* 36, L1400-L1402 (1997).

49 Chou, C.-F., Ho, J. T., Hui, S. W. & Surendranath, V. Scaling of 6n-fold bond-orientational order parameters in a hexatic liquid-crystal thin film. *Phys. Rev. Lett.* 76, 4556-4559 (1996).

50 Russel, W. B., Saville, D. A. & Schowalter, W. R. *Colloidal Dispersions.* (Cambridge Univ. Press, Cambridge, 1989).

51 Zou, Y. et al. Superior room-temperature ductility of typically brittle quasicrystals at small sizes. *Nat. Commun.* 7, 12261 (2016).

52 Chou, S. Y., Krauss, P. R. & Renstrom, P. J. Imprint lithography with 25-nanometer resolution. *Science* 272, 85-87 (1996).

53 Bhushan, B. *Springer Handbook of Nanotechnology.* 3rd ed. (Springer, New York, 2010).

While various embodiments of the present invention have been described above, it should be understood that they have been presented by way of example only, and not limitation. Thus, the breadth and scope of the present invention should not be limited by any of the above-described illustrative embodiments, but should instead be defined only in accordance with the following claims and their equivalents.

The embodiments illustrated and discussed in this specification are intended only to teach those skilled in the art how to make and use the invention. In describing embodiments of the disclosure, specific terminology is employed for the sake of clarity. However, the disclosure is not intended to be limited to the specific terminology so selected. The above-described embodiments of the disclosure may be modified or varied, without departing from the invention, as appreciated by those skilled in the art in light of the above teachings. It is therefore to be understood that, within the scope of the claims and their equivalents, the invention may be practiced otherwise than as specifically described. For example, it is to be understood that the present disclosure contemplates that, to the extent possible, one or more features of any embodiment can be combined with one or more features of any other embodiment.

We claim:

1. A method of producing preconfigured arrangements of mobile shape-designed particles, comprising:
   providing a composite structure comprising a substrate and a layer of particle material over a surface of said substrate;
   lithographically producing a plurality of shaped-designed particles from said layer of particle material such that said plurality of shaped-designed particles remain substantially in a layer proximate said substrate; and
   at least one of subsequent to or in conjunction with said lithographically producing, immersing said plurality of shaped-designed particles and said substrate in a fluid material at a preselected temperature,
   wherein said fluid material comprises a depletion agent comprising particles having sizes and a volume fraction such that said depletion agent provides depletion attraction between at least a portion of said shaped-designed particles and said substrate such that said shaped-designed particles remain substantially in said layer proximate said substrate.

2. The method according to claim 1, wherein said composite structure further comprises a sacrificial layer between said substrate and said layer of particle material.

3. The method according to claim 2, wherein said lithographically producing a plurality of shaped-designed particles comprises lithographically producing said plurality of shaped-designed particles using at least one of photolithography and particle lithography, and wherein said fluid material causes said sacrificial layer to at least one of dissolve and de-solidify.

4. The method according to claim 3, wherein said fluid material comprises a release agent to remove said sacrificial layer so as to release said plurality of shaped-designed particles from said substrate.

5. The method according to claim 3, wherein said fluid material comprises a stabilizing agent that inhibits aggregation of said plurality of shaped-designed particles.

6. The method according to claim 1, wherein said preselected temperature at which said shaped-designed particles remain substantially in said layer proximate said substrate is between about 273 K and about 373 K.

7. The method according to claim 1, wherein the surface of said substrate is smooth compared to a surface roughness of said plurality of shaped-designed particles.

8. The method according to claim 1, wherein each of said plurality of shaped-designed particles has a facial surface closest to the surface of said substrate that is smoother than an edge surface that is approximately perpendicular to the surface of said substrate.

9. The method according to claim 1, wherein said fluid material enables an attraction between each of said plurality of shaped-designed particles and said substrate while providing a lubricating layer of liquid between each of said plurality of shaped-designed particles and said substrate.

10. The method according to claim 1, wherein said depletion agent comprises particles in said fluid material having a preselected average size and a preselected volume fraction such that said depletion agent provides a lubricated attraction between each of said shaped-designed particles and said substrate that is stronger than thermal energy.

11. The method according to claim 1, further comprising exciting said shaped-designed particles by Brownian forces so as to cause dynamic reconfiguration by changing position or orientation, or both of at least a portion of said plurality of shaped-designed particles.

12. The method according to claim 1, wherein said plurality of shaped-designed particles comprise a plurality of particles of a first shape and a plurality of particles of a second shape.

13. The method according to claim 12, wherein said plurality of particles of said first shape are Penrose-type "kite particles", and wherein said plurality of particles of said second shape are Penrose-type "dart particles".

* * * * *